United States Patent [19]
Sekine et al.

[11] Patent Number: 5,660,744
[45] Date of Patent: *Aug. 26, 1997

[54] PLASMA GENERATING APPARATUS AND SURFACE PROCESSING APPARATUS

[75] Inventors: Makoto Sekine; Keiji Horioka, both of Yokohama; Haruo Okano, Tokyo; Katsuya Okumura, Yokohama; Isahiro Hasegawa, Zushi; Masaki Narita, Yokohama, all of Japan

[73] Assignee: Kabushiki Kaisha Toshiba, Kawasaki, Japan

[*] Notice: The term of this patent shall not extend beyond the expiration date of Pat. No. 5,444,207.

[21] Appl. No.: 492,322

[22] Filed: Jun. 19, 1995

Related U.S. Application Data

[63] Continuation-in-part of Ser. No. 37,169, Mar. 26, 1993, Pat. No. 5,444,207.

[30] Foreign Application Priority Data

Mar. 26, 1992 [JP] Japan ................................. 4-68879
Jul. 17, 1992 [JP] Japan ................................. 4-191179
Mar. 11, 1993 [JP] Japan ................................. 5-51117

[51] Int. Cl.$^6$ ..................................................... B23K 10/00
[52] U.S. Cl. ........................... 219/121.43; 219/121.41; 204/298.16; 204/298.37
[58] Field of Search ..................... 219/121.43, 121.41, 219/121.42; 156/345; 204/298.16, 298.37, 298.2, 298.38

[56] References Cited

U.S. PATENT DOCUMENTS 4,552,639  11/1985  Garrett .
4,580,098  4/1986   Gluckstern et al. .
4,600,492  7/1986   Ooshio et al. .
5,081,398  1/1992   Asmussen et al. .

(List continued on next page.)

FOREIGN PATENT DOCUMENTS 61-187336  2/1985  Japan .
3-87365    8/1989  Japan .

(List continued on next page.)

OTHER PUBLICATIONS

"Design of Permanent Multipole Magnets With Oriented Rare Earth Cobalt Material," Halbach, K., *Nuclear Instruments and Methods*, 169, pp. 1–10, (1980).

(List continued on next page.)

*Primary Examiner*—Mark H. Paschall
*Attorney, Agent, or Firm*—Finnegan, Henderson, Farabow, Garrett & Dunner, L.L.P.

[57] ABSTRACT

A surface processing apparatus comprises a container provided with a first electrode and a second electrode disposed opposite to the first electrode for supporting a substrate to be processed and filled with a gas at a reduced pressure, an electric field generator for generating an electric field between the first and second electrodes, and a magnetic field generator for generating a magnetic field in the vacuum container. The magnetic field generator comprises a plurality of magnet element groups arranged in a circle around the container so as to form a ring, each of the magnet element groups having an axis directed to a center of the circle and a synthetic magnetization direction and comprising one or a plurality of magnet elements having respective magnetization directions which are synthesized to be equal to the synthetic magnetization direction of the each of the magnetic element groups. One of the magnet element groups is so disposed that the synthetic magnetization direction thereof coincides with the axis thereof, and each of the magnet element groups other than the one magnet element group is so disposed that an angle of the synthetic magnetization direction thereof relative to the synthetic magnetization direction of the one magnet element group is substantially twice an angle of the axis thereof relative to the axis of the one magnet element group.

23 Claims, 55 Drawing Sheets

U.S. PATENT DOCUMENTS

| | | |
|---|---|---|
| 5,203,959 | 4/1993 | Hirose et al. . |
| 5,245,157 | 9/1993 | Ohiwa . |
| 5,252,194 | 10/1993 | Demaray et al. . |
| 5,266,146 | 11/1993 | Ohno et al. . |
| 5,304,279 | 4/1994 | Coultras et al. . |

FOREIGN PATENT DOCUMENTS

| | | |
|---|---|---|
| 3-236468 | 2/1990 | Japan . |
| 3-257160 | 3/1990 | Japan . |
| 3-253565 | 3/1990 | Japan . |
| 3-257159 | 3/1990 | Japan . |

OTHER PUBLICATIONS

"Permanent Magnet Systems For NMR Tomography," Zijlstra, H., *Philips Journal of Research*, vol. 40, No. 5, pp. 259–288, (1985).

"Gate Oxide Breakdown Phenomena In Magnetized Plasma," Sekine et al., *Dry Process Symposium*, ULSI Research Center, Toshiba Corp., pp. 99–103, (1991).

8 MAGNET ELEMENTS

12 MAGNET ELEMENTS

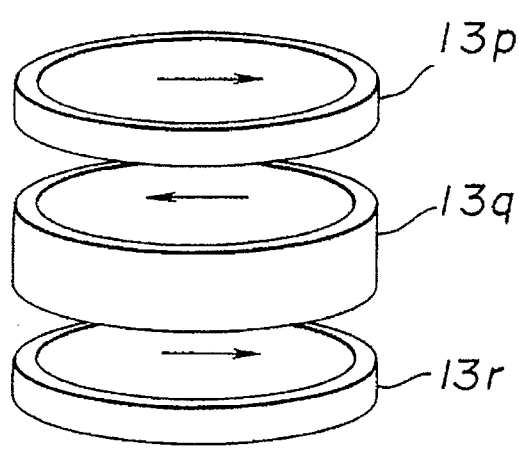 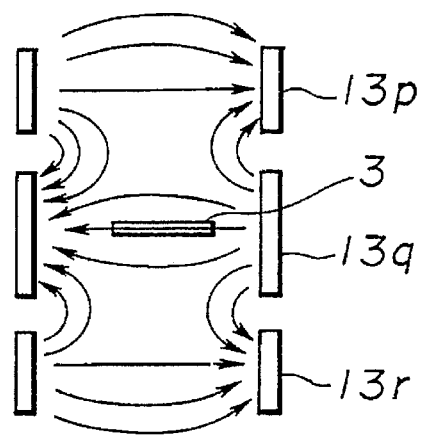
FIG.40(a)     FIG.40(b)
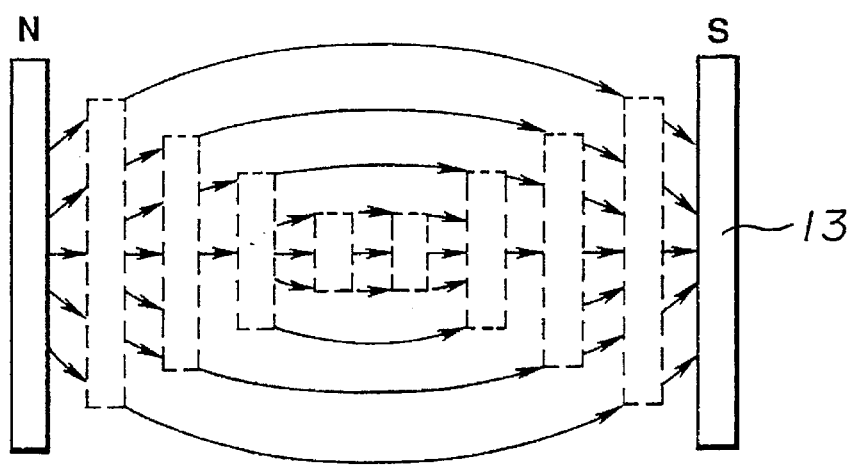
FIG.41(a)
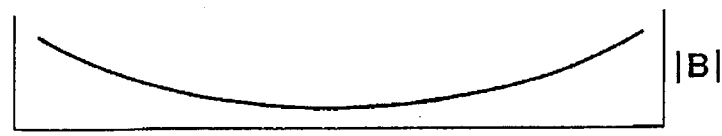
FIG.41(b)

CF4 5m Torr 200W
50SCCM DISTANCE BETWEEN ELECTRODES 25mm

PLASMA GENERATING APPARATUS AND SURFACE PROCESSING APPARATUS

This is a continuation-in-part application of the application Ser. No. 08/037,169 filed Mar. 26, 1993, now U.S. Pat. No. 5,944,207.

BACKGROUND OF THE INVENTION

1. Field of the Invention

The present invention relates to a plasma Generating apparatus and a surface processing apparatus, and more particularly to a surface processing apparatus for forming a thin film by using a vapor phase growth method and for etching a thin film.

2. Description of the Related Art

Conventionally, there has been the reactive ion etching (RIE) method as one of dry etching methods widely used for fine working in semiconductor device manufacturing processes. Further, there has been the magnetron RIE method in which a magnetic field is applied to plasma generated in the RIE process so as to increase the density of the plasma, thereby to increase the etching rate and the accuracy in the fine working for semiconductor devices.

FIG. 57 illustrates an example of a conventional apparatus used for carrying out the magnetron RIE. The apparatus is provided with an anode 7 attached to an upper inner wall of a vacuum container 1, and a cathode 2 disposed opposite to the anode 7 and also functioning as a support for a substrate (wafer) 3 to be precessed. Electric power generated at a high frequency power source 5 is applied across the anode 7 and the cathode 2 through a matching circuit 14. The resulting electric field generates a plasma in a region between these electrodes. By a self-biasing electric field induced on the surface of the cathode 2, reactive ions in the plasma are accelerated to cause the ions to impinge on the substrate to thereby progress an etching reaction. In the magnetron RIE, a magnetic field generated by a magnet 10 is applied to the self-biasing electric field in a direction perpendicular to the direction of the electric field. In FIG. 57, magnetic force lines 11 are schematically shown. By intersecting the electric field E with the magnetic field B at the right angle, the electrons in the plasma are drifted by Lorentz force in the direction of E×B, which causes the electrons to run in the plasma over a long distance. As a result, the frequency of the electrons to impinge on neutral molecules and atoms increases so that the plasma density increases. Further, by applying the magnetic field to the plasma, the electrons are confined to within the plasma, which prolongs the lifetime of the electrons (the period of time until the electrons finally impinge on the chamber wall, electrode or substrate) and hence increases the plasma density.

When the plasma density is increased, not only the etching rate is increased, but also the directivity of the ions is increased. In addition, an ion energy which would increase damage and decrease the etch selectivity can be maintained sufficiently low even when the gas pressure is reduced to suppress the reaction of neutral species and a film to be etched (isotropic reaction).

As described above, the magnetron RIE exhibits excellent performances. Therefore, it has been used in the processing of various thin films. However, with the magnet used in the conventional manner, the uniformity of the etching rate is degraded because of unevenness of the strength and direction of the magnetic field generated by the magnet. Further, ions are disturbed in directivity and impinge on the wafer in various directions so that they enter the wafer surface at oblique angles at least some portions of the wafer. As a result, a desirable anisotropic etching cannot be performed and the rate of etching to a pattern having a narrow width or a high aspect ratio is decreased.

For example, as shown in FIG. 58, by the etching apparatus of FIG. 57, the wafer 3 has a satisfactory etched shape at the central portion B while the peripheral portions A and C of the wafer are obliquely etched due to oblique incident direction of the ions to thereby have undesirable anisotropic oblique configuration.

Although the mechanisms causing such undesirable etched configuration have not been known in a strict sense, they can be explained as follows.

Referring to FIG. 59, the magnetic force lines in the peripheral portion of the wafer 3 are not parallel to the surface of the wafer, but are curved and formed obliquely relative to the wafer. Since the electric field is relatively weak in the plasma compared with the magnetic field, the electrons are influenced solely by the magnetic field and move in a spiral motion having a radius of about 1 mm while surrounding the magnetic force lines. Therefore, at a place where the magnetic force lines intersect with the wafer 3, electrons enter obliquely into the wafer along the magnetic force lines. Since the mass of ions directly involving the etching reaction is large, the moving direction of the ions is not greatly bent by the magnetic field. However, when electrons enter obliquely into grooves in the wafer under etching, they impinge on only one side of the groove walls. As a result, the quantities of the electric charges on both sides of the groove walls are not equal. Thus, another electric field occurs across both sides of the groove walls, which acts on the ions to bend its moving direction so that undesirable etched shape is produced.

It is known that when a substrate on which devices having a MOS structure are formed is processed, such uneven distribution of electric charges on the wafer surface would cause insulation break down through a thin insulating film such as a gate oxide film or increase in the leakage current.

Since the etching apparatus of FIG. 57 uses a leakage flux of the magnetic field, a magnet producing a very large magnetic field must be used to obtain a required magnetic field on a substrate to be processed. However, a magnet producing a large magnetic field has a very large weight so that it is very difficult to assemble the etching apparatus. Each time the material of a substrate to be processed is changed, the magnet must be changed so as to change the distribution and strength of the magnetic field on the substrate. A large magnetic field produced by the magnet influences on broad regions surrounding the etching apparatus. Therefore, electronic devices sensitive to magnetism cannot be used in the surrounding broad regions. There is a multi-chamber system in which an apparatus has a plurality of reactive chambers each having a magnet. In the multi-chamber system, leakage flux from the plurality of reactive chambers interfere with each other to distort each magnetic field in the reactive chamber, which influence the process greatly. Therefore, the conventional apparatus utilizing the leakage flux of the magnet cannot be used in the multi-chamber system.

There has been proposed an apparatus which is provided with two coils of electromagnets at the opposing sides of a vacuum processing chamber. These two coils are disposed perpendicular to each other and supplied with alternating currents whose phases are shifted by 90 degrees so that the magnetic field produced by the electromagnets rotates. As the magnetic field rotates, however, the strength and distribution of the magnetic flux are changed so that the magnetic field is distorted. Further, as the frequency of the alternating current applied to the coils is increased to increase the rotation speed of the magnetic field, the impedance of the coils increases. Thus, there is a limit to the rotational speed. In order to supply a uniform magnetic field to the overall surface of the wafer, the coil diameter is required to be sufficiently large compared to the distance between the coils or the size of the container of the apparatus. As the diameter of the wafer increases, the size of the coil must be increased so that the current flowing through the coils and the size of a power source therefor increase.

Furthermore, since the strong magnetic field acts on regions in which no magnetic field is required inside and outside of the container, electro-mechanical parts sensitive to magnetism cannot be disposed in those regions. Further, magnetic shielding for protecting outside apparatus is required.

The above problems occur not only in the etching process, but also in all surface processing which use plasma such as depositing processes including sputtering and CVD, impurity implantation processes and surface modifying precesses, in terms of uniformity, accuracy, and damage.

As described above, since the strength and direction of the magnetic field are uneven in the conventional magnetron RIE apparatus, uniform etching is not maintained, and the directivity of ions is disturbed, so that ions enter obliquely into a substrate surface to be processed to thereby render high anisotropic etching difficult. When the magnetic field strength is tried to be increased, the magnet weight is larger and the apparatus becomes difficult to compose. Each time the distribution and strength of the magnetic field is changed, the magnet used must be changed. In addition, leakage magnetic field is large and a plurality of reactive chambers cannot be provided in close relationship.

SUMMARY OF THE INVENTION

The present invention is made in view of the above problems. It is an object of the present invention to provide a surface processing apparatus and a method of forming a magnetic field of uniform strength over a wide range of an electrode surface to maintain a uniform high-density plasma over the overall surface of a wafer.

In the first aspect of the present invention, there is provided a plasma generating apparatus comprising a vacuum container provided with a first electrode and a second electrode disposed opposite to the first electrode; gas feeding means for feeding a predetermined gas into the vacuum container; evacuating means for maintaining the inside of the container at a reduced pressure; electric field generating means for generating an electric field in a region between the first and second electrodes; and magnetic field generating means for generating a magnetic field in the vacuum container, the magnetic field generating means comprising a plurality of magnet elements arranged around the outer periphery of the container so as to form a ring in such a manner that directions of magnetization thereof differ from adjacent magnet element by a predetermined phase making a 360 degree rotation along half the circumference of the ring, whereby a plasma is generated.

In the second aspect of the present invention, there is provided a surface processing apparatus comprising a vacuum container provided with a first electrode and a second electrode disposed opposite to the first electrode for supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; and magnetic field generating means for generating a magnetic field in the vacuum container, the magnetic field generating means comprising a plurality of magnets arranged so as to form a ring in such a manner that magnetized direction of each magnet element differs from adjacent magnet element by a predetermined angle making a 360 degree rotation along half the circumference of the ring.

Preferably, the surface processing apparatus further comprises means for rotating the magnetic field generating means around a central axis thereof relative to the substrate to be processed.

Preferably, the surface processing apparatus further comprises magnetic field strength controlling means for adjusting the magnetic field strength within the container by changing the direction of magnetization of at least one of the magnets.

Preferably, the surface processing apparatus further comprises means for moving the magnetic field generating means vertically.

Preferably, the magnetic field generating means comprises at least two separate magnetic field generating sub-means disposed vertically with each other having the same central axis, at least one of the magnetic field generating sub-means being movable vertically.

Preferably, the magnetic field generating means comprises at least two separate magnetic field generating sub-means disposed vertically with each other such that distance between the two magnetic field generating sub-means is adjustable.

Preferably, the magnetic field generating means comprises at least two separate magnetic field generating sub-means disposed vertically with each other such that the difference in phase between the two magnetic field generating sub-means is adjustable.

Preferably, the plurality of magnet elements are disposed with directions of magnetization thereof being shifted by a predetermined phase with adjacent magnet element, and comprising means for rotating each of the plurality of magnet elements.

In the third aspect of the present invention, there is provided a surface processing apparatus comprising a vacuum container provided with a plurality of reactive chambers; a first electrode provided in at least one of the reactive chambers; a second electrode provided opposite to the first electrode; gas feeding means for feeding a predetermined gas into the at least one of reactive chambers; evacuating means for maintaining the inside of the at least one of reactive chambers at a reduced pressure; electric field generating means for generating an electric field in a region between the first and second electrodes; and magnetic field generating means for generating a magnetic field in the at least one of reactive chambers, the magnetic field generating means comprising a plurality of magnet elements arranged around the outer periphery of the at least one of reactive chambers so as to form a ring in such a manner that directions of magnetization thereof differ from adjacent magnet element by a predetermined phase making a 360 degree rotation along half the circumference of the ring.

In the fourth aspect of the present invention, there is provided a surface processing method comprising the steps of feeding a predetermined gas into a vacuum container provided with a first electrode and a second electrode disposed opposite to the first electrode; placing a substrate to be processed on the second electrode; generating an electric field in a region between the first and second electrodes; and forming a uni-directional magnetic field substantially parallel to a surface of the substrate to be processed by means of a plurality of magnet elements arranged so as to form a ring in such a manner that directions of magnetization thereof differ from adjacent magnet element by a predetermined phase making a 360 degree rotation along half the circumference of the ring, thereby to induce a plasma within the vacuum container to process the surface of the substrate.

In the fifth aspect of the present invention, there is provided a surface processing apparatus comprising a vacuum container provided with a first electrode and a second electrode disposed opposite to the first electrode, the second electrode supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; and magnetic field generating means for generating a magnetic field in the region between the first and second electrodes, the magnetic field generating means comprising a plurality of magnet elements arranged so as to form a ring around the vacuum container in such a manner that directions of magnetization thereof differ from adjacent magnet element by a predetermined phase making a 360 degree rotation along half the circumference of the ring; and electrode position setting means for moving the second electrode to change the distance between the first and second electrodes within a synthetic magnetic field generated by the plurality of magnet elements.

In the sixth aspect of the present invention, there is provided a surface processing apparatus comprising a vacuum container provided with a first electrode and a second electrode disposed opposite to the first electrode, the second electrode supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; magnetic field generating means for generating a magnetic field in the region between the first and second electrodes, the magnetic field generating means comprising a plurality of magnet elements arranged so as to form a ring in such a manner that directions of magnetization thereof differ from adjacent magnet element by a predetermined phase making a 360 degree rotation along half the circumference of the ring; and diameter changing means for changing the diameter of the ring formed by the plurality of magnet elements.

Preferably, the surface processing apparatus further comprises means for rotating the magnetic field generating means around a central axis thereof relative to the substrate to be processed.

Preferably, the magnetic field generating means comprises at least two separate magnetic field generating sub-means disposed vertically with each other having the same central axis, at least one of the magnetic field generating sub-means being movable vertically.

Preferably, the magnetic field generating means comprises at least two separate magnetic field generating sub-means disposed vertically with each other having the same central axis such that distance between the two magnetic field generating sub-means is adjustable.

Preferably, the magnetic field generating means comprises at least two separate magnetic field generating sub-means disposed vertically with each other having the same axis such that the difference in phase between the two magnetic field generating sub-means is adjustable.

Preferably, the magnetic field generating means comprises at least two separate magnetic field generating sub-means disposed vertically with each other having the same axis and the directions of magnetic fields generated by the two magnetic field generating sub-means are changed to change the strength of the synthetic magnetic field.

Preferably, the plurality of magnet elements are disposed with directions of magnetization thereof being shifted by a predetermined phase with adjacent magnet element, and comprising means for rotating each of the plurality of magnet elements.

In the seventh aspect of the present invention, there is provided a surface processing apparatus comprising: a vacuum container provided with a first electrode and a second electrode disposed opposite to the first electrode, the second electrode supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; and magnetic field generating means for generating a magnetic field in a region between the first and second electrodes, the magnetic field generating means comprising a plurality of magnets arranged so as to form a ring in such a manner that directions of magnetization thereof differ from adjacent magnet element by a predetermined phase making a 360 degree rotation along half the circumference of the ring, at least one pair of opposing magnet elements having direction of magnetization extending toward the central axis of the ring, the pair of magnet elements having a magnetic strength equal to each other with directions thereof opposite to each other.

In the eighth aspect of the present invention, there is provided a surface processing apparatus comprising a vacuum container provided with a first electrode and a second electrode disposed opposite to the first electrode, the second electrode supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; magnetic field generating means for generating a magnetic field in the region between the first and second electrodes, the magnetic field generating means comprising a plurality of magnets arranged around the vacuum container so as to form a ring in such a manner that directions of magnetization thereof differ from adjacent magnet element by a predetermined phase making a 360 degree rotation along half the circumference of the ring; and a dividing member provided around periphery of the substrate to be processed in radius direction of the ring, for dividing a space in the vacuum container into two regions, one region containing the substrate to be processed, another region not containing the substrate to be processed.

According to the first aspect of the present invention, a high density plasma can be generated.

According to the second aspect of the invention, a plurality of magnets arranged so as to form a ring in such a manner that directions of magnetization thereof differ from adjacent magnet element by a predetermined phase making a 360 degree rotation along half the circumference of the ring thereby to form a uni-directional magnetic field substantially parallel to the surface of the first electrode. Thus, a significantly uniform magnetic field is formed, the plasma potential and the self bias are equalized, and high anisotropic uniform etching is achieved. Damage due to the etched substrate surface being charged up is low. The first electrode may be formed as a part of the upper wall of the vacuum container or disposed within the container.

According to the conventional apparatus, since the generated magnetic field has a curved magnetic flux, a uniform plasma field cannot be formed even by rotating the magnetic field. In contrast, according to the second aspect of the present invention, the generated magnetic field has a complete parallel magnetic flux, a completely uniform processing by rotation of the magnetic field.

Further, a very high magnetic field strength (of up to several Kg) is obtained while maintaining its uniformity compared to the conventional apparatus. Thus, the ion energy and damage are reduced even in a high speed process.

Furthermore, since the weight of the magnet elements are relatively small, the associated peripheral mechanisms and hence the overall apparatus can be light and reduced in size.

Since the magnet is of an internal magnetic field type which gives a small amount of leaking magnetic flux to outside, there is little adverse influence on other apparatus. Thus, even in a multi-chamber type apparatus having a plurality of reactive chambers, processing in one chamber does not influence on processing of other chambers.

Unlike the conventional apparatus, no magnet is provided over the anode side. Therefore, a space on the anode side can be provide with other apparatus such as a monitor for monitoring plasma in the vacuum chamber and the surface state of a substrate to be processed or an upper evacuating mechanism disposed opposing to the wafer. Further, it is convenient to supply a high frequency power to the anode side.

The magnetic field generating means may be rotated to provide a further uniform magnetic field. It can be rotated freely without any limit as in an electromagnet coils. Since the magnetic field generating means has a concentric rotationally symmetric structure, a high speed rotation can be possible with a simple structure compared with the conventional apparatus.

The strength of the magnetic field can be adjusted by changing the direction of magnetization of at least one of the magnet elements of the magnetic field generating means without any magnet element being replaced with another.

Either the magnetic field generating means or the electrode on which the substrate is placed may be constructed such as to vertically movable so that conveying the substrate into/out of the container is facilitated.

The magnetic field generating means may have a slit at an appropriate height a slit through which the substrate to be processed is conveyed into/out of the container. Various experiments show that such slit does not influence on the direction of the magnetic field and therefore the a parallel magnetic flux can be obtained.

The magnetic field generating means may comprise at least two separate magnetic field generating sub-means disposed vertically having the same central axis, at least one of the magnetic field generating sub-means being movable vertically to facilitate the conveyance of the substrate into/out of the container.

The magnetic field generating means may comprise at least two vertically disposed magnetic field generating sub-means having the same central axis with the-distance between the magnetic field generating sub-means being adjustable. With this structure, the strength of the magnetic field can easily adjusted without exchanging the magnet elements with other ones.

The magnetic field generating means may comprise at least two separate magnetic field generating sub-means disposed vertically with the same central axis. By adjusting the phase difference between these two magnetic field generating sub-means, the strength of the magnetic field can easily be adjusted without changing the magnet elements.

The magnetic field generating means may comprise at least two separate magnetic field generating sub-means disposed vertically with the same central axis. By rotating these two magnetic field generating sub-means in opposite directions, the strength of the magnetic field can easily be adjusted without changing the magnet elements.

The magnet elements constituting the magnetic field generating means may be rotated individually while they are arranged with their directions of magnetization being shifted by a predetermined phase thereby to form a magnetic field equivalent to that obtained when the overall magnet ring is rotated.

According to the third aspect of the invention, since very little magnetic flux is leaked, surface processing operations can be performed simultaneously in the plasma generated in each of a plurality of reaction containers without being influenced by each other.

According to the fourth aspect of the present invention, a uni-directional magnetic field is generated substantially parallel to the surface of the second electrode. Since etching is performed by active seeds produced by the plasma generated on the substrate surface, the etching rate and the shape of etched portion are improved, and electrostatic damage such as the break down of gates due to the distribution of the plasma density is reduced. In addition, a strong magnetic field in the order of Kg increases the density of the magnetron plasma and decreases the ion energy.

The present invention is especially effective for the surface processing of a substrate to be processed in which electric devices are formed thereon, that is, especially effective for establishment of a uni-directional magnetic field substantially parallel to the surface of the second electrode, and for production of active species using the plasma induced over the substrate. Although the substrate is exposed to the plasma and hence electrically charged, no high voltage is applied across the thickness of the thin insulating film as long as the electrical charging is uniform in the surface of the substrate, and no gate break down occurs. Thus, stable thin film formation and etching excellent in directivity are achieved.

In the substrate processing apparatus using a dipole ring magnet constructed by a plurality of magnet elements arranged in the form of a ring as is described later, uniformity is maintained such that the difference in magnetic field strength between the central and peripheral portions of the substrate to be processed can be maintained less than 20%, and that the tilt in the XY plane is within ±5 degrees. Although the dipole ring magnet generates an excellent magnetic field, when such magnet is used in a magnetron RIE apparatus under a low pressure of 5 Mtorr which is considerably lower than the pressure usually used in etching process wi magnetron RIE's, the etching rate may be decreased in the periphery of the substrate. Further, when a substrate formed with elements of a MOS structure is processed by the magnetron RIE apparatus, insulation break down in a thin oxide film such as the gate oxide film is likely to occur.

FIGS. 60 and 61 show the intra-surface distributions of the etching rates of oxide films by the conventional magnetron RIE apparatus using the conventional magnet and the dipole ring magnets, respectively in which the magnets are rotated. In these drawings, N and S denote the directions of the magnetic poles and E an W denote the east and west directions with respect to the magnets. Although the causes of a reduction in the etching rates in the peripheral portions of the substrate to be processed are not known, it may be understood as follows.

As shown by curve a in FIG. 22, (curve b denotes a distribution of magnetic field strength formed by the conventional magnet), the distribution of magnetic field strength formed by the dipole ring magnet is uniform over the substrate area or over an area larger than the substrate area. However, the magnetic field strength is rapidly reduced in the vicinity of the magnet. Thus, although the magnetic field distribution is uniform through substantially the overall surface of the substrate compared to the conventional magnetron RIE even under a low pressure of 5 Mtorr which is considerably lower than the pressure usually used in etching process, a rapid reduction in the etching rate occurs in the periphery of the substrate. The reason for this is possibly that since the magnetic field strength is uniform, there is almost no mirror effect which generate a mirror magnetic field. Therefore, in the peripheral portion of the substrate, electron are likely to get loose and the density of the plasma is reduced. When a substrate is exposed to the plasma, the substrate is electrically charged. If there is a difference in the plasma density varies in density, the surface of the substrate is unevenly charged so that a high voltage is applied across the thickness at a portion of the thin insulating film. Thus, insulation break down occurs at this portion.

The dipole ring magnet may comprises an upper and a lower dipole ring between which a load lock carrying system is provided to convey the substrate from the load chamber to the etching chamber and vice versa. There is provided a mechanism for moving each ring up and down, the space between the upper and the lower rings becoming wider and narrower. However, the spacing between the rings cannot be narrower than the height of the carrying system. Because of the space between the rings, the strength of the magnetic field at a peripheral area is weakened although a uniform magnetic field parallel to the surface of the substrate is generated. The reduction in the magnetic field in the peripheral region can be compensated for by adding an auxiliary magnetic field to the peripheral region, especially in the vicinity of the N and S poles, and by rotating slightly the direction of magnetization of the magnet elements in the vicinity of the N and S poles toward the direction of magnetization of the dipole ring magnet. With this arrangement, a uniform parallel electric field can be generated in the vacuum container to thereby confine the plasma therein so that it is possible to perform surface processing such as etching with little ion damage, stable film formation, and satisfactory directivity. However, an apparatus structure becomes complicated in the actual mass production process.

According to the fifth aspect of the present invention, simplification of the apparatus structure and uniform processing are intended. A substrate to be processed is conveyed into a magnetic field generated by magnetic field generating means by moving the substrate vertically. Therefore, it is not necessary to divide the magnetic field generating means. As a result, there occurs no reduction in the magnetic field at a peripheral region and there is no need to add an auxiliary magnetic field to prevent such reduction. Thus, an apparatus structure becomes simple with a uniform high density magnetic field and equalized plasma potential and self bias voltage over the overall surface of the wafer. With the apparatus, highly anisotropic uniform surface processing is achieved on the surface of a substrate.

Further, the height of the cathode electrode (second electrode) on which a substrate to be processed is placed may be set at any position. The distance between the electrodes is changeable to an optimal one during plasma processing depending on the substrate material, gas and pressure to thereby change the processing characteristic.

According to the sixth aspect of the present invention, the diameter of the ring and hence the magnetic field strength generated within the ring are changed to control the ion energy to change the processing characteristic.

Therefore, for example, each time the optimal magnetic strength varies depending on the substrate material or the gas in the surface processing of the substrate, no magnet elements having the optimal magnetic strength are required to be changed. When sequential processing can be made efficiently under the optimal magnetic field.

According to the seventh aspect of the present invention, the magnetic field generating means comprises a plurality of magnet elements arranged so as to form a ring along half the circumference of which the direction of magnetization of the magnet elements makes a complete rotation as a whole, at least one pair of opposite ones of the magnet elements has components perpendicular to the ring and axially symmetrical around the central axis of the ring. Thus, the height of the space for a magnetic field parallel to a surface of the substrate may be deviated from the mid-height of the magnetic field generating means.

Preferably, the space for a parallel magnetic field is formed at any height within the ring by changing the magnitude of directional components axially symmetrical to each other and perpendicular to the ring.

Thus, when the substrate is processed by a plasma within the parallel magnetic field, the substrate is not required to be carried to the vicinity of the center of the magnet which is the parallel magnetic field space formed by the dipole ring magnet, the distance of movement of the lower electrode is reduced, and the moving mechanism is simplified.

The magnitude of the vertical components can easily be changed to change the magnetic field strength during processing.

In order to change the magnetic field strength during the processing, the magnitude of its vertical components is easily changed.

According to the eighth aspect of the present invention, it is possible to generate a magnetized plasma only in a region in which a substrate to be processed is disposed and the substrate in that region is not influenced by magnetized plasma generated by other apparatuses.

It is a further object of the present invention to provide a substrate processing apparatus which forms a uniform plasma over a wide range of the electrode surface, confines the plasma and maintains the plasma at high density over the overall surface of the wafer.

Accordingly, in the ninth aspect of the present invention, there is provided a surface processing apparatus comprising a vacuum container provided with a first electrode and a second electrode disposed opposite to the first electrode, the second electrode supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; and magnetic field generating means for generating a magnetic field in the vacuum container, the magnetic field generating means comprising a plurality of magnets arranged around the vacuum container so as to form a ring in such a manner that directions of magnetization thereof differ from adjacent magnet element by a predetermined phase making a 360 degree rotation along half the circumference of the ring, the strength of the magnetic field in the vicinity of the peripheral portions of the ring in its north-south (N-S) pole direction being equal to, or greater than, that of the magnetic field at the center of the ring.

The magnetic field strengths in the peripheral portions of the ring in its N-S direction are equal, or stronger than, that in the center of the ring to exert a force to push the plasma back from the peripheral portions of the ring toward its center to thereby confine the plasma between the first and second electrodes. The first electrode may constitute a part of a wall of the container insulated electrically from the remaining portion of the container or may be provided separately within the container. For example, first magnetic field generating, means which comprises a plurality of magnets disposed so as to form a ring along half the circumference of which the direction of magnetization of the magnet elements makes a complete rotation as a whole, generates a uni-directional magnetic field substantially parallel to a surface of the first electrode. Second magnetic field generating means may be provided so as to generate a mirror magnetic field to the vicinity of the substrate in a plasma magnetic field expanding uniformly to generate a high density plasma to thereby equalize the plasma potential and self bias voltage to perform highly anisotropic uniform high speed surface processing on the surface of the substrate.

Preferably, at least one second magnet is disposed within the magnetic field generated by a first magnet ring composed of magnet elements disposed so as to form a ring along half the circumference of which the direction of magnetization of the magnet elements makes a complete rotation as a whole such that the magnetic field in the peripheral portions of the ring in its N-S direction is equal to, or stronger than, that at the center of the ring to thereby confine the plasma induced between the first and second electrodes within this space.

Preferably, the magnetic field generating means comprises a plurality of magnet elements arranged so as to form a ring along half the circumference of which the direction of magnetization of the magnet elements makes a complete rotation as a whole. The plurality of magnet elements produces magnetic fields having different strengths such that the synthetic magnetic field in the vicinity of the ring periphery in its N-S direction being equal to, or greater than, that of the magnetic field at the center of the ring to thereby confine the plasma induced between the first and second electrodes within this space.

Preferably, the magnetic field generating means comprises a plurality of magnet elements arranged so as to form a ring along half the circumference of which the direction of magnetization of the magnet elements makes a complete rotation as a whole. The plurality of magnet elements produces magnetic fields having different directions of magnetization such that the synthetic magnetic field in the vicinity of the ring periphery in its N-S direction being equal to, or greater than, that of the magnetic field at the center of the ring to thereby confine the plasma induced between the first and second electrodes within this space.

Preferably, the magnetic field generating means comprises first magnetic field generating means which comprises a plurality of magnet elements disposed so as to form a ring along half the circumference of which the direction of magnetization of the magnet elements makes a complete rotation as a whole, second and third magnetic field generating means having a structure similar to that of the first magnetic field generating means disposed so as to hold the first magnetic field generating means between the second and third magnetic generating means such that the first, second and third magnetic generating means have the same central axis to thereby confine the plasma induced between the first and second electrodes to within this space.

Preferably, the magnet elements which compose the magnetic field generating means have different shapes and are arranged so as to form a ring. The magnet elements which compose first magnetic field generating means are arranged so as to form a ring along half the circumference of the which the direction of magnetization of the magnet elements makes a complete rotation as a whole. Those magnet elements have different shapes to confine a plasma induced between the first and second electrodes to within this space.

The first magnetic field generating means which comprises a plurality of different magnet elements arranged so as to form a ring along the circumference of which the direction of magnetization of the magnet elements makes a complete rotation as a whole generates a uni-directional magnetic field along and parallel to the second electrode to thereby induce a plasma within the vacuum container. A second magnet is disposed within the first magnetic field generated by the magnetic field generating means to thereby increase the density of the plasma on the substrate by the second magnetic field generated by the second magnet to process the substrate.

In the tenth aspect of the present invention, there is provided a surface processing apparatus comprising a vacuum container provided with a first electrode and a second electrode disposed opposite to the first electrode, the second electrode supporting thereon a substrate to be processed; gas feeding means for feeding a predetermined gas into the vacuum container; evacuating means for maintaining the inside of the container at a reduced pressure; electric field generating means for generating an electric field in a region between the first and second electrodes; and magnetic field generating means for generating a magnetic field in the vacuum container, the magnetic field generating means comprising a plurality of magnets arranged so as to form a ring in such a manner that directions of magnetization thereof differ from adjacent magnet element by a predetermined phase making a 360 degree rotation along half the circumference of the ring, the magnetic field having a gradient of strength in an east-west direction of the ring.

Preferably, at least one second magnet is disposed within the magnetic field generated by the first magnet ring of magnet elements disposed so as to form a ring along half the circumference of which the direction of magnetization of the magnet elements makes a complete rotation as a whole such that the magnetic field has such a gradient that its strength decreases from the east of the ring toward its west.

Preferably, the magnetic field generating means comprises a plurality of magnet elements disposed so as to form a ring along half the circumference of which the direction of magnetization of the magnet elements makes a complete rotation as a whole, the magnet elements generating magnetic fields different in strength, the synthetic magnetic field having such a gradient that its strength decreases from the east of the ring toward its west.

Preferably, the magnetic field generating means comprises a plurality of magnet elements disposed so as to form a ring along half the circumference of which the direction of magnetization of the magnet elements makes a complete rotation as a whole, the magnet elements magnetic fields different in strength, the synthetic magnetic field having such a gradient that its strength decreases from the east of the ring toward its west.

According to the tenth aspect of the present invention, the magnet elements composing the first magnetic field generating means or the second magnetic field generating means generate magnetic fields different in strength so as to decrease the density gradient of electrons present in the plasma in the magnetic field space to thereby render the plasma more uniform.

Damage due to electric charges borne on the substrate surface is reduced. While in the conventional apparatus a completely uniform magnetic field cannot be obtained even by rotation of the magnetic field because the magnetic field is curved, the inventive arrangements are capable of providing a magnetic field completely parallel to and on the substrate to be processed, so that a complete uniform processing is established by rotation of the magnetic field.

According to still another aspect of the present invention, a plasma generating apparatus comprises a vacuum container provided with a first electrode and a second electrode disposed opposite to the first electrode; gas feeding means for feeding a predetermined gas into the vacuum container; evacuating means for maintaining the inside of the container at a reduced pressure; electric field generating means for supplying an electric power across the first and second electrodes to generate an electric field in a region between the first and second electrodes; and magnetic field generating means for generating a magnetic field in the vacuum container, wherein the magnetic field generating means comprises a plurality of magnet element groups arranged in a circle around the container so as to form a ring, each of the magnet element groups having an axis directed to a center of the circle and a synthetic magnetization direction, and comprising one or a plurality of magnet elements having respective magnetization directions which are synthesized to be equal to the synthetic magnetization direction of said each of the magnetic element groups, wherein one of the magnet element groups is so disposed that the synthetic magnetization direction thereof coincides with the axis thereof, and each of the magnet element groups other than the one magnet element group is so disposed that an angle of the synthetic magnetization direction thereof relative to the synthetic magnetization direction of the one magnet element group is substantially twice an angle of the axis thereof relative to the axis of the one magnet element group.

According to yet another aspect of the present invention, a surface processing apparatus comprises a vacuum container provided with a first electrode and a second electrode disposed opposite to the first electrode for supporting thereon a substrate to be processed; gas feeding means for feeding a predetermined gas into the vacuum container; evacuating means for maintaining the inside of the container at a reduced pressure; electric field generating means for supplying an electric power across the first and second electrodes to generate an electric field in a region between the first and second electrodes; and magnetic field generating means for generating a magnetic field in the vacuum container, wherein the magnetic field generating means comprises a plurality of magnet element groups arranged in a circle around the container so as to form a ring, each of the magnet element groups having an axis directed to a center of the circle and a synthetic magnetization direction, and comprising one or a plurality of magnet elements having respective magnetization directions which are synthesized to be equal to the synthetic magnetization direction of said each of the magnetic element groups, the magnet elements generating a synthesized magnetic field, wherein one of the magnet element groups is so disposed that the synthetic magnetization direction thereof coincides with the axis thereof, and each of the magnet element groups other than the one magnet element group is so disposed that an angle of the synthetic magnetization direction thereof relative to the synthetic magnetization direction of the one magnet element group is substantially twice an angle of the axis thereof relative to the axis of the one magnet element group.

Preferably, each of the magnet element groups comprises a pair of magnet elements each having a magnetization direction different from each other.

Preferably, each of the magnet element groups comprises a pair of magnet elements each having the same magnetization direction and generating the same magnetic field.

Preferably, each of the magnet element groups comprises two magnet elements or more and the synthetic magnetization direction thereof is deviated from positions where the magnet elements are located.

Preferably, the magnet element groups are so constructed that strength of a magnetic field generated by the magnetic field generating means around peripheral portions of the vacuum container in a north-south direction is equal to or larger than at a central portion thereof.

Preferably, materials of the magnet elements for each of the magnet element groups are determined according to a position of each of the magnet element groups such that strength of a magnetic field generated by the magnetic field generating means around peripheral portions of the vacuum container in a north-south direction is equal to or larger than at a central portion thereof.

Preferably, each of the magnet element groups is constituted by magnet elements which are formed with respective slits in a direction perpendicular to an axis of the ring, widths of the slits being determined according to a position of each of the magnet element groups such that strength of a magnetic field generated by the magnetic field generating means around peripheral portions of the vacuum container in a north-south direction is equal to or larger than at a central portion thereof.

Preferably, each of the magnet element groups includes magnet elements whose lengths in a direction along an axis of the ring are adjusted such that strength of a magnetic field generated by the magnetic field generating means around peripheral portions of the vacuum container in a north-south direction is equal to or larger than at a central portion thereof.

Preferably, thicknesses of the magnet elements are determined for each of the magnet element groups according to a position of each of the magnet element groups such that strength of a magnetic field generated by the magnetic field generating means around peripheral portions of the vacuum container in a north-south direction is equal to or larger than at a central portion thereof.

Preferably, the magnetization directions of the magnet elements for each of the magnet element groups are determined according to a position of each of the magnet element groups such that strength of a magnetic field generated by the magnetic field generating means around peripheral portions of the vacuum container in a north-south direction is equal to or larger than at a central portion thereof.

Preferably, distances of the magnet elements from an axis of the ring for each of the magnet element groups are determined according to a position of each of the magnet element groups such that strength of a magnetic field generated by the magnetic field generating means around peripheral portions of the vacuum container in a north-south direction is equal to or larger than at a central portion thereof.

Preferably, materials of peripheral members for supporting the magnet elements for each of the magnet element groups are selected according to a position of each of the magnet element groups such that strength of a magnetic field generated by the magnetic field generating means around peripheral portions of the vacuum container in a north-south direction is equal to or larger than at a central portion thereof.

Preferably, the magnetic field generating means is divided into two parts in a direction perpendicular to an axis of the ring with a slit of a predetermined width therebetween.

Preferably, the slit is constructed according to a position of the magnetic field generating means and a position of the substrate to be processed such that strength of a magnetic field generated by the magnetic field generating means around peripheral portions of the vacuum container in a north-south direction is equal to or larger than at a central portion thereof.

Preferably, the surface processing apparatus further comprises a transportation port provided in a wall of the vacuum container at the position above or below the magnetic field generating means, for transporting the substrate to be processed into or out of the vacuum container; and transporting means for transporting the substrate in upward and downward directions within the vacuum container.

Preferably, the magnetic field generating means is so constructed as to generate a magnetic field having a gradient in an east-west direction in the strength thereof.

According to further aspect of the present invention, a surface processing apparatus comprises a vacuum container provided with a first electrode and a second electrode disposed opposite to the first electrode for supporting thereon a substrate to be processed; gas feeding means for feeding a predetermined gas into the vacuum container; evacuating means for maintaining the inside of the container at a reduced pressure; electric field generating means for supplying an electric power across the first and second electrodes so as to generate an electric field in a region between the first and second electrodes; and magnetic field generating means for generating a magnetic field in the vacuum container, wherein the magnetic field generating means comprises a plurality of magnet elements arranged in a circle around the container so as to form a ring, each of the magnet elements having an axis directed to a center of the circle and a magnetization direction, wherein one of the magnet elements is so disposed that the magnetization direction thereof coincides with the axis thereof, and each of the magnet elements other than the one magnet element is so disposed that an angle of the magnetization direction thereof relative to the magnetization direction of the one magnet element is substantially twice an angle of the axis thereof relative to the axis of the one magnet element, and wherein the magnetic field generating means is divided into two parts in a direction perpendicular to an axis of the ring with a slit of a predetermined width therebetween.

Preferably, the slit is constructed according to a position of the magnetic field generating means and a position of the substrate to be precessed such that a uniform magnetic field is formed at the substrate.

Preferably, the surface processing apparatus further comprises a transportation port provided in a wall of the vacuum container at the position above or below the magnetic field generating means, for transporting the substrate to be processed into or out of the vacuum container; and transporting means for transporting the substrate in upward and downward directions within the vacuum container.

Preferably, the slit is constructed according to a position of the magnetic field generating means and a position of the substrate to be precessed such that strength of a magnetic field generated by the magnetic field generating means around peripheral portions of the vacuum container in a north-south direction is equal to or larger than at a central portion thereof.

Preferably, the slit is constructed according to a position of the magnetic field generating means and a position of the substrate to be processed such as to generate a magnetic field having a gradient in an east-west direction in the strength thereof.

BRIEF DESCRIPTION OF THE DRAWINGS

In the accompanying drawings:

FIGS. 40(a) and 40(b) show a modification of the dipole ring;

FIGS. 41(a) and 41(b) show a modification of the dipole ring;

DETAILED DESCRIPTION OF THE EMBODIMENTS

Embodiments of the present invention will be described in detail hereinafter with respect to the accompanying drawings.

Figure 1:
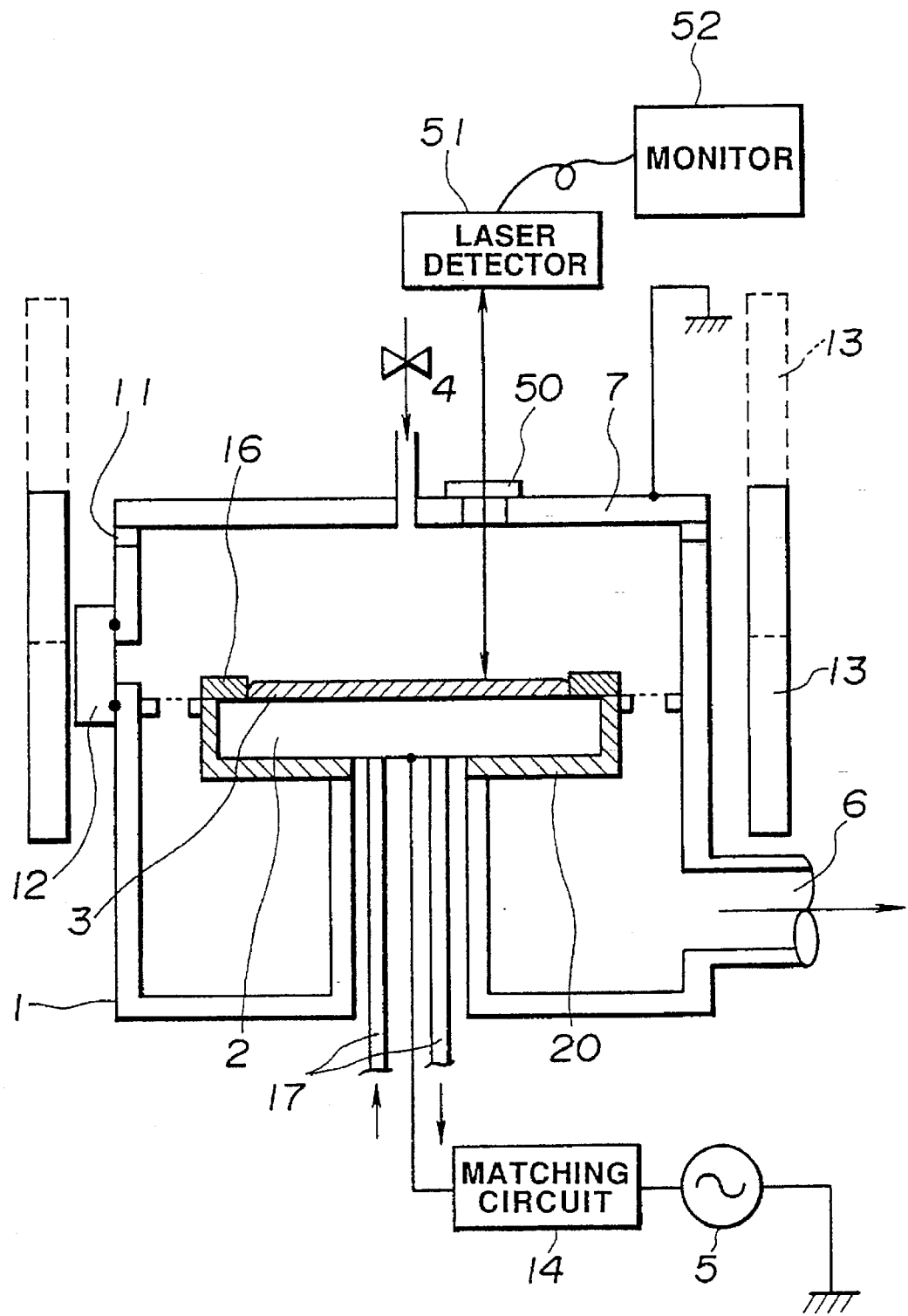
FIG. 1 shows an etching apparatus of a first embodiment of the present invention.

FIG. 1 shows an etching apparatus of an embodiment of the present invention. The etching apparatus comprises a first electrode 7 on the upper wall of a vacuum container 1, a second electrode 2 disposed opposite to the first electrode 7 for acting also as a substrate support, a high frequency power source 5 for applying electric power across the first and second electrodes 7 and 2 through a matching circuit 14 to generate an electric field therebetween, and a dipole ring 13 disposed outside the vacuum container 1 for generating a magnetic field perpendicular to the electric field and parallel to a surface of a wafer 3. A reactive gas is supplied through a gas inlet 4 into a region in which the electric field and the magnetic field perpendicular to the electric field exist so that plasma is generated by electric discharge. A self-bias electric field (self bias voltage Vdc) is induced on the wafer surface which accelerates ions in the plasma to impinge on the wafer so as to advance the etching process.

Figure 2:
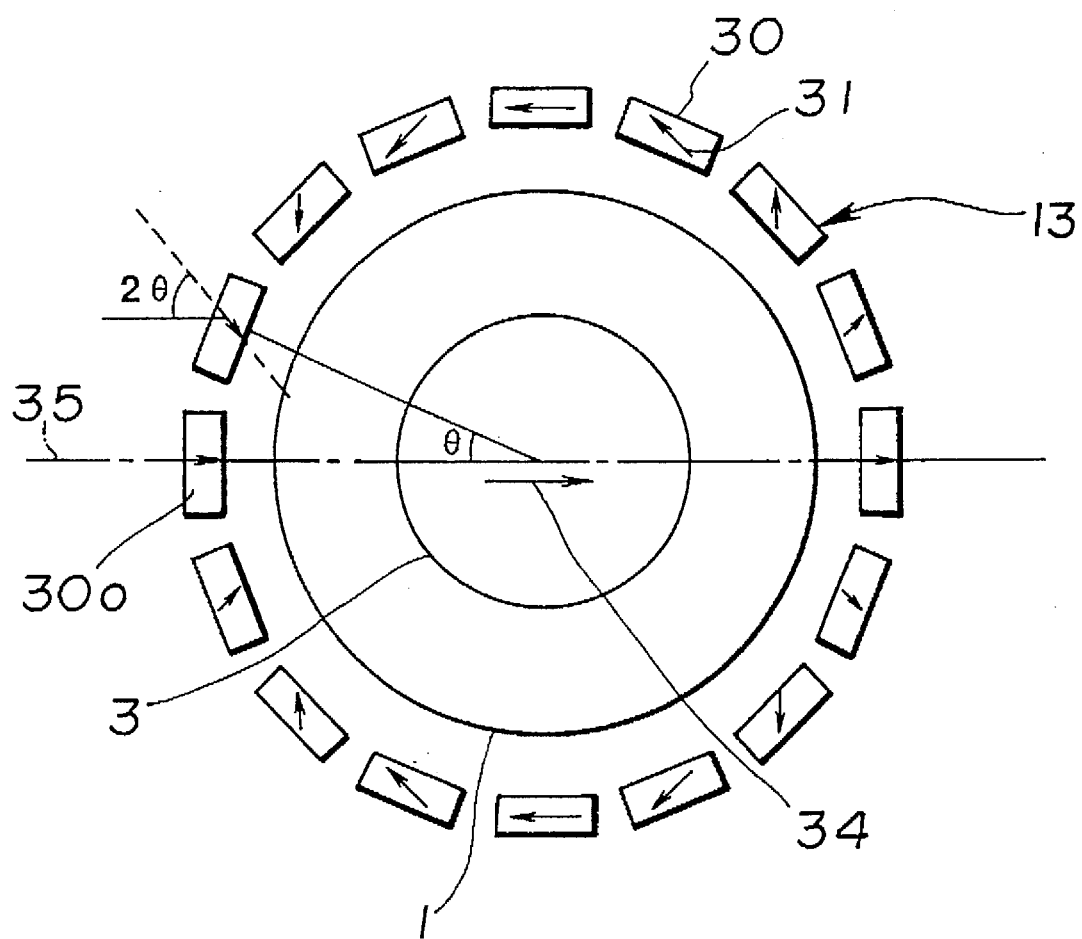
FIG. 2 shows an arrangement of a dipole ring used in the apparatus of the first embodiment.

FIG. 2 is a schematic plan view of the etching apparatus of FIG. 1 in which the dipole ring 13 comprises magnet elements 30 disposed to concentrically surround the outer cylindrical periphery of the vacuum container 1. A magnet element 29 disposed at an angle of θ with respect to a magnet element $30_0$ magnetized in the direction of magnetic field 35 is magnetized in a direction which is rotated by 2θ from the direction of the magnetic field 35. The magnet element disposed at 180 degrees with respect to the magnet element $30_0$ is arranged such that the direction of magnetization orients in the direction of magnetic field 35. In order for the magnet elements to withstand twisting forces acting on them, they are fixed to a rigid non-magnetic yoke (not shown). In order to reduce a leakage magnetic flux, a yoke may be made of a magnetic material.

Figure 3A:
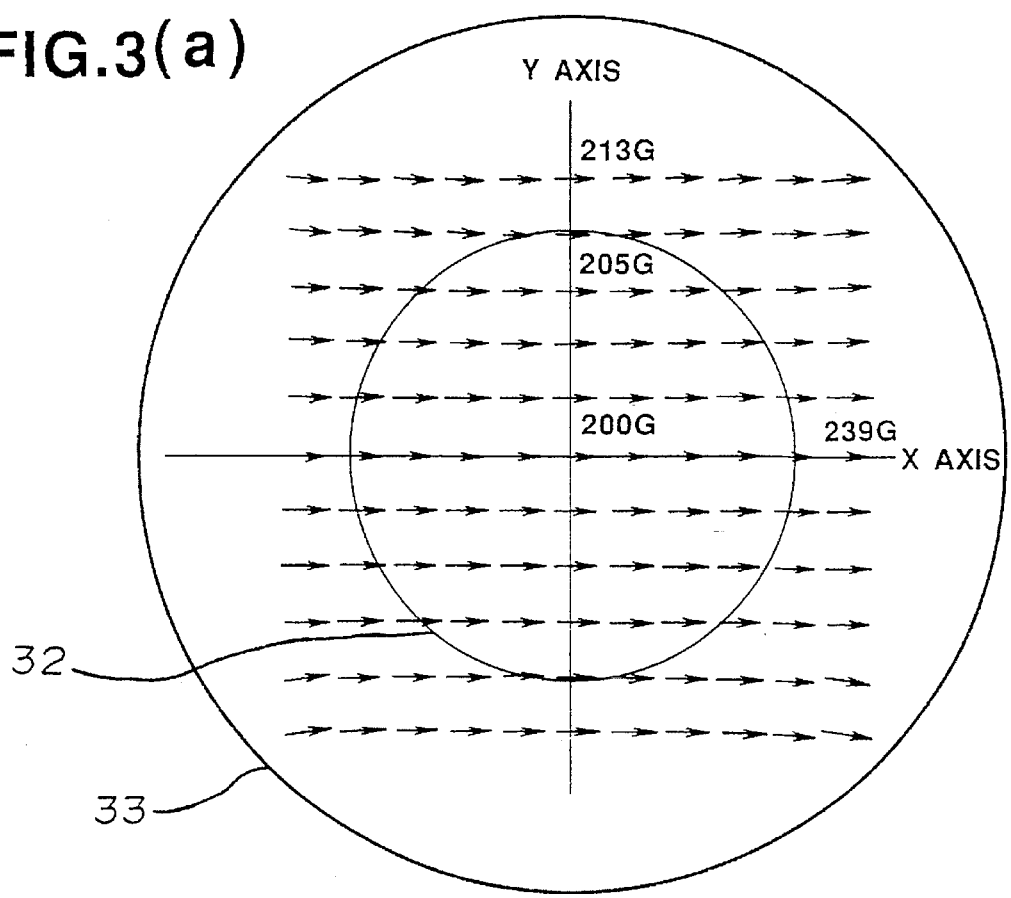
FIGS. 3(a) and 3(b) shows the distribution of a magnetic field in the etching apparatus.
Figure 3B:
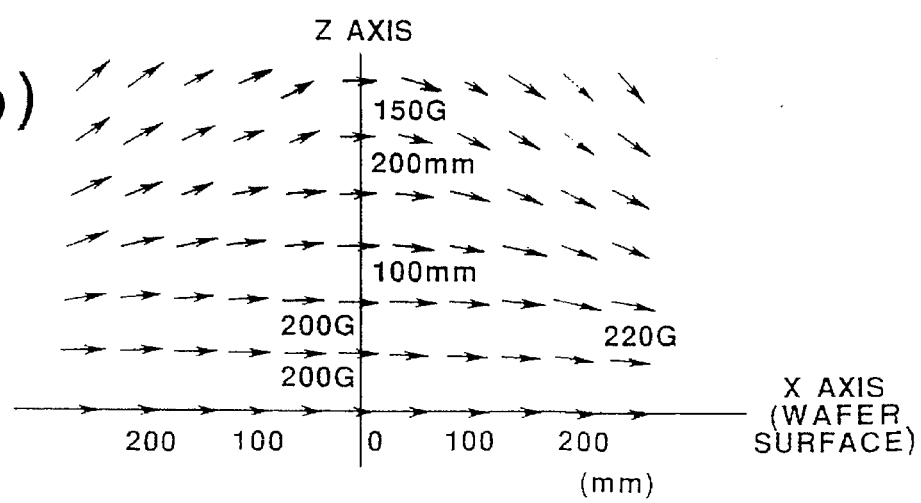
Figure 59:
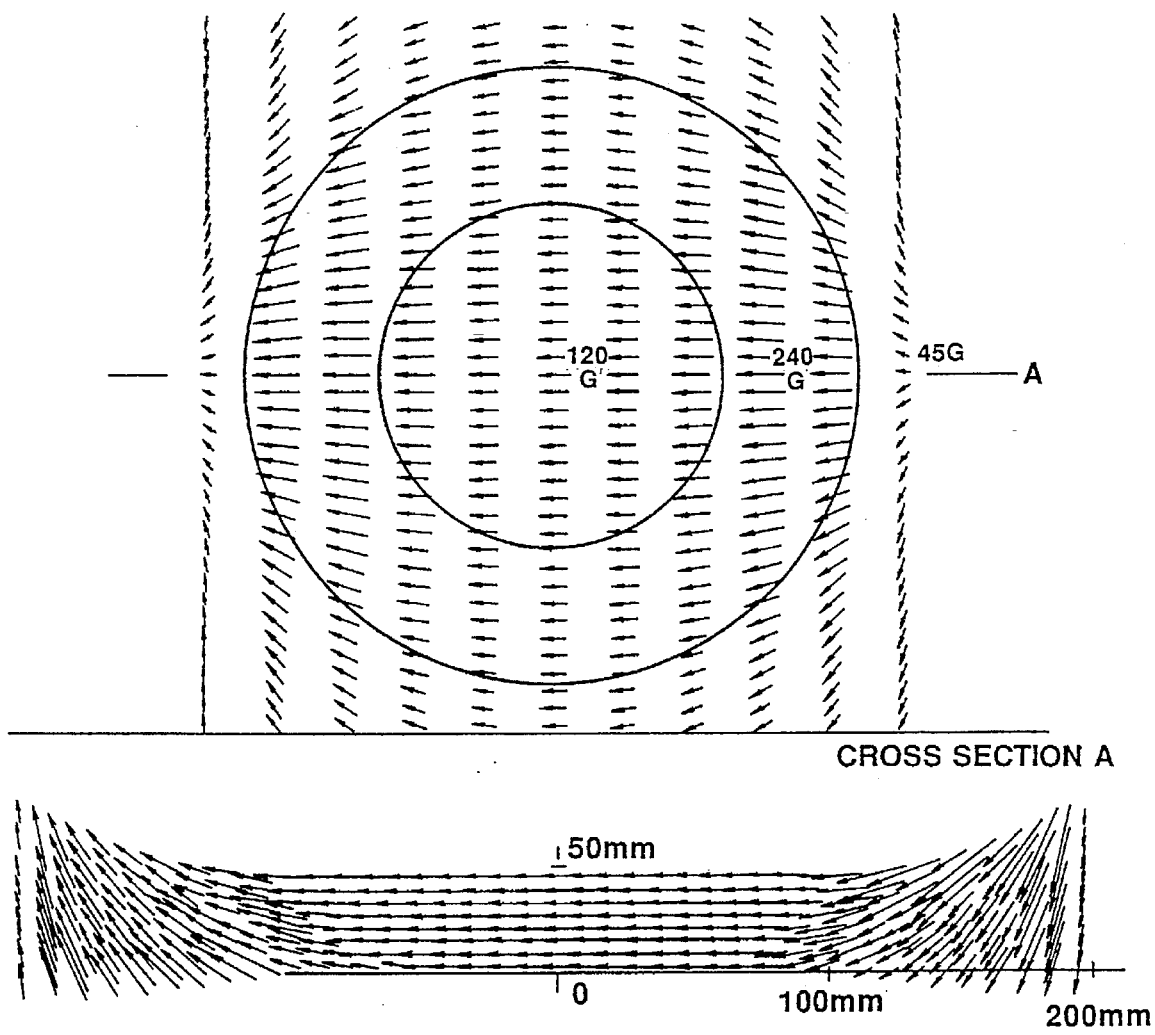
FIG. 59 shows a distribution of magnetic field in the conventional apparatus.
Figure 60:
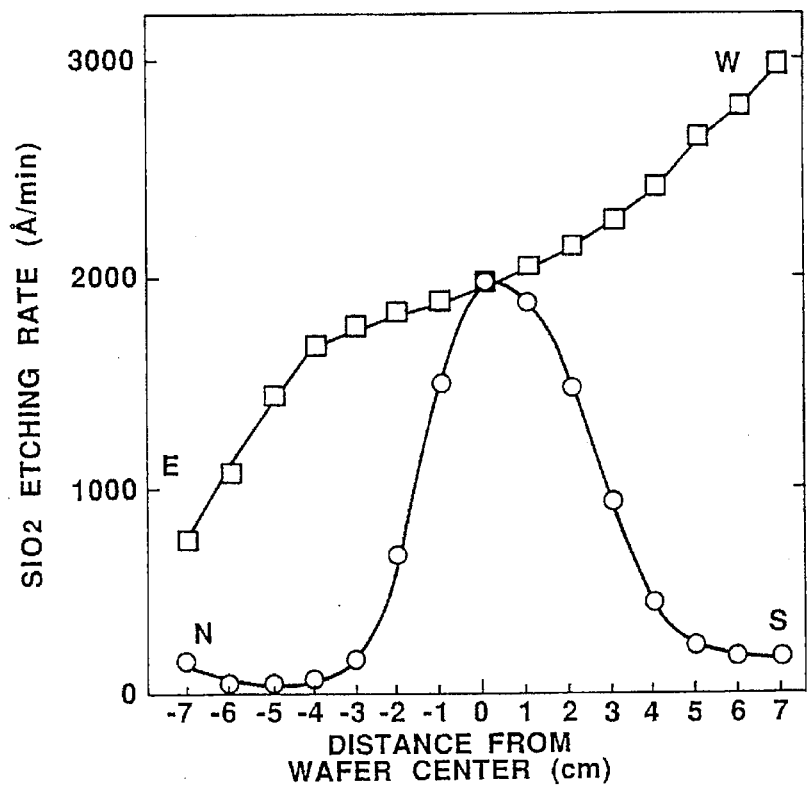
FIG. 60 shows the relationship between the distance from the center of a wafer in and the etching rate of an etching apparatus using a magnet of the conventional apparatus.
Figure 61:
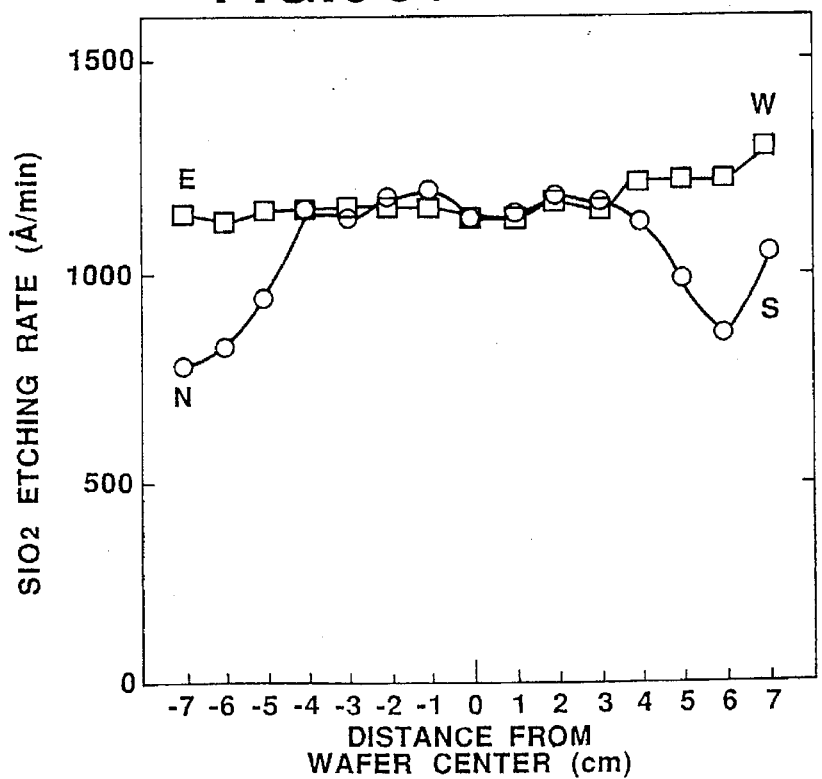
FIG. 61 shows the relationship between the distance from the center of a wafer in and the etching rate of an etching apparatus using a dipole ring.

FIGS. 3(a) and 3(b) illustrates a magnetic field Generated by the dipole ring. As shown in FIGS. 3(a) and 3(b), the difference in the strength of the magnetic field between the central and peripheral portions of the wafer is within 20% and the tilt of the magnetic field with respect to an XY plane (the surface of the wafer) is less than ±5 degrees. In the height direction, the difference in the strength of the magnetic field is within ±5% in ⅓ region of the central portion of the height of the dipole magnet elements and the tilt of the magnetic field is within ±6 degrees. By forming the cross section of the magnet elements circular or by increasing the number of magnet elements, further uniformity of the magnetic field can be achieved. In contrast, In the conventional apparatus of FIG. 59, a ratio of the magnetic field strength of the central to peripheral portions of the magnet elements is two. Similarly, in a region above the wafer, that is, in a region where a plasma is formed, the vertical magnetic field strength is larger in the peripheral portions so that the distribution of the plasma is distorted. The dipole ring has been developed originally for use in a polarizer of SOR (Synchrotron Beam Orbital Radiation Facilities) or an medical apparatus such as MRI (Magnetic Resonance Imaging) apparatus (K. Miyata et al: The International Journal for Computation and Mathematics in Electrical and Electronic Engineering, Vol. 9(1990), Supplement A, 115–118, H. Zijlistra: Phillips J. Res. 40, 259–288, 1985). The inventors of this application found that it is very effective to employ the dipole ring in a magnetized plasma producing apparatus as in the present invention.

By perpendicular intersection between the electric field E and the magnetic field B, electrons in the plasma are drifted by the Lorentz force in the direction of E×B so that the electrons run over a longer distance. Thus, the frequency of the electrons to collide with neutral molecules and atoms is increased and hence to the plasma density is increased. Further, by only applying the magnetic field B to the electrons, the electrons are confined within the plasma and the lifetime of the electrons (the time period until the electrons collide with the sidewall of the chamber, the electrode or the wafer) is prolonged. As a result, the plasma density is increased. This serves to not only increase the etching rate but also improve the directivity of those ions. Further, the ion energy which would amplify damage and reduce the etch selectivity can be suppressed at a sufficiently low level even if the gas pressure is reduced to suppress the reaction of neutral species and an etched film (isotropic reaction).

In the second electrode 2 which also serves as the support of the substrate, a cooling fluid is supplied through a pipe 17 so as to control the temperature of the substrate. The magnetron plasma produced in the apparatus of the present invention has high density and a quantity of heat given from the plasma to the substrate is larger than that in the conventional apparatus.

The vacuum container 1 is constructed such that the first electrode 7 is electrically isolated from the underlying wall of the container by an insulator 11 disposed between the first electrode 7 and the underlying wall of the container 1. However, the insulator 11 is not necessary when the first electrode 7 is grounded since the electric potential of the first electrode is equal to that of the container. Reference numeral 6 denotes a reaction gas evacuating pipe and reference numeral 20 denotes an insulator which insulates the second electrode 2. A protective ring 16 is disposed on the second electrode 2 so as protect the periphery of a wafer on the second electrode 2 from being exposed to the plasma. The material of the protective ring 16 is selected from the group of ceramics consisting of SiC, alumina, AlN and BN; carbons having various structures; Si; organic compounds; metals; and alloys, depending on a film to be etched and a gas to be used.

Although a neodymium iron alloy (Nd-Fe) magnet is used in this embodiment, permanent magnet materials such as Sm-Co material, ferrite or alnico may be used depending on a required magnetic field and required durability and weight of the magnet.

Figure 57:
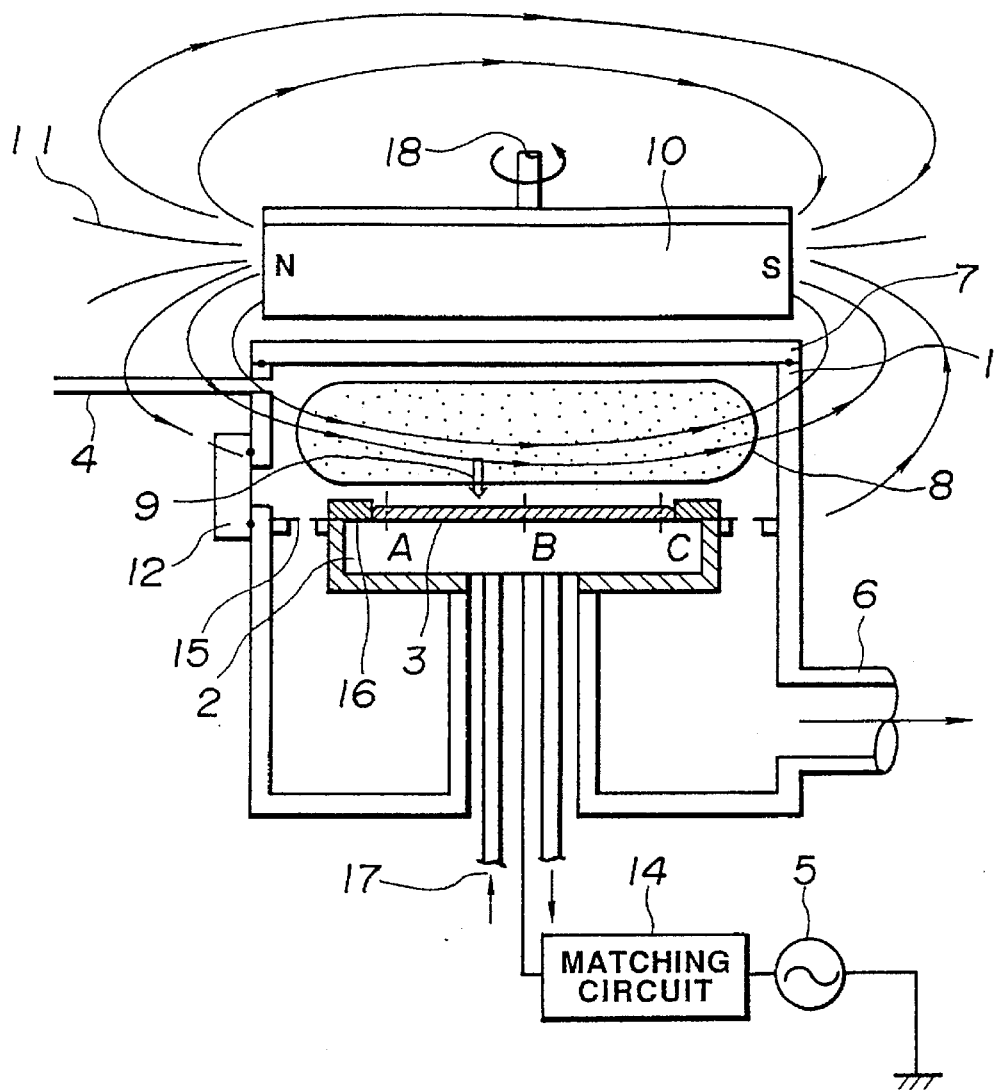
FIG. 57 shows a conventional magnetron etching apparatus.
Figure 58:
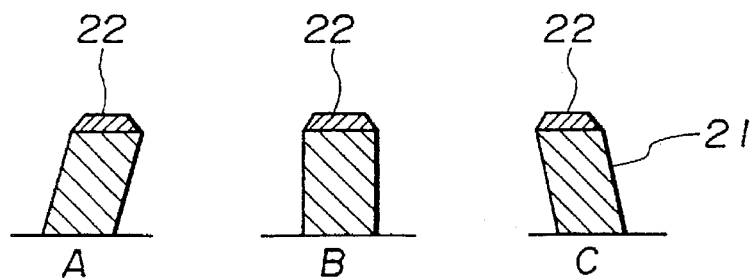
FIG. 58 shows the configuration of a wafer etched by the conventional magnetron etching apparatus.

Instead of providing the magnet above the vacuum container as in the conventional apparatus of FIG. 57, the dipole ring 13 is provided around the outer periphery of the sidewall of the container in the present invention. Thus, the back surface of the first electrode can be used for a monitor. A monitor 52 is provided above the vacuum container 1 for monitoring the state of a wafer surface such as etching depth through a quartz window 50 by using a laser detector 51.

The dipole ring 13 is movable in the vertical direction. A wafer is entered into or taken out from the vacuum container through a gate valve 12 by a load lock mechanism (not shown) and a carrying mechanism (not shown) after the dipole ring 13 is lifted to a position shown in the broken lines.

Alternatively, a mechanism for moving the second electrode 2 vertically may be provided and a gate valve 12 is disposed at a height corresponding to a position where the second electrode 2 is lowered so that a wafer is transferred into/out of the container by lowering the electrode to the position below the dipole ring. Conversely, a mechanism may be provided by which a wafer is transferred into/out of the container at a position where the electrode is lifted relative to the dipole ring.

In this embodiment, by the arrangement of the dipole ring magnets, a magnetic field having a remarkable uniform strength can be generated across the opposite electrodes which produce a plasma. The magnetic field thus generated has a very strong flux of, for example, up to several kilogausses. Thus, the plasma density is increased and hence processing rate and performance are improved. The uniform processing on the surface of a wafer is improved especially when the wafer has a large diameter. In addition, static break down of the MOS structure due to unevenness of the plasma is avoided. Since the magnet elements are arranged around the outer cylindrical periphery of the reactive container, the upper portion of the container (on the anode side) can be opened for maintenance. This is also effective for monitoring the process or applying radio frequency power to the anode. Even when it is constructed that the magnets and the wafer are rotatable relative to each other to provide further uniformity, it is not necessary to move the magnets in the event of maintenance as in the conventional apparatus in which the magnets are disposed on the anode side. Further, the magnets can be fixedly provided, for example, by means of a rail provided on the side of the reactive container. Thus, the handling of the apparatus is easy.

A method of etching a polycrystalline silicon film formed on a thin oxide film will be described by using the apparatus of this embodiment.

Figure 4A:
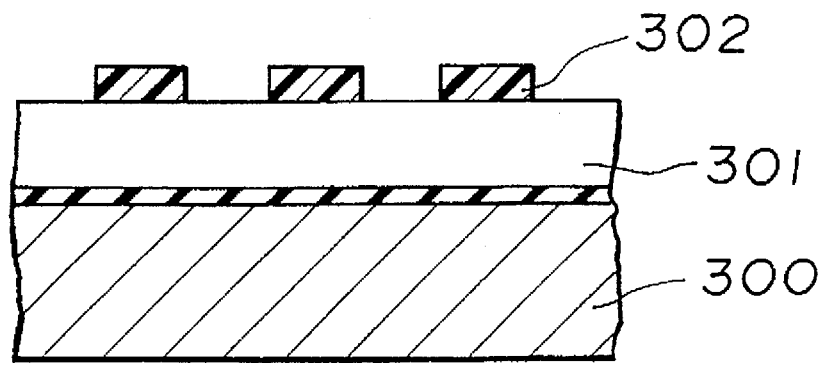
FIGS. 4(a) and 4(b) show the steps carried out in the etching process by the etching apparatus.

Referring to FIG. 4(a), a wafer is constructed by forming a 10-nm thick silicon oxide film and a polycrystalline silicon film 301 on a silicon substrate 300 and then forming a resist pattern 302 on the silicon film 301. The wafer is carried onto the second electrode 2 within the vacuum container 1 by a load lock mechanism and a carrying mechanism (both, not shown) after lifting the dipole ring 13. The wafer is then locked by a static chuck (not shown) and the temperature is controlled to be at −30° C.

The dipole ring 13 is returned to its original position and the vacuum container 1 is evaluated to about $10^{-6}$ Torr through the evacuating system 6. A chlorine gas is then introduced at a rate of 100 cc/min. from the feed system 4 into the container 1. A high frequency (rf) power of 250 W at 13.56 Mhz is applied across the first and second electrodes 7 and 2. The power density per a unit area of the cathode is 0.6 W/cm$^2$. The dipole ring 13 is then rotated at 200 rpm. The magnetic field strength at this time within she dipole ring 13 is 200 G. The gas is then evacuated by a vacuum pump (not shown) through a baffle (not shown) whose opening is covered with a metal mesh to prevent a wrap-around of the plasma, discharge system 6 and a conductance valve whose exhausting rate is adjustable with a variable opening percentage. The inner pressure of the chamber was set at 25 Mtorr by adjustment of the conductance valve.

In the monitoring of the etching process, light emitted from the plasma is checked through the quartz window 50, a change in the density of the chlorine atoms which is the etching species is monitored to detect the end of a heavily phosphorus-doped polycrystalline silicon layer. After predetermined over-etching which includes prolongation of 20–100% of the normal etching time to prevent the presence of unetched residues even if the etched film has a varying thickness, supply of the high frequency power and the etching gas is stopped, the gas remaining in the chamber is evacuated, and the wafer is then taken out of the chamber by the load lock mechanism.

Figure 4B:
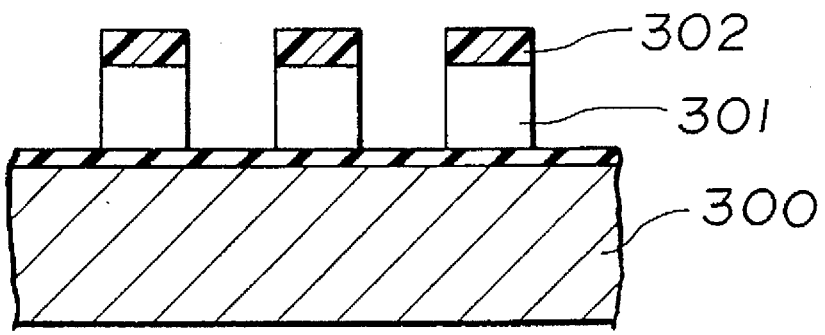

The etching rate at this time is 345 nm/min. The etch selectivity to the underlying silicon oxide film is 52, the etch selectivity to the photoresist is 7, and uniformity is ±3%. An etched configuration of the wafer having vertical cross section with high dimensional accuracy, as shown in FIG. 4(b) is obtained.

The etching process is performed without any dimensional conversion error. Since the plasma density is maintained very high, the ion energy is suppressed low, a high etch selectivity is obtained, and damage is reduced.

In this embodiment, the dipole ring is rotated. However, the same effects can be achieved by rotating the second electrode and the wafer.

Figure 5B:
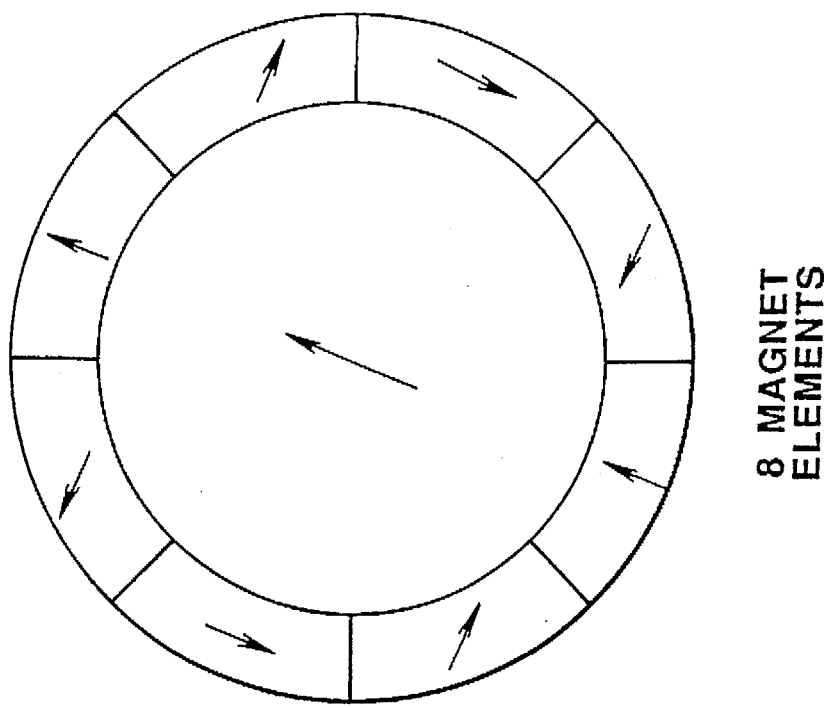
FIGS. 5(a) and 5(b) show a modification of the arrangement of the dipole ring.
Figure 5A:
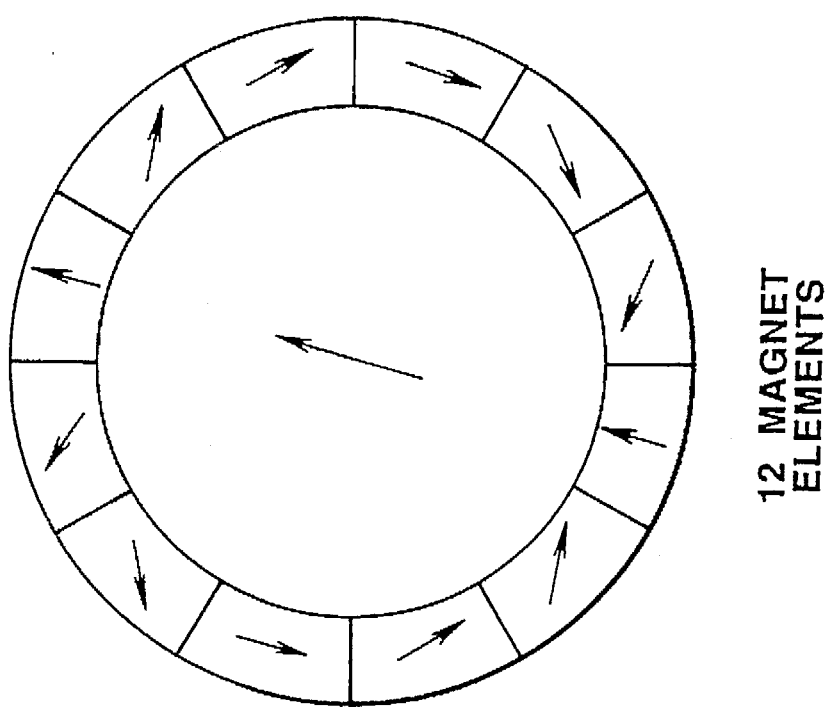

While in the embodiment the dipole ring 13 consists of 16 magnet elements, it may consist of 12 or 8 magnet elements, as shown in FIGS. 5(a) and 5(b), respectively.

For the etching of a silicon oxide film, a gas including, for example, fluorocarbon (CF) may be used. For directivity processing of a resist, a gas including oxygen as a main element may be used. For the etching of aluminum used for interconnection, a gas including chlorine as a main element may be used. For the etching of other materials, a gas including at least a reactive gas such as a halogen element or oxygen, hydrogen, nitrogen may be used.

The magnetic field strength is not limited to 200 gauss, but is selected depending on a material to be etched and a gas to be used. For example, when the magnetic field strength of 1,600 gauss is used for the etching of phosphorus-doped polycrystalline silicon, the etch selectivity to the underlying oxide film increases up to 74 while the etching rate is stand unchanged. Under such strong magnetic field, a pressure range in which the magnetron discharge acts effectively is extended to $5 \times 10^{-4}$ Torr through several hundreds of Mtorr while in the conventional apparatus the pressure range is about $8 \times 10^{-3}$ Torr through 100 Mtorr.

In the conventional apparatus it is recognized that as a gap between the electrodes is reduced to about 20 mm, the discharge efficiency is reduced. According to the present invention, under the magnetic field strength of 1,600 gauss, the gap between the electrodes can be reduced up to 8 mm so as to increase the flexibility of design for the etching apparatus structure which is usually restricted by the requirements of the flow of a gas, etc. In addition, the frequency of the electric power applied across the electrodes is not limited to 13.56 Mhz, but a relatively low frequency, for example, of about 100 Khz to 1 Mhz is effectively applicable for the etching of an oxide film which requires a relatively high ion energy depending on materials to be etched. For a material which requires to have a satisfactory etch selectivity to the mask or the underlying material, such as the phosphorus-enriched polycrystalline silicon or an aluminum alloy, it is effective to use a high frequency of about 20–100 Mhz and reduce the ion energy. In any case, in a combination of the magnetic field strength, the ion energy, plasma density and other plasma parameters can be controlled.

As described above, the present invention is not limited to the above embodiment and is applicable to various apparatuses.

A second embodiment of the present invention with a pair of upper and lower dipole rings will be described next.

Figure 6:
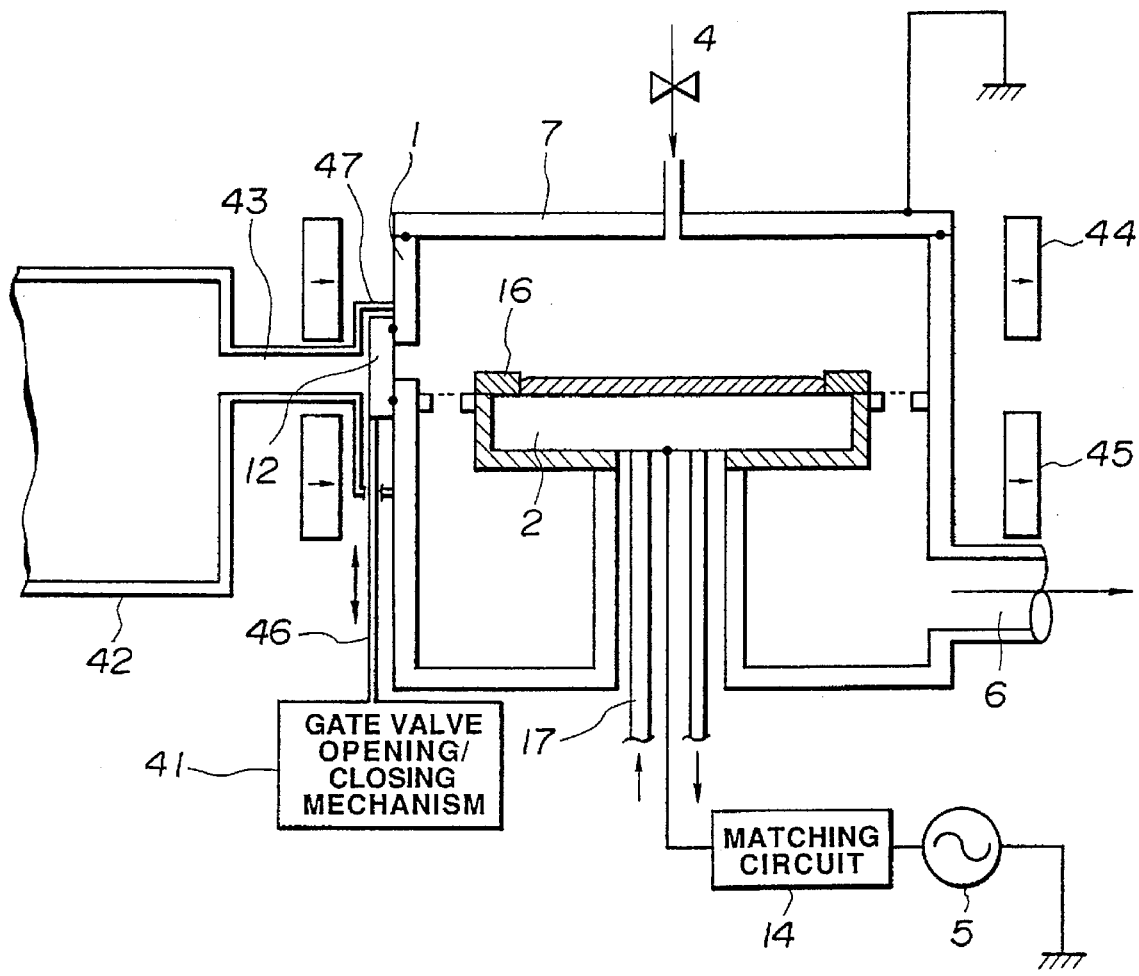
FIG. 6 shows an etching apparatus of the second embodiment of the present invention.

Referring to FIG. 6, the dipole ring comprises an upper dipole ring 44 and a lower dipole ring 45. A load lock chamber 42 communicates with a container 1 through a wafer carrying path 43 between the upper and lower dipole rings 44 and 45 and through a gate valve 12 which is opened/closed by a gate valve opening/closing mechanism 41. The wafer is moved into/out of the chamber through the load lock chamber 42, the wafer carrying path 43 and the gate valve 12. Reference numerals 46 and 47 denote a gate valve drive shaft and a vacuum seal, respectively.

The remaining elements of the apparatus are the same as the corresponding one of the first embodiment and the same reference numerals are used to denote the same elements in the first and second embodiments.

A method of etching to form a trench in a silicon substrate will be described using the apparatus of the second embodiment.

A Si substrate with the mask 302 of FIGS. 4(a) and 4(b) formed directly on the Si substrate is placed in the load lock chamber 42, which is then evacuated to about $10^{-6}$ Torr. The gate valve drive shaft 46 is lowered by the gate valve opening/closing mechanism 41 to open the gate valve 12. The substrate is then carried through the wafer path 43 onto the second electrode 2, and fixed thereon by an electrostatic chuck (not shown), and the temperature is controlled to be 20° C. The gate valve drive shaft 46 is then lifted by the gate valve opening/closing mechanism 41 to close the gate valve 12 and the container 1 is evacuated to $10^{-6}$ Torr through the evacuating system 6. Hbr gas is fed through the feed system 4 at the speed of 200 cc/min with the pressure being kept at $5 \times 10^{-3}$ Torr. A high frequency power of 800 W is then applied across the first and second electrodes 7 and 2. The dipole rings 44 and 45 are rotated synchronously at the speed of 120 rpm. At this time, the magnetic field strength within the dipole rings 44 and 45 is 1,600 G. With the etching rate of 850 nm/min, a trench having vertical side walls is formed in the Si substrate with high accuracy.

In the above-described manner, processing is performed with no dimensional conversion error. Since the plasma density is maintained at very high level, the ion energy and hence damage are suppressed to be low. It was found that the spacing between the upper and lower dipole rings contributes not only to the easiness for moving the wafer into the chamber but also to the uniformity of the magnetic field strength.

Figure 7:
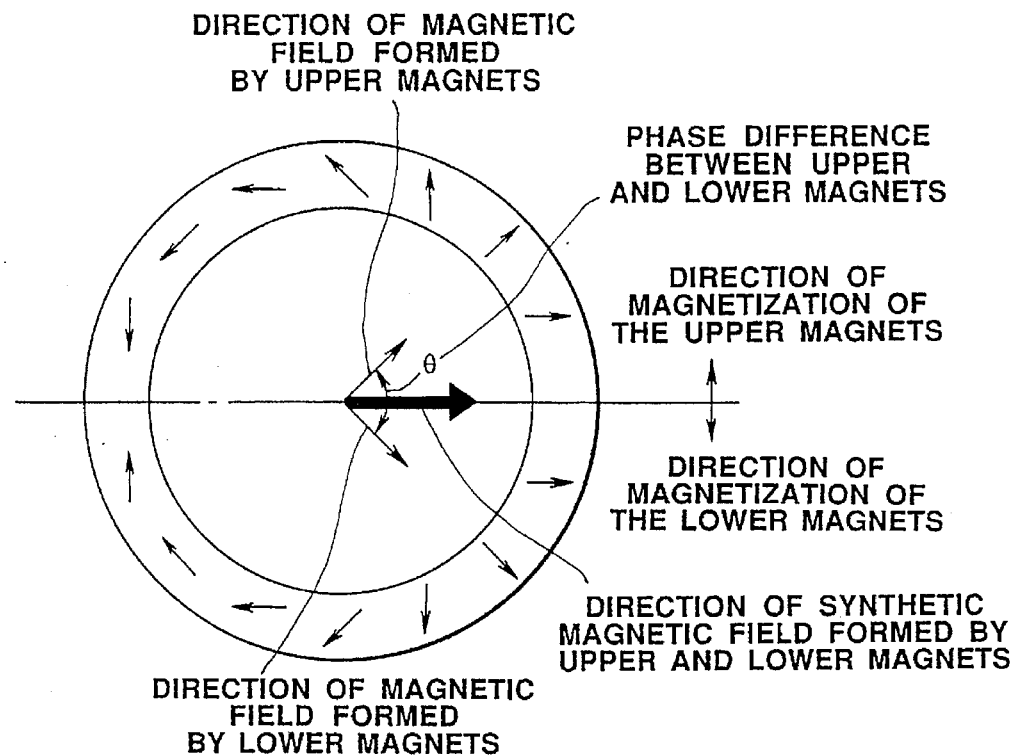
FIG. 7 shows the relationship between the phase difference between upper and lower dipole rings of the etching apparatus of the second embodiment and the synthetic magnetic field generated by the upper and lower dipole rings.

In the second embodiment, the upper and lower dipole rings which are magnetized in equal direction are rotated synchronously. However, a phase difference may be provided between the upper and lower dipole rings such that the synthesis of the upper and lower magnetic fields results in a given direction of magnetic field, as shown in FIG. 7.

Figure 8:
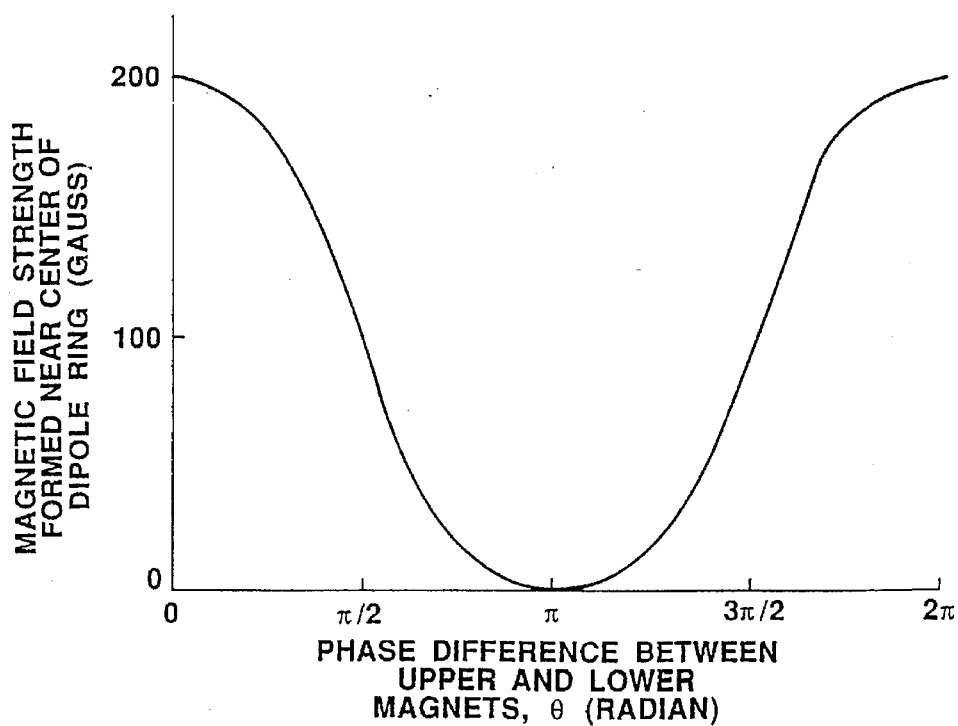
FIG. 8 shows the relationship between the phase difference between the upper and lower dipole rings of the second embodiment and the synthetic magnetic field generated by the upper and lower dipole rings.

FIG. 8 shows the relationship between the magnetic field strength and the phase difference between the magnetized directions of the upper and lower dipole rings. By providing an appropriate phase difference between the upper and lower dipole rings, the magnetic field strength can be adjusted to a desired value. A required magnetic field strength varies depending on a process to be performed. By controlling the phase difference by a pair of magnets, any required magnetic field can be generated.

Figure 9A:
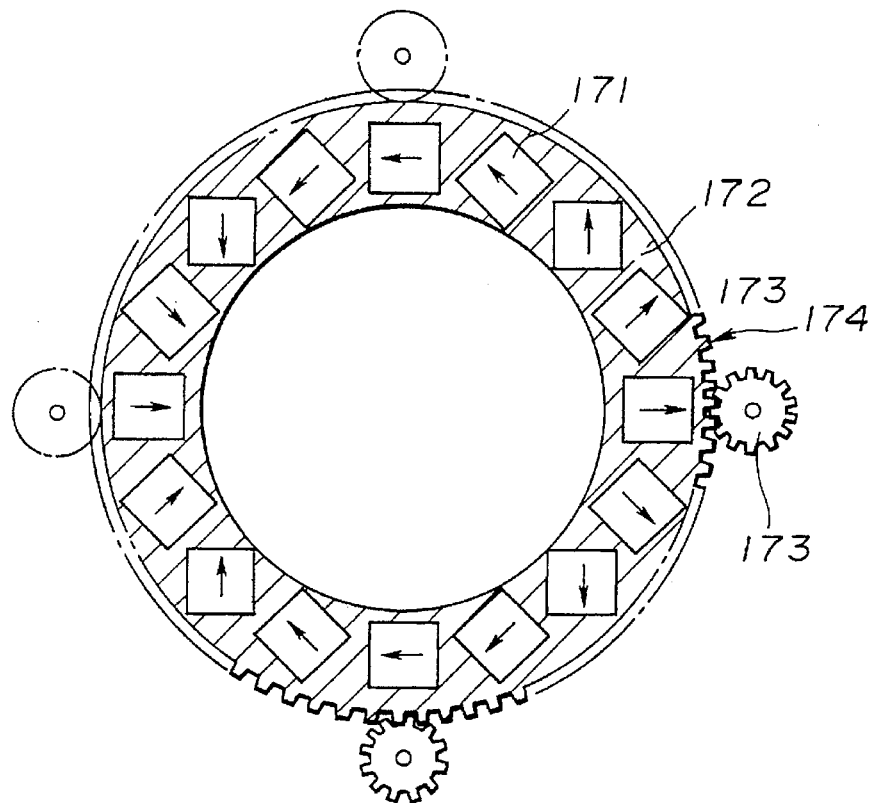
FIGS. 9(a) and 9(b) show a rotation drive mechanism for the upper and lower dipole rings.
Figure 9B:
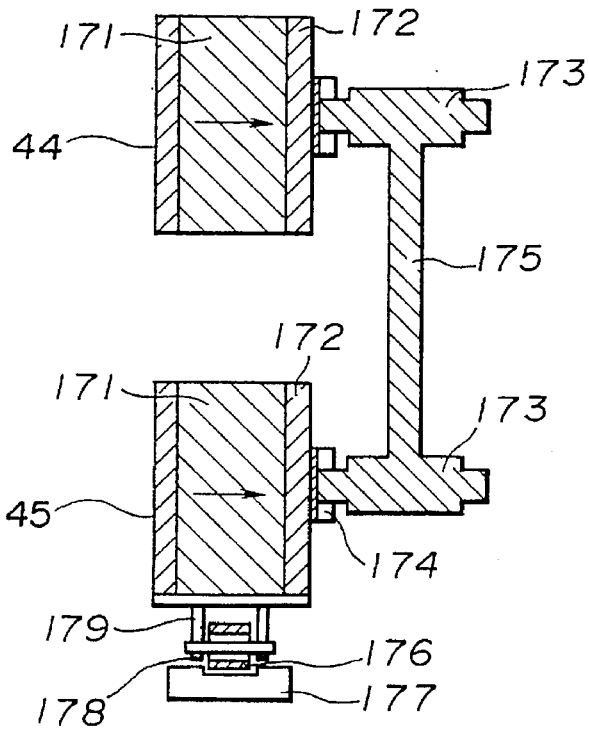
Figure 10:
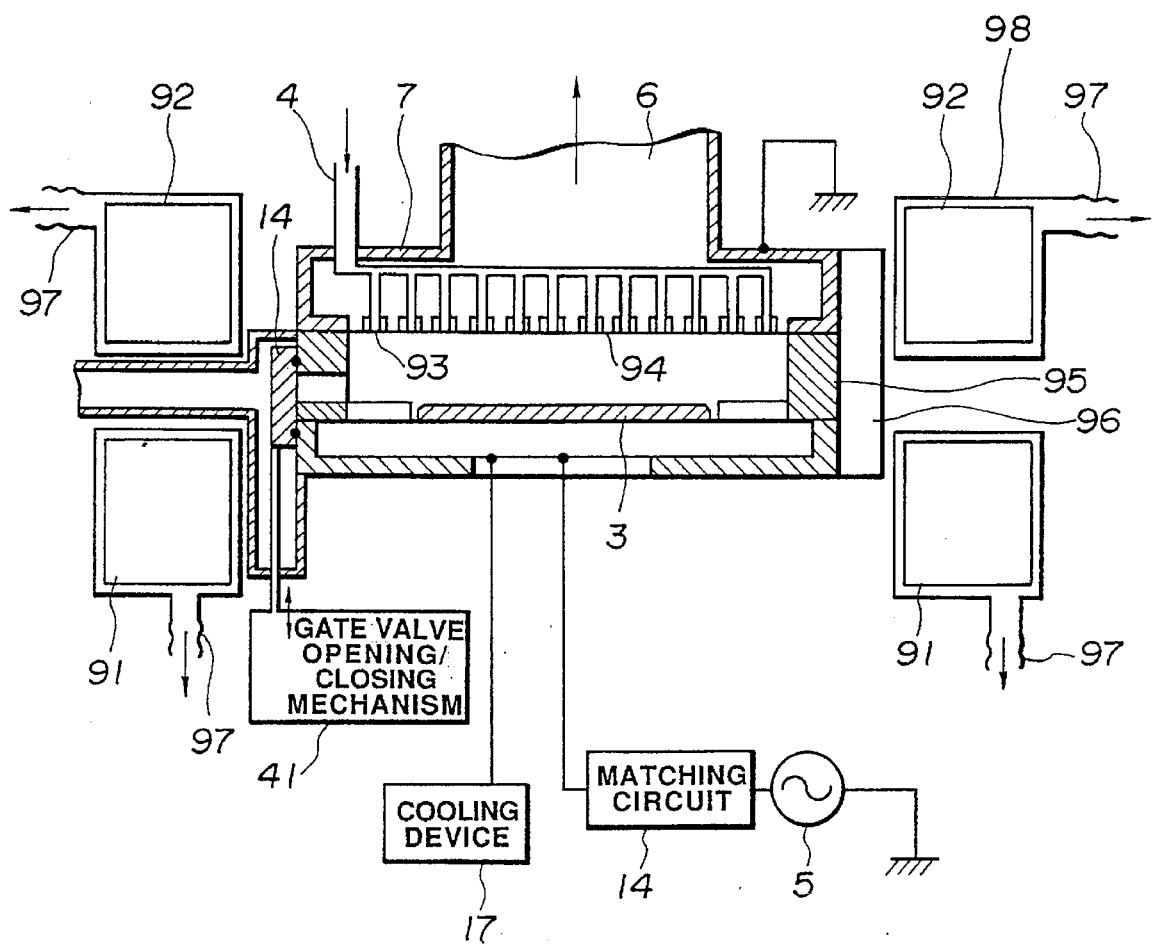
FIG. 10 shows an etching apparatus of the third embodiment of the present invention.

FIGS. 9(a) and 9(b) show a ring rotating mechanism provided between the upper and lower dipole rings 44 and 45 for controlling the rotation of these rings. Each of the rings 44 and 45 is provided with gears 74 spaced along the outer periphery of a yoke 72 for fixing the magnets 71. The upper and lower dipole rings 44 and 45 (FIG. 6) are rotated with a gear 74 which is engaged with both the gears 73 of the upper and lower dipole rings. Each magnet takes the form of a square pillar. The gears 73 are provided at several positions along the periphery of the yoke depending on the size and weight of the magnets. FIG. 9(b) shows a cross-sectional view of the apparatus. The gear 73 is rotated with a shaft 75 by a drive mechanism (not shown) and the torque is transmitted to the dipole rings via the gear 73. The dipole rings are rotated along a rail 77 with a reduced friction by means of wheels 76 attached to a bearing 79. The rail 77 is provided in the form of a ring below the dipole rings and connected to the vacuum container 1 through an upper/lower drive mechanism 96 (FIG. 10). With this arrangement, high speed rotation of the dipole rings is possible. It is to be noted that small parts such as bearings are omitted in the drawings of this embodiment. The upper dipole ring 44 may be suspended from above instead of being supported by the rail from below. Since the upper and lower dipole rings 44 and 45 exert a complicated force on each other, the gears which drive the upper and lower rings may be fixed to a single shaft 75 to achieve complete synchronous rotation.

By changing the engaging position of the gears or by providing removable coaxial gears, the rotational speed or relative phase of the upper and lower rings can be changed. By adjusting the relative phases of magnets of the upper and lower rings, the magnetic field strength can easily be adjusted without replacement of the magnets with different magnets. Further, by rotating the upper and lower dipole rings in opposite directions with the same rotational axis, an alternate magnetic field can be generated without replacing the magnets.

Alternatively, it may be designed such that each magnet element has its own motor, and under electric control, each magnet element may be synchronously rotated with each other or asynchronously rotated with each other so that not only the magnetic field is rotated but also an alternate magnetic field is generated. Further, the alternate magnetic field can be rotated and the strength and distribution of the magnetic field can be changed.

When the magnetic field is rotated at a high speed, the strength of the magnetic field may be reduced by eddy currents generated by traversing the magnetic field through a conductor. Therefore, An apparatus in which a strong magnetic field is rotated at a high speed, a vacuum container should be made of a high resistance material or an insulating material. In addition, by making a part or all of the first or second electrode using a paramagnetic material, the magnetic flux becomes easy to pass therethrough. As a result, the magnetic field can be corrected at a place such as the periphery of the electrodes where the magnetic field is likely to be distorted.

A third embodiment of the present invention will now be described in which an apparatus has a magnet assembly containing a built-in high speed rotational mechanism and an upper/lower mechanism for the magnet assembly.

Referring to FIG. 10, lower and upper dipole ring assemblies 91 and 92 rotatable at a high speed are provided along the outer peripheral surface of a vacuum container 1 through a vertical position and spacing adjusting mechanism 96. The dipole ring assemblies 91 and 92 are respectively accommodated in housings 98 provided with a duct hose 97 to prevent dust or particles from being discharged the outside of the assemblies during the rotation. Provided in the upper portion of the vacuum container 1 are gas emission nozzles 93 and gas discharge holes 94. The gas discharge through the gas discharge nozzles 94 is evacuated upward through an evacuating system 6. The remaining structure is similar to the corresponding one of the second embodiment.

In a fourth embodiment of the present invention, magnet elements which constitute the magnetic field generating means are disposed such that the magnetized direction of each magnet element deviates from each other by a predetermined phase. Each magnet element is independently rotated to thereby form a magnetic field equivalent to that which would be generated by the rotation of the overall magnet assembly.

Figure 11A:
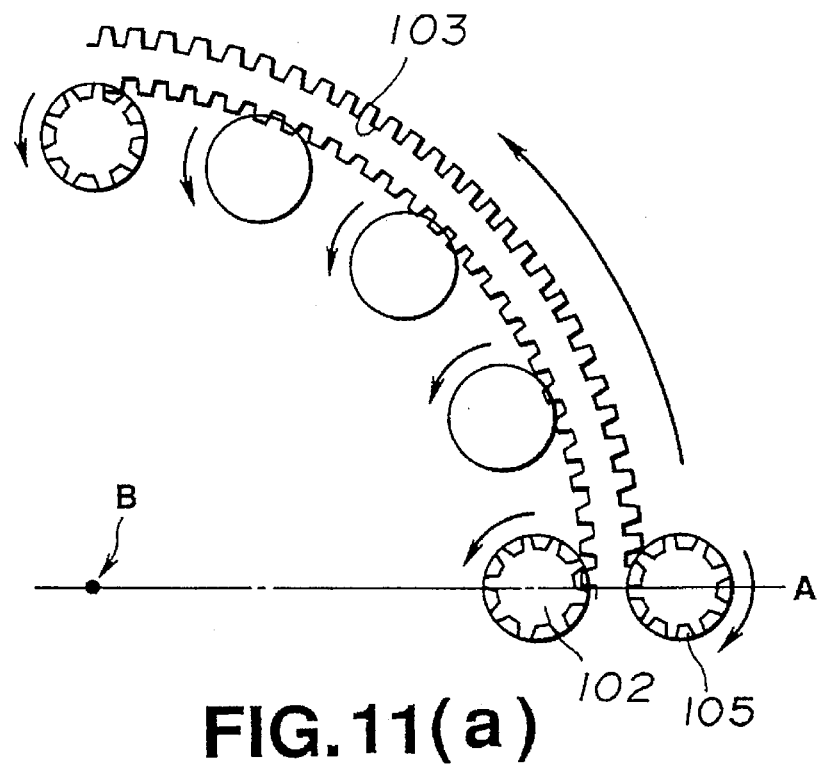
FIGS. 11(a) and 11(b) show a rotation drive mechanism for magnet elements of an etching apparatus in the fourth embodiment of the present invention.
Figure 11B:
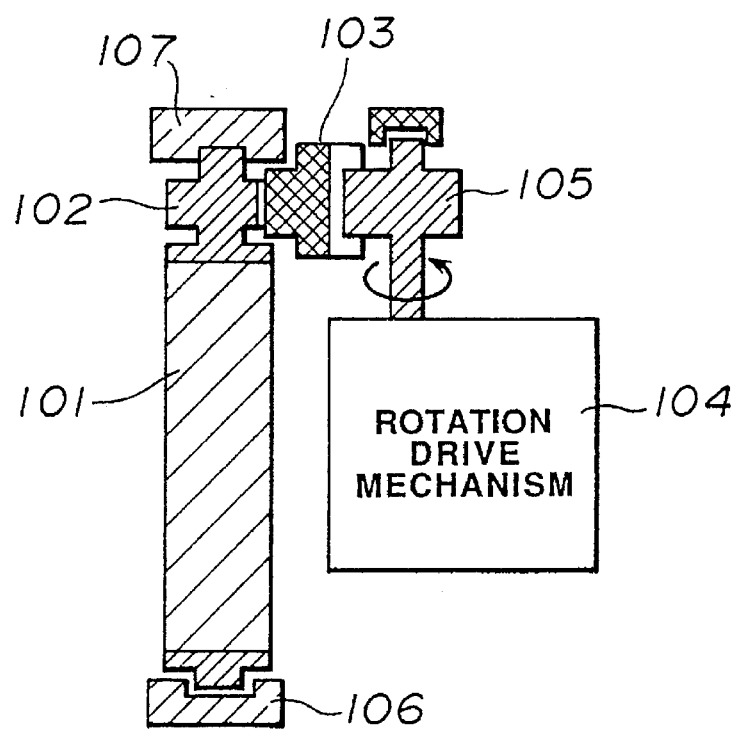

Referring to FIG. 11, a ring 103 has teeth on the inner and outer peripheral surfaces thereof. Sixteen small gears 102 are provided such as to engage with the inner surface teeth of the ring 103. Cylindrical magnet elements 101 are attached to respective lower faces of the gears 102. A gear 105 engaged with the teeth of the outer peripheral surface of the ring 103 is connected to a rotation drive mechanism 104. Reference numerals 106 and 107 denote a pedestal and a bearing, respectively.

In this embodiment, the rotation drive mechanism 104 rotates the ring 103 around a center B. As a result, the individual magnet elements 101 and hence the resulting synthetic magnetic field rotate. By clockwise rotation of a drive motor (not shown) in the rotation drive mechanism 104, the ring 103 and the magnet elements 101 rotate counterclockwise. As a result, the synthetic magnetic field 108 rotates clockwise.

With the rotation drive mechanism 104, it is possible to rotate the synthetic magnetic field by individually rotating each of the magnet elements on its own axis without changing the respective positions of the magnet elements.

Figure 12A:
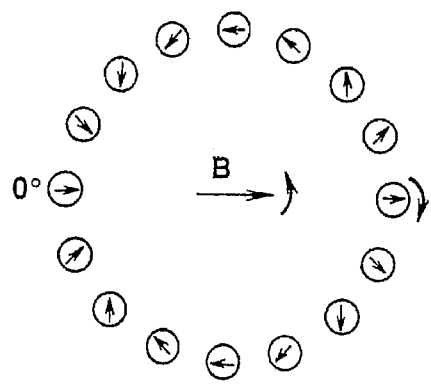
FIGS. 12(a) through 12(e) show the rotation and magnetic field direction of magnet elements in the fourth embodiment.
Figure 12D:
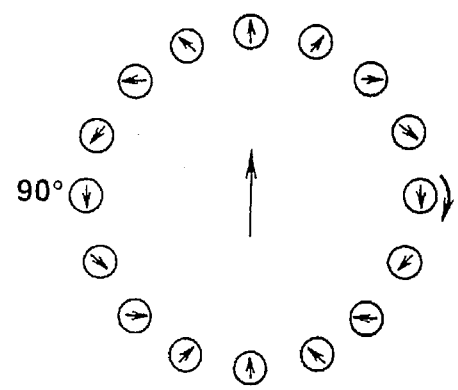
Figure 12B:
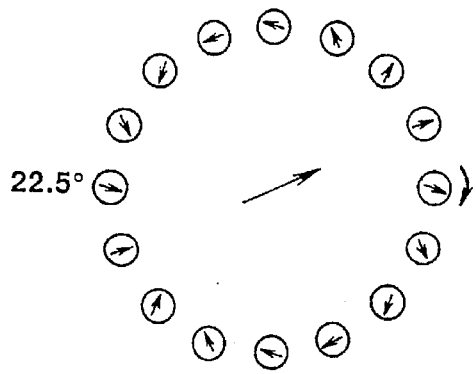
Figure 12E:
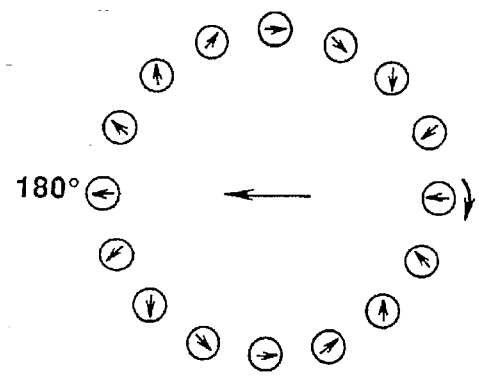
Figure 12C:
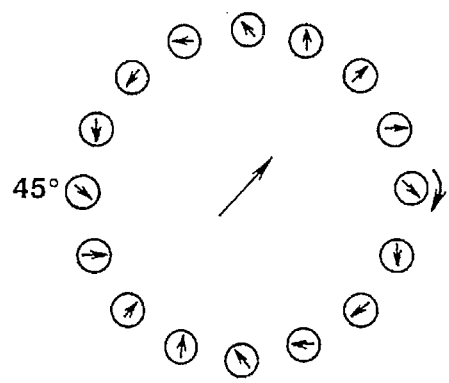

FIG. 12(a) illustrates an arrangement of the magnet elements in which the magnetized directions of the magnet elements are the same in those of FIG. 2 although the shape of the magnet elements is different. It will be seen from FIGS. 12(b) through 12(e) that as the individual magnet elements are rotated clockwise at the same speed, the synthetic magnetic field rotates counterclockwise, and that the rotational angle of the magnet elements and that of the synthetic magnetic field coincide with each other. With this arrangement, the same effect is obtained as that which would be obtained by the rotation of large dipole ring, without actually rotating the large dipole ring.

A sputtering apparatus as a fifth embodiment of the present invention will be described next.

Figure 13:
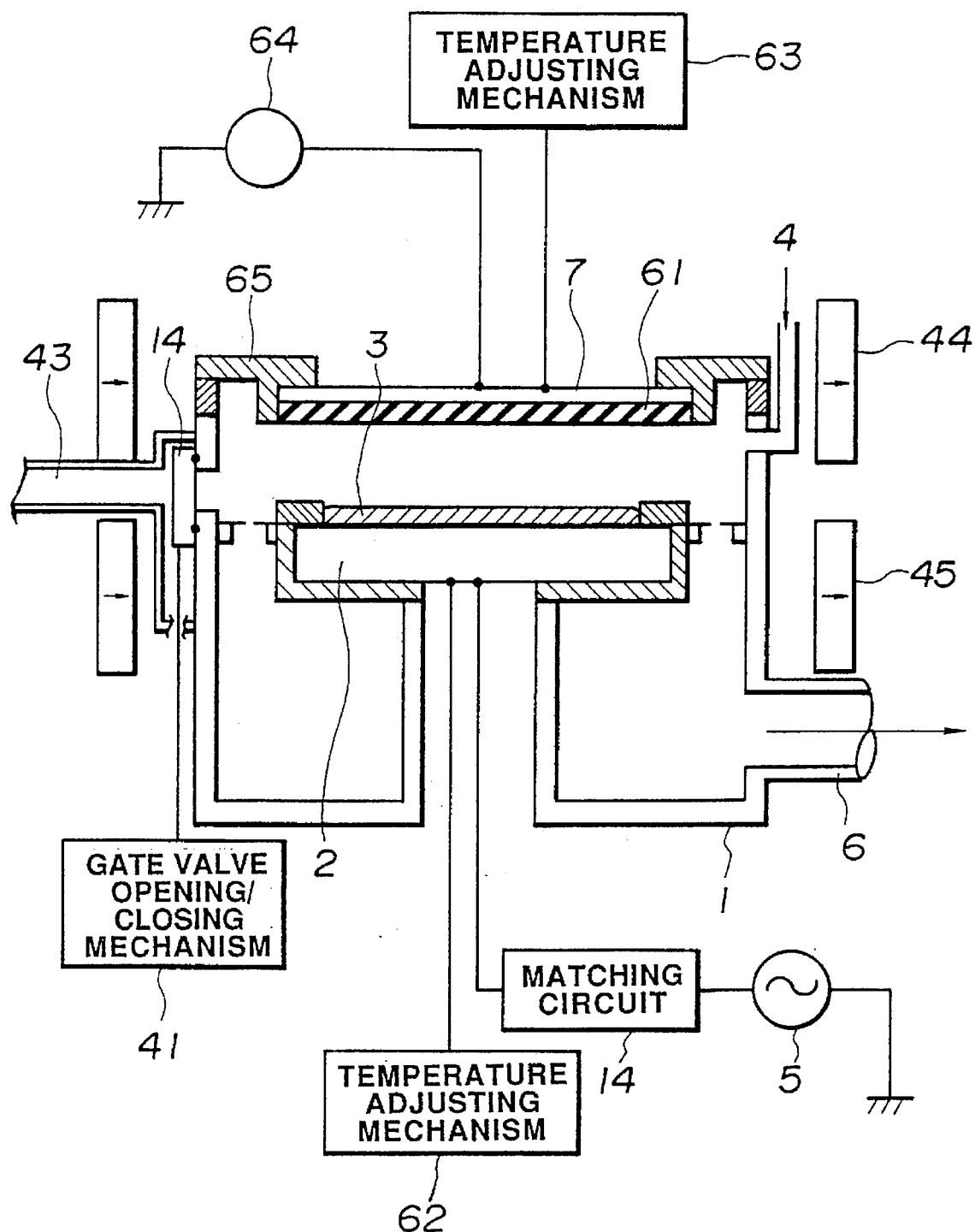
FIG. 13 shows a sputtering apparatus according to the fifth embodiment of the present invention.

Referring to FIG. 13, the sputtering apparatus comprises a target plate 61 attached to a first electrode 7 which is, in turn, attached to an upper wall of a container 1 and a second electrode 2 disposed opposite to the target 61. The second electrode 2 also serves as a support of a substrate. A direct current power source 64 applies a DC voltage to the target plate 61 while a high frequency source 5 supplies a high frequency electric power to the second electrode 2 via a matching circuit 14 to generate an electric field in a region therebetween. In this region, a magnetic field is generated perpendicular to the electric field by upper and lower dipole rings 44 and 45 disposed outside the vacuum container 1. Gas is supplied into that region from a gas feed system 4, and a plasma is generated by electric discharge. Ions in the plasma impinge on the target plate 61 and sputtering particles from the target plate 61 are guided to a wafer 3 on the second electrode 2 in such a manner that the particles moves vertically to the wafer 3. The distance between the target plate 61 and the second electrode 2 is selected to be 3 cm.

The dipole rings 44 and 45 are similar in structure to those of the second embodiment of FIG. 6. The magnetic field generated by the dipole rings 44 and 45 is parallel to the surface of the target 61. The interaction E×B of the magnetic field and the electric field formed on the surface of the target plate serves to maintain the magnetron discharge. The electrons in the plasma produced by the magnetron discharge are drifted to improve the ionizing efficiency to thereby generate a high density plasma even under a relatively low pressure.

A temperature adjusting mechanism 62 for controlling the temperature of the substrate may comprises a heater embedded in the second electrode 2.

The upper vacuum container wall is insulated from the lower portion of the container wall by an insulator 65 disposed between the upper and lower portion of the container wall in the vicinity of the first electrode 7. Reference numerals 6 and 63 denote an evacuating system and a temperature adjusting mechanism for cooling the target plate 61, respectively.

The transfer of a wafer into/out of the vacuum container 1 is made by a load lock mechanisms (not shown) and a carrying mechanism (not shown).

A method of forming a film using this apparatus will be described below.

Figure 14A:
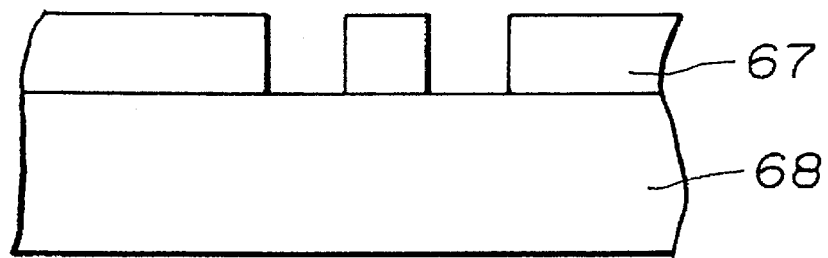
FIGS. 14(a) through 14(c) show the sputtering steps carried out in the fifth embodiment of the present invention.

Referring to FIG. 14(a), a wafer comprises a silicon substrate 68 with a pattern 67 being formed on the surface thereof. The wafer is carried onto the second electrode 2 within the vacuum container 1 by the load lock mechanism and conveyance mechanism (both not shown), fixed by a electrostatic chuck (not shown), and controlled so as to be at a desired temperature of 250° C.

The container 1 is then evacuated by the evacuating system 6. Argon gas is then fed at a flow rate of 100 cc/m into the container 1 through the feed system 4 until the pressure in the container 1 becomes $10^{-3}$ Torr. In order to eliminate pollutant such as an oxide film and a hydrocarbon on electrodes of the wafer surface, a high frequency power is applied to the second electrode 2 to generate a plasma and to clean the wafer surface before the sputtering process. A large power is then applied to the target to sputter an aluminum alloy. That is, a direct current power (400 V, 3.5 A) is applied to the target plate 61 (first electrode 7) and a high frequency power is applied to the second electrode 2 to thereby discharge the argon gas to form a plasma. Electrons are confined by the magnetic field a region between the electrodes. As a result, the lifetime of electrons and the travel distance of the electrons are increased. Thus, the frequency of the electron collision with molecules and atoms increase and hence the ionizing efficiency increase to thereby form a plasma of high density even under a low gas pressure. The rotational speed of the magnetic field is 200 rpm in the present embodiment for the same reason as in the embodiment directed to the etching process.

Drop in the cathode voltage (Vdc) occurs on the surface of the target plate 61, which is irradiated with argon ions in the plasma, so that particles of the target plate 61 material or deposited material, for example aluminum, are discharged into the plasma to be sputtered against the wafer. Incidentally, since the cathode voltage (Vdc) has a negative value, when the drop in the cathode voltage occurs, the absolute value of the cathode voltage increases.

Figure 14B:
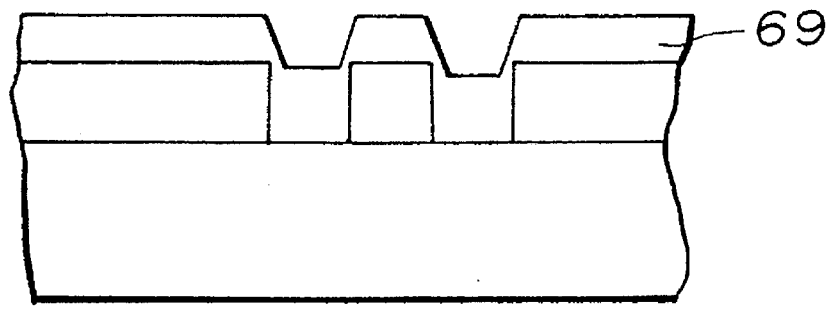

Since the high frequency power applied to the second electrode 2 generates a biasing voltage to the Substrate and deposition and sputtering of the aluminum occur simultaneously on the surface of the substrate, the aluminum particles are guided efficiently into the bottom of grooves as shown in FIG. 14(b). In the apparatus of this embodiment, a strong magnetic field completely parallel to the substrate surface is generated and the target is decreased uniformly. Thus, a good uniform film is formed over the overall wafer surface without producing "voids" within the film. Depositing rate is 1.7 μm/min. and a film uniformity of ±3% is achieved.

In the conventional apparatus, when there is a local high density plasma region, a part of the target plate is subjected to high speed sputtering. Therefore, lifetime of the target plate is shortened, and the resulting film is not uniform and the shape of the film varies from position to position in the wafer. In contrast, according to this embodiment, the region where a high density plasma is formed covers the overall target plate. Since the target can be uniformly sputtered, the performance is improved and damage is reduced.

Figure 14C:
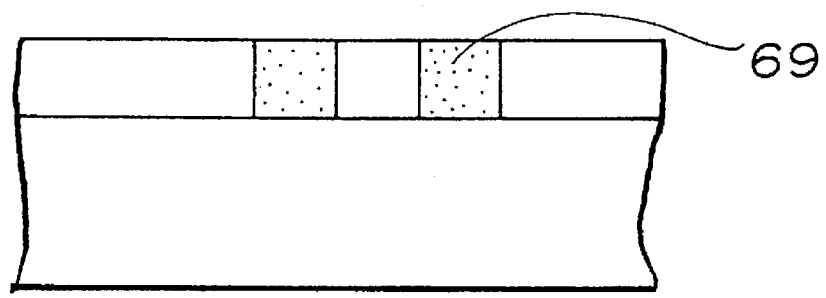

By performing etch-back as shown in FIG. 14(c), embedded layers 69 with a good film quality are formed even in fine grooves.

As described above, a high density plasma is generated even under a relatively low pressure of about $10^{-3}$ Torr so that contamination into the film is greatly reduced to thereby improve the film quality. In addition, the depositing rate is increased. Under a low pressure, the mean free path of the particles increases, which improves the directivity of moving deposited chemical species.

In addition of the formation and etching of a thin aluminum film, this apparatus is applicable to the formation and etching of various thin films such as a high melting point thin film, for example, of tungsten or molybdenum, and an insulating film, for example, of aluminum oxide, tantalum pentoxide, aluminum nitride, silicon oxide or silicon nitride.

The structure and materials of the apparatus are not limited to those of this embodiment and are modifiable when required without departing from the spirit and scope of the present invention.

A cold-wall type plasma CVD apparatus as a sixth embodiment of the present invention will next be described.

Figure 15:
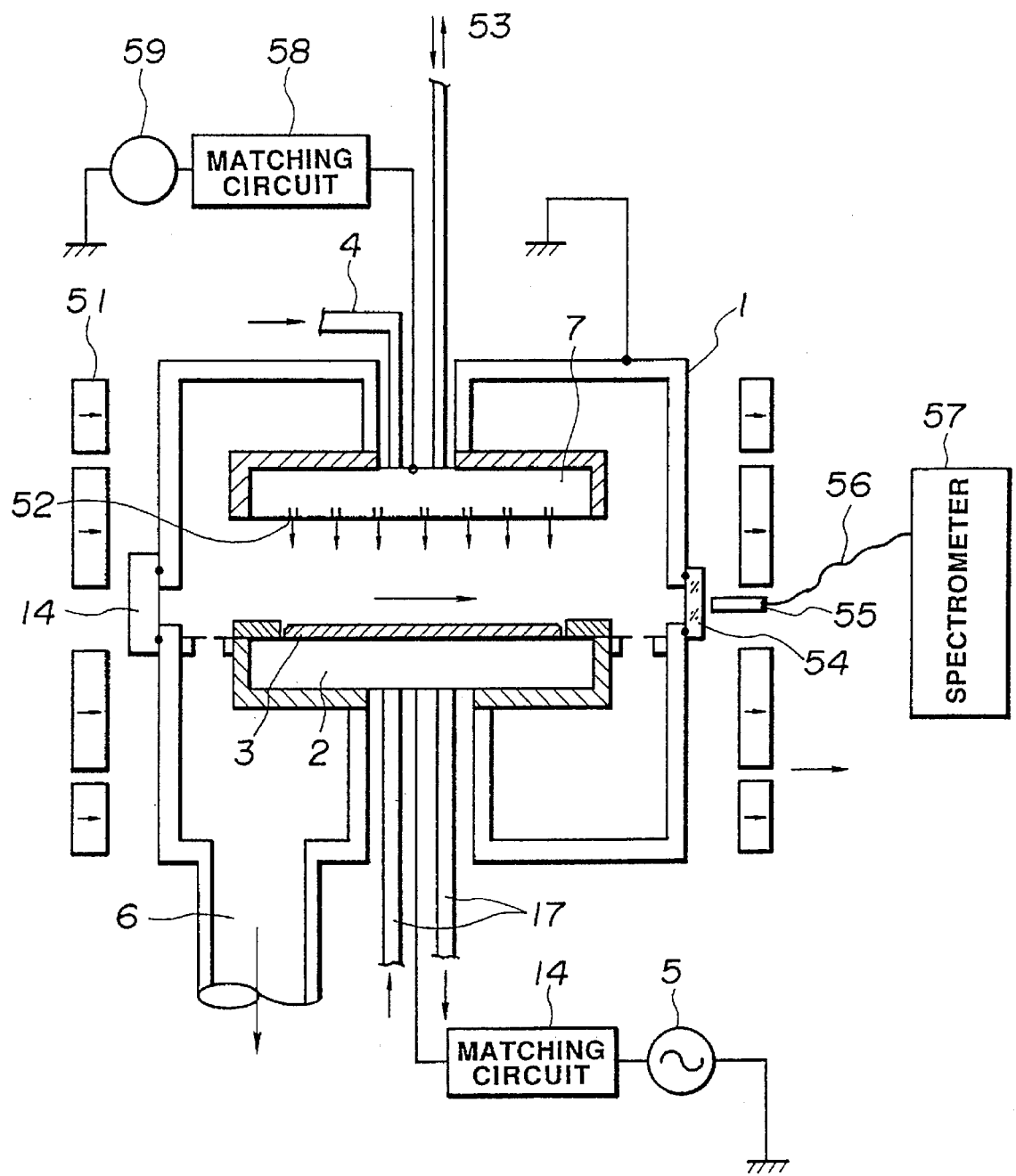
FIG. 15 shows a CVD apparatus according to the sixth embodiment of the present invention.

Referring to FIG. 15, the CVD apparatus is characterized by a multiple-dipole ring assembly 51 consisting of first through fourth dipole rings disposed around the outer periphery of the container 1.

The apparatus comprises a first electrode 7 disposed upper portion of the container 1 and a second electrode 2 disposed opposite to the first electrode 7. The second electrode 2 also serves as a support of a substrate. Gas is fed toward a wafer 3 on the second electrode 2 through a gas inlet 4 provided in the vicinity of the first electrode 7. A high frequency electric power produced by a high frequency source 5 is applied across the first and second electrodes 7 and 2 through a matching circuit 14 to produce a self-biasing electric field in a region between the first and second electrodes 7 and 2. In this region, a magnetic field is generated by the multi-dipole ring assembly 51 disposed around the vacuum container 1. The magnetic field is perpendicular to the electric field and parallel to the surface of the wafer 3. A high density plasma is formed in that region. Ions in the plasma is accelerated by the self-biasing electric field induced on the wafer surface and impinge on the wafer to proceed the formation of a thin film.

Disposed above the container 1 are a temperature adjusting mechanism 53 which adjusts the temperature of the first electrode 7, and a power source 59 connected through a matching circuit 58 to the first electrode 7. Reference numerals 54, 55, 56 and 57 denote a quartz window, optical detector, optical fibre, and a spectrometer which disperses light from a plasma and examines the gaseous phase.

The formation of a thin film using this apparatus will be described next.

Depositing gas of $SiH_4$ (200 cc/min.) and $O_2$ (200 cc/min.) are fed into the container 1, and electric discharge is conducted under a pressure of $8 \times 10^{-4}$ Torr to form a thin $SiO_2$ film. The wafer is carried in the same manner as in the above embodiments. The load lock mechanism is not shown. The first electrode is provided separately from the container 1 and connected to the separate power source 59. The gas is fed uniformly against a wafer from gas introducing nozzles 52 through the inside of the first electrode. The basic sequence of operations is similar to that in the above apparatuses.

The process is characterized as follows. Depositing seeds formed in the plasma are deposited like snow piles and adsorbed on a surface of the wafer. Reaction is advanced by the impact of ions which are accelerated by the biasing voltage induced by a high frequency power from the power source 5. With the process, a film with reduced impurities and a small refractive index and close to a thermal oxide film is finally formed. In this embodiment, a very high magnetic field of 2000 gauss is applied. The high frequency power is 1.2 Kw and the depositing rate is 0.3 μm/min.

When the value of the magnetic field strength is very high as in this embodiment, the difference between the higher and lower magnetic field strengths becomes large even if highly uniform magnets are used. In order to cope with such situation, a 4-divided type dipole ring assembly is used in the present embodiment. This magnet assembly can finely adjust the magnetic field strength and distribution by adjusting the position of the uppermost or lowermost magnet. When the apparatus becomes large as the wafer has a large diameter, the distance between the central portion of the electrode and the container wall differs greatly from the distance between the peripheral portion of the electrode and the container wall, so that the plasma characteristics differ. The uniformity of the plasma can be improved by intentional disturbance of the magnetic field in the peripheral portions of the first and second electrodes while the magnetic field strength in the vicinity of the wafer is maintained. The multi-magnet arrangement of this embodiment has such applications.

As described above, by carrying the present invention in the CVD apparatus, improvement to the film forming rate and magnetic strength uniformity, and reduction in damage are achieved to form a high density plasma. Since decomposition and reaction of the gas advances in the gas phase, improvement in the quality of the film such as reduction in the mixed impurities and improvement in the density was recognized.

As a seventh embodiment of the present invention, a hot wall type plasma CVD apparatus will be described next.

Figure 16:
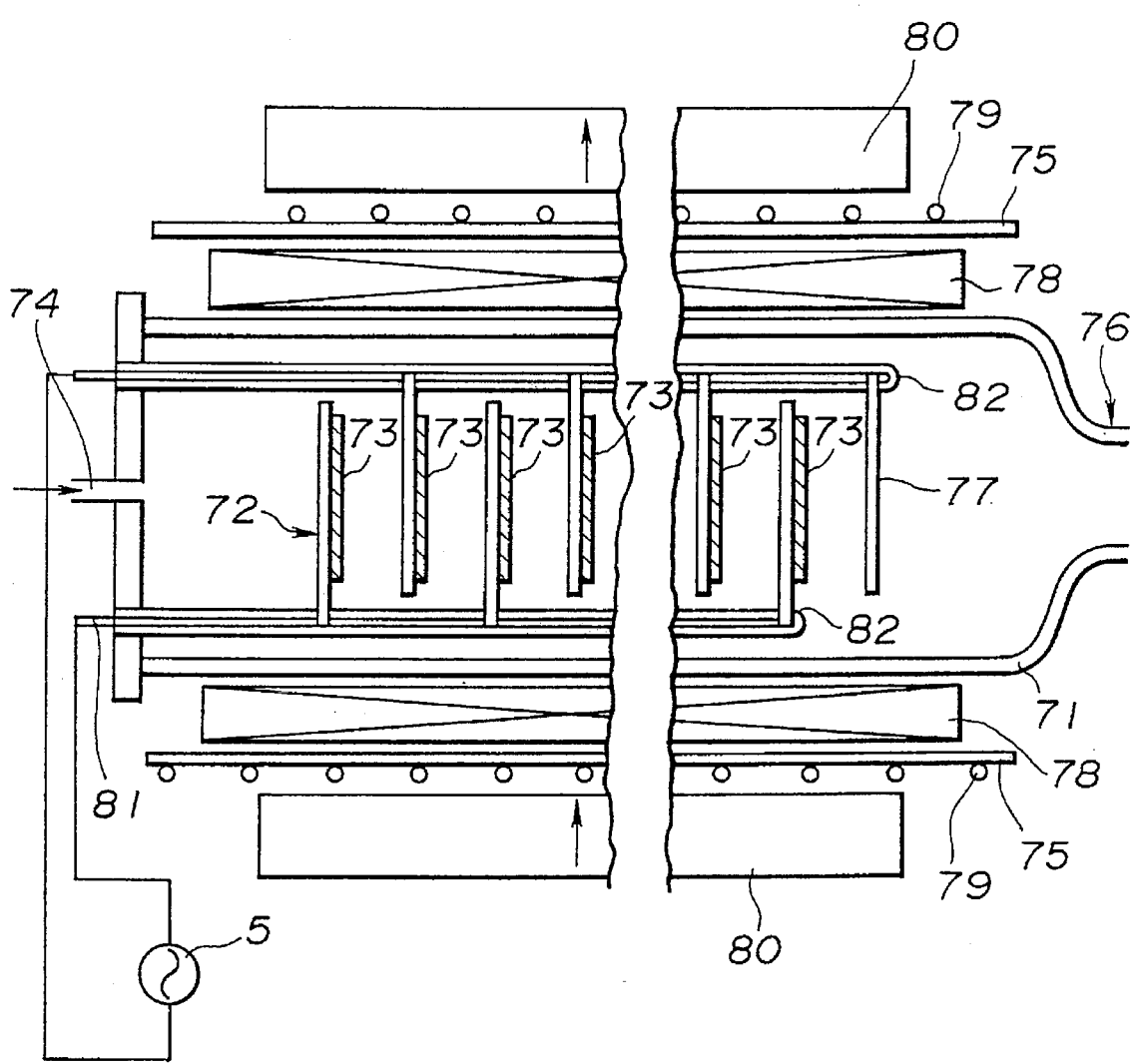
FIG. 16 shows a CVD apparatus according to the seventh embodiment of the present invention.

Referring to FIG. 16, the CVD apparatus is characterized by a cylindrical heater 78, a cooling cylinder 75 and a cooling pipe 79 provided on the outer periphery of a vacuum container 71 made of a quartz pipe, and a dipole ring 80 provided around the outer periphery of the cooling pipe 79. Generally, the magnetic materials have a Curie point of several hundreds of °C. The coercive force of many of these magnetic materials tend to decrease from about 100° C. and a rise in temperature would cause a deterioration in the characteristic. To avoid such situation, cooling means is provided in apparatuses where heat is generated, for example, in a CVD apparatus or an etching apparatus where the chamber is heated.

The gas inlet and outlet 74 and 76 are provided at opposite ends of the vacuum container such that wafers 73 are disposed perpendicular to the flow of the gas through the inlet and outlet. Reference numeral 72 denotes first electrodes supported by an electrode support 82. Reference numeral 77 denotes second electrodes supported by an electrode support 82 opposite to the first electrodes. Reference numeral 5 denotes a power source.

A process for making a MOSFET using the FIG. 1 etching apparatus as an eighth embodiment of the present invention will be described next.

Figure 17A:
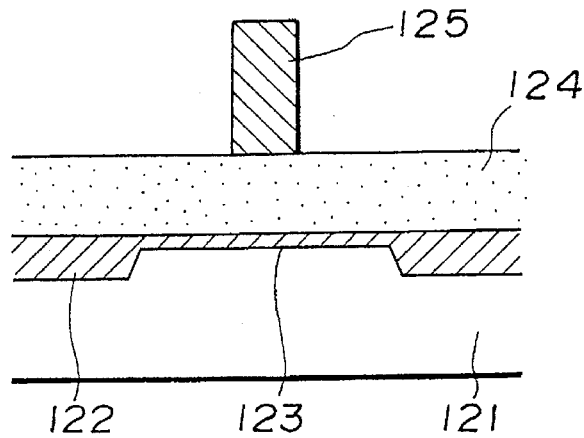
FIGS. 17(a) through 17(c) show the steps of making a MOSFET according to the eighth embodiment of the present invention.

As shown in FIG. 17(a), element isolating areas 122 and then a gate isolating film 123 were formed on a surface of a silicon substrate 121. An $n^+$ polycrystalline silicon film 124 was then formed by CVD. A resist pattern 125 was then formed on the film 124.

Figure 17B:
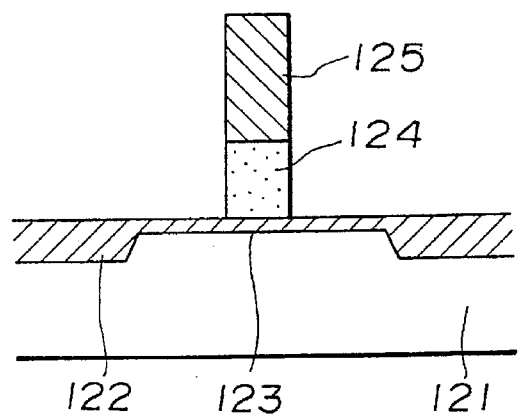
Figure 17C:
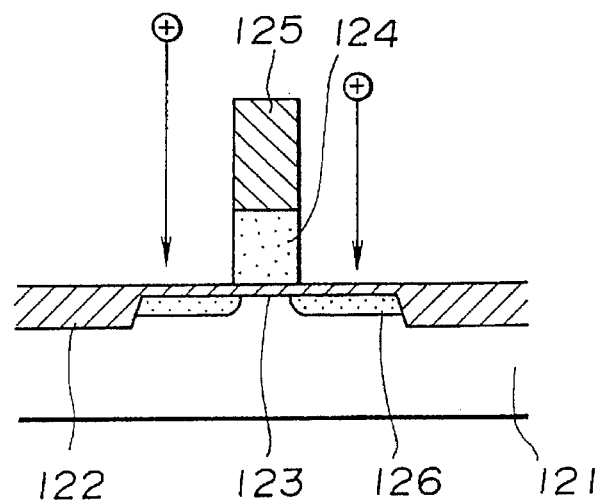

Thereafter, this silicon substrate was set in the etching apparatus of FIG. 1. As shown in FIG. 17(b), the $n^+$ polycrystalline silicon film 124 was subjected to anisotropic etching with the resist pattern 125 as a mask. The etching gas used was a mixed gas of $Cl_2+H_2$; the pressure was 30 Mtorr; and the applied power was 200 W. By the use of this apparatus, the wafer surface was exposed to plasma, so that it bore electric charges. If the voltage (electric charges) due to the electric charges is uniform through the wafer surface, no high voltage is applied across the thickness of the gate oxide film. Thus, gate break down was prevented. Thus, sufficient etch selectivity was obtained to thereby form a pattern of high dimensional accuracy.

Thereafter, ion implantation was effected with the gate electrode as a mask to form a source-drain area 126; and the resist pattern was removed to form a MOSFET.

As described above, according to the present invention, fine highly-reliable MOSFETs are obtained without break down of the gate electrodes.

A ninth embodiment of the present invention will be described next.

Figure 18:
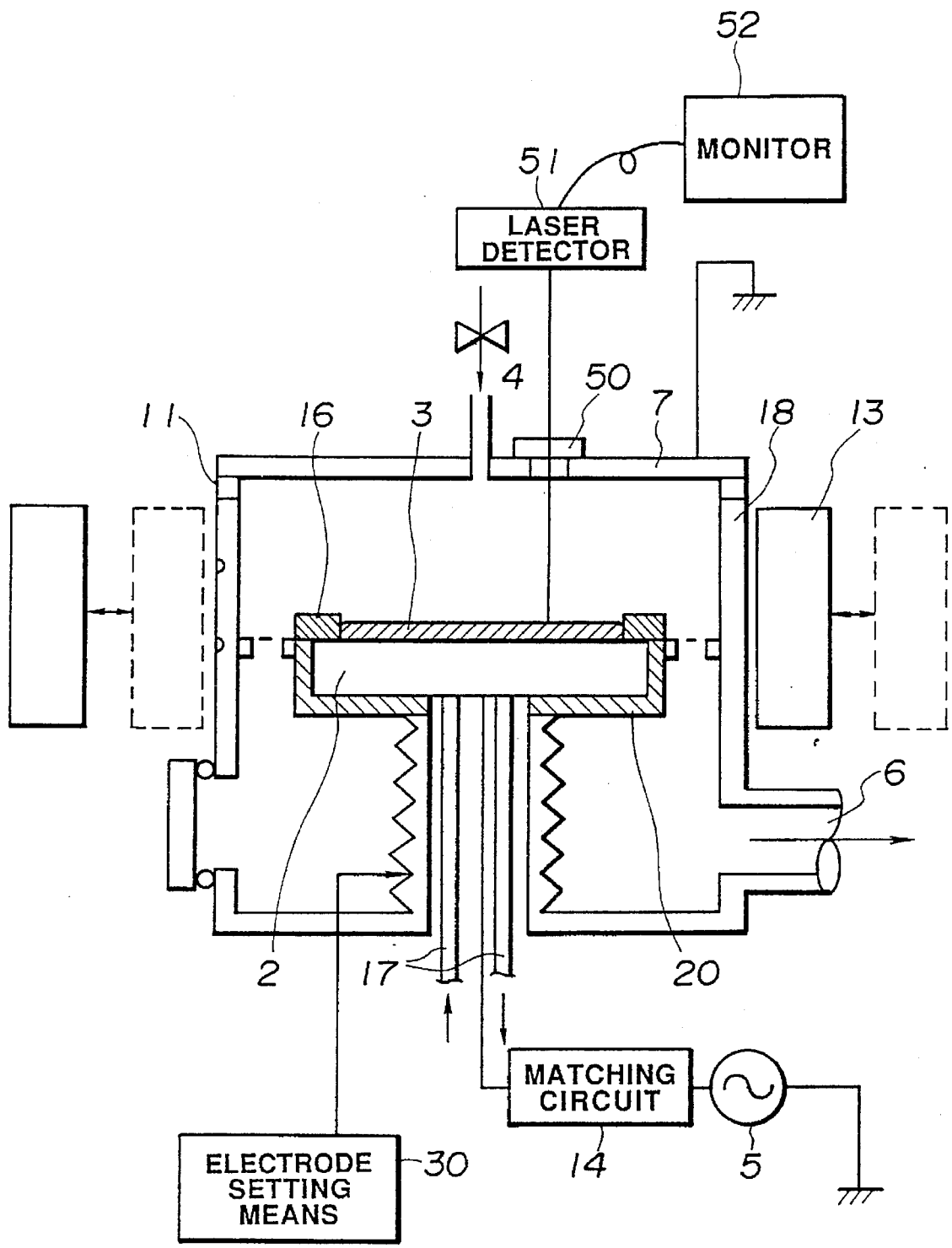
FIG. 18 shows an etching apparatus according to the ninth embodiment of the present invention.
Figure 19:
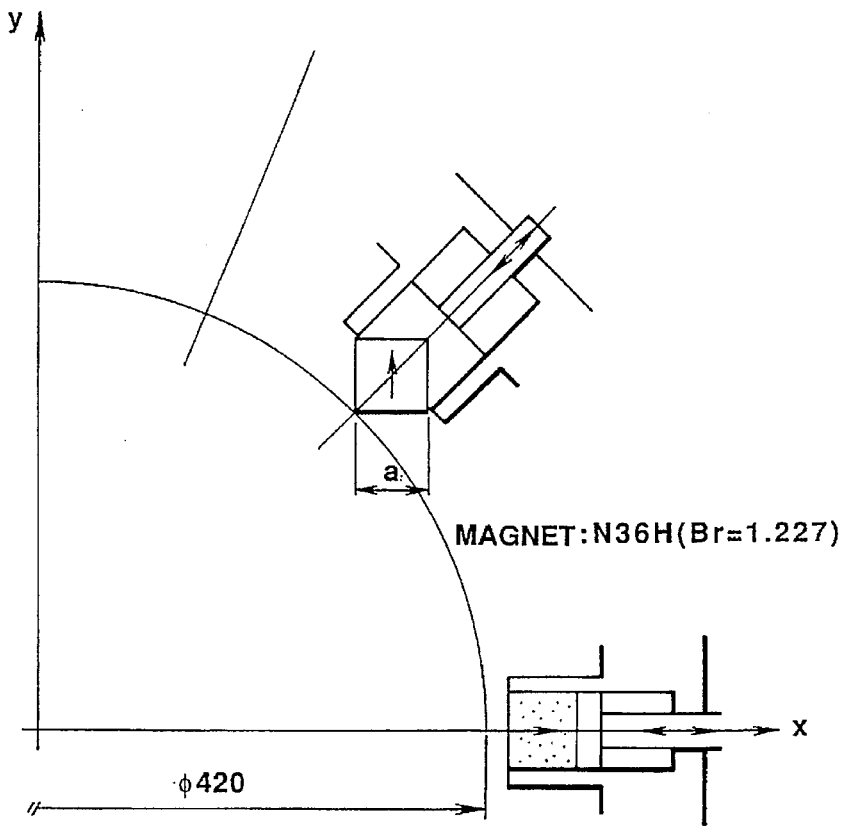
FIG. 19 is an illustrative view of the essential portion of a dipole ring of the etching apparatus of the ninth embodiment.

FIGS. 18 and 19 show an etching apparatus according to the present invention in which the same elements as in FIG. 1 is given the same reference numerals and detailed description for these elements are omitted. The apparatus is characterized in that the diameter of a dipole ring 13 is changeable and the lower electrode 2 is movable up and down using an electrode level setting means 30. That is, arrangement is such that a substrate to be processed is fed by its vertical movement into a magnetic field generated by the dipole ring 13 composed of a plurality of different magnets which are arranged in the form of a ring along half the circumference of which the direction of magnetization of the magnets makes a complete rotation.

The etching apparatus, the whole of which is shown diagrammatically in FIG. 18, is provided with a first electrode 7 which includes the upper wall of the vacuum container 1 and a second electrode 2 which is disposed opposite to the first electrode 2 so as to be movable up and down and also functions as a substrate support. An electric power generated by the high frequency source 5 is applied across the first and second electrodes 7 and 2 through a matching circuit 14 to produce an electric field. A reactive gas is fed through a gas inlet 4 into a space where the electric field is perpendicular to a magnetic field parallel to a surface of a wafer 3 and formed by a dipole ring 13 disposed outside the vacuum container 1 and the resulting plasma is confined by electric charging; ions accelerated out of the plasma by a self-biasing electric field induced on the wafer surface impinge on the wafer to advance the etching reaction.

Figure 20:
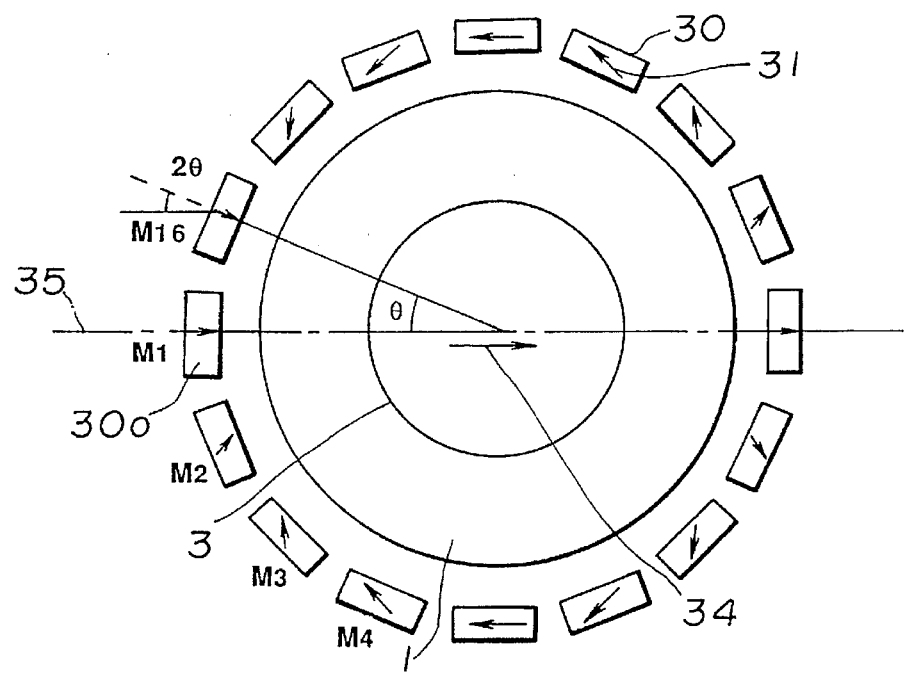
FIG. 20 shows a dipole ring of the etching apparatus according to the ninth embodiment.

FIGS. 19 and 20 show an enlarged illustrative view of an essential portion of the dipole ring 13 viewed from above and an overall illustrative view, respectively. The dipole ring 13 is provided with magnets 30 concentrically surrounding the outer periphery of the container 1 and supported such that the diameter of the ring 13 is variable. A magnet $M_{16}$ disposed at an angle of θ to a magnet $30_0$ magnetized in the direction of magnetization 35 is magnetized in a direction which is rotated by 2θ relative to the direction of magnetization 35. A magnet disposed at an angle of 180 degrees to the magnet $30_0$ is disposed along the circle so as to have the direction of magnetization 35 again. Since forces act on the individual magnets which are components of the ring to twist them, they are fixed to a stubborn non-magnetic yoke (not shown), which may instead be a magnetic yoke to reduce a leakage magnetic field furthermore.

According to this structure, since the second electrode is movable up and down, the substrate to be processed is easily lowered and conveyed when required. Therefore, it is unnecessary to provide separate magnetic generating means. Thus, a reduction in the magnetic field which would otherwise occur is prevented and no auxiliary magnetic field applied to prevent such reduction is required. Thus, the apparatus may have a simple structure to form a uniform high density magnetic field. The plasma potential and self-bias are equalized and highly anisotropic uniform surface processing can be performed on the surface of the substrate to be processed.

The height of the cathode electrode which is the second electrode on which the substrate 3 is placed may be set to any position; the inter-electrode spacing is changeable to an optimal one during plasma processing depending on the material of the wafer, the gas and the pressure to thereby change the processing characteristic.

By changing the diameter of the ring along which the magnets are arranged, the magnetic field strength produced within the ring can be changed as desired; and control of the ion energy can cause a change in the processing characteristic.

Figure 21A:
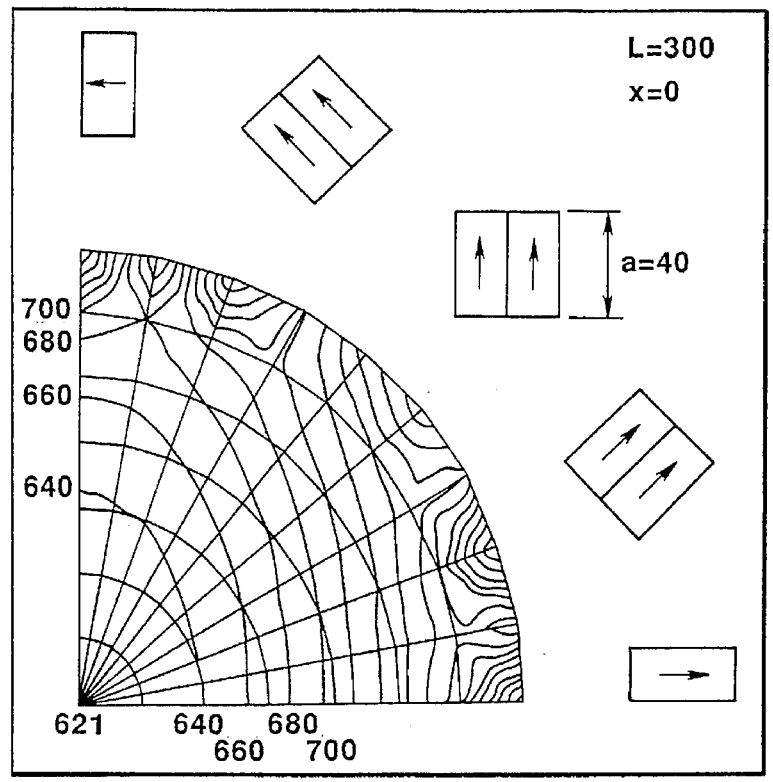
FIGS. 21(a) and 21(b) show a distribution of magnetic field obtained when the radius of the dipole ring is changed in the etching apparatus of the ninth embodiment shown in FIG. 19.
Figure 21B:
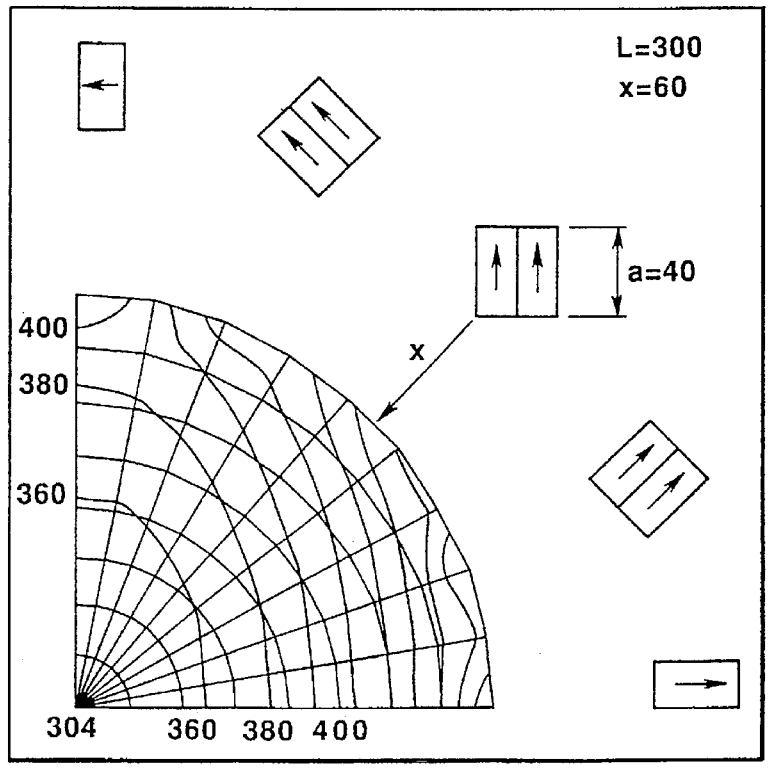

FIGS. 21(a) and 21(b) show the distribution of magnetic field generated by the dipole ring when the diameter of the ring is changed by 60 mm. As shown in these Figures, by moving the magnets in the radial direction of the dipole ring, the magnetic field strength is easily changed.

Figure 22:
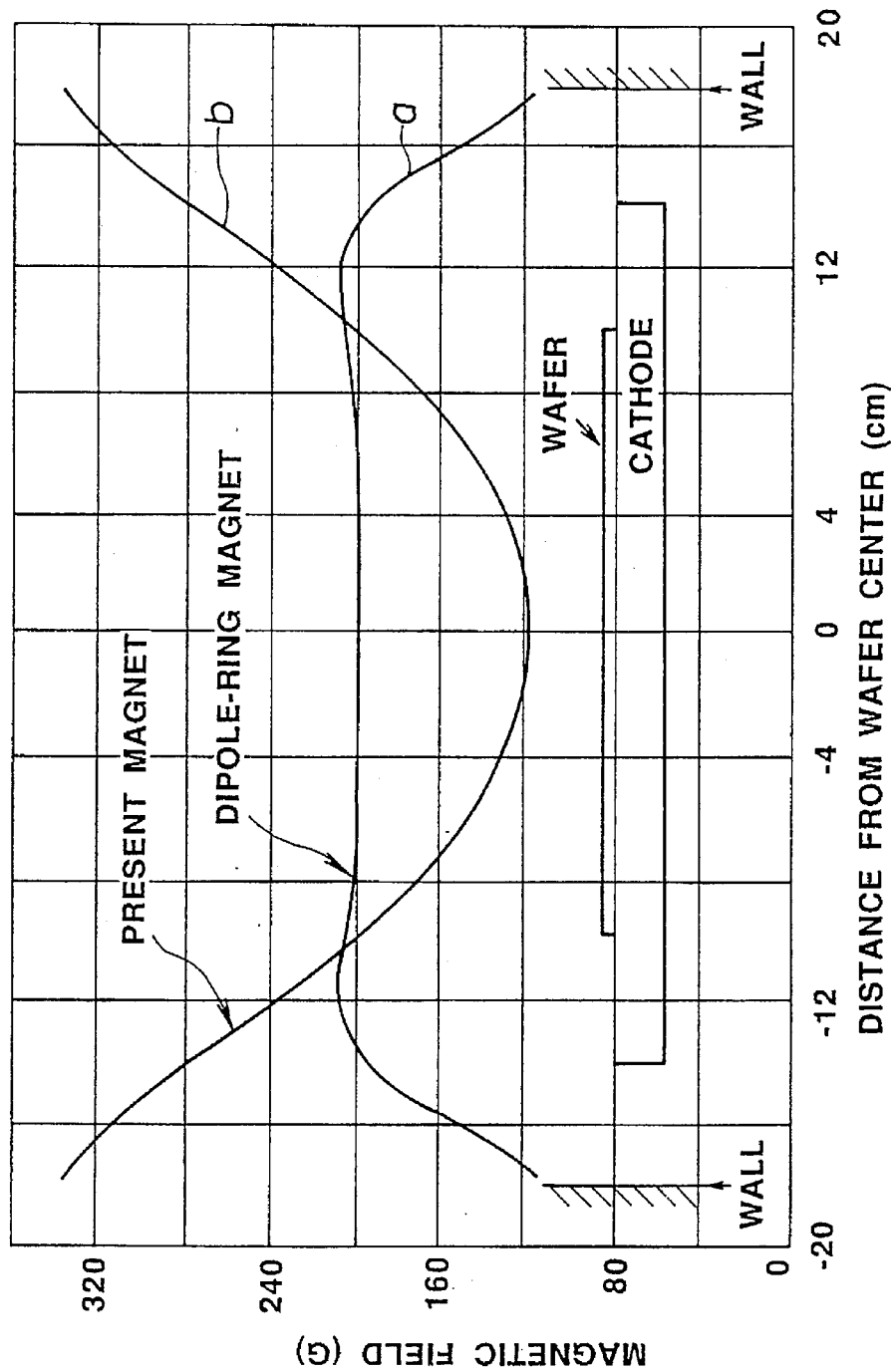
FIG. 22 shows the relationship between the distance from the center of a wafer and the magnetic field.

In order to describe the operation of the apparatus according to the present invention, FIG. 22 shows a distribution of magnetic field produced by the dipole ring magnets. In this case, it is assumed that the substrate to be processed is conveyed with the ring having a slit at half the height of the ring to move the wafer into/out of the container. As will be obvious from FIG. 22, uniform is achieved such that the difference between the magnetic field strengths produced by the dipole magnet in the central and peripheral portions of the wafer is less than 20%; and that the tilt of the magnetic field in a XY plane is less than ±5 degrees. In the axial direction of the dipole ring, the magnetic field was suppressed to within ±5% in the central ring portion of the dipole magnet which is ⅓–⅔ of the overall height of the magnet; and the tilt of the magnetic field was suppressed to within ±6 degrees. Furthermore, uniformity of this magnetic field is further improved by using magnets having a circular cross section and increasing the number of such magnets. However, the magnetic field strength is lowered by providing the slit in the peripheral portion of the chamber wall. In order to prevent such situation, an auxiliary magnet would be additionally provided for correcting purposes, so that the apparatus structure would become very complicated. However, as in the above embodiment structures, provision of the second electrode movable up and down greatly simplifies the apparatus structure to eliminate correction by additional provision of the auxiliary magnet.

By perpendicular intersection between the electric field E and the magnetic field B, as just described above, Lorentz force drifts electrons in the plasma, generated by the magnetron discharge, in the direction of E×B over a long distance to thereby increase the frequency of the electrons to collide with neutral molecules and atoms and hence increase the plasma density. Further, by only applying the magnetic field B to those electrons, these electrons are confined within the plasma to prolong their lifetime (the time taken for the electrons to collide with the sidewall of the chamber, electrode and wafer). Furthermore, the plasma magnetic field strength is increased at the N and S poles to confine the plasma. As a result, the plasma density is further increased. This serves to not only increase the etching rate but also improve the directivity of those ions. Furthermore, the ion energy which would otherwise amplify damage and reduce the etch selectivity are maintained sufficiently low even if the gas pressure is reduced suppress the reaction of neutral seeds and an etched film (isotropic reaction).

Furthermore, a fluid is fed through a cooling pipe 17 in the second electrode 2 as the substrate support to thereby control the temperature of the substrate efficiently. This is because the magnetron plasma produced by the present invention has high density and a quantity of heat emitted from the plasma to the substrate is large compared to the conventional apparatus.

The vacuum container is constructed such that the first electrode 7 is electrically isolated from the lower portion of the container by an insulator 11 disposed in the vicinity of the first electrode 7. Reference numerals 4 and 6 denote a reaction gas feeding system and an evacuating system, respectively. Reference numeral 20 denotes an insulator which insulates the second electrode. A protective ring 16 is disposed on the second electrode so as protect the periphery of a wafer on the second electrode 2 from direct exposure to the plasma. The material of the protective ring 16 is selected from the group of ceramics consisting of SiC, alumina, AlN and BN; carbons having various structures; Si; organic compounds; metals; and alloys, depending on the etched film and gas used.

While in the embodiment neodymium (Nd-Fe) magnets are used, a permanent magnet material such as a Sm-Co material, ferrite or alnico may be selected and used in consideration of required magnetic field, durability and weight.

As just described above, the arrangement of the dipole ring magnets results in a markedly uniform magnetic field between the opposite electrodes which produce a plasma and also provides a high magnetic field strength, for example, of up to several kilogausses, compared to the conventional apparatus. Thus, the plasma density is improved and hence processing rate and characteristic are improved. The uniformity of a surface of wafer is further improved especially when the wafer has a large diameter. In addition, static break down of the MOS structure of a wafer which would otherwise be caused due to unevenness of the plasma is avoided, advantageously. Since the magnets are arranged around the outer periphery of the cylindrical side of the reactive container, the upper portion of the container (on the anode side) which is required to be opened in maintenance can be opened. This is also effective for monitoring the process or applying radio frequency power to the anode. Even when the magnets and a wafer are rotatable relative to each other to provide further uniformity, no movement of the magnets is required in maintenance as is in the conventional apparatus with the magnet disposed on the anode side. Thus, the magnets are fixedly attached, for example, by a rail provided on the side of the reactive container and the apparatus is easy to handle.

A method of etching actually a silicon oxide film formed on a silicon substrate using the present apparatus will be now described.

Figure 23A:
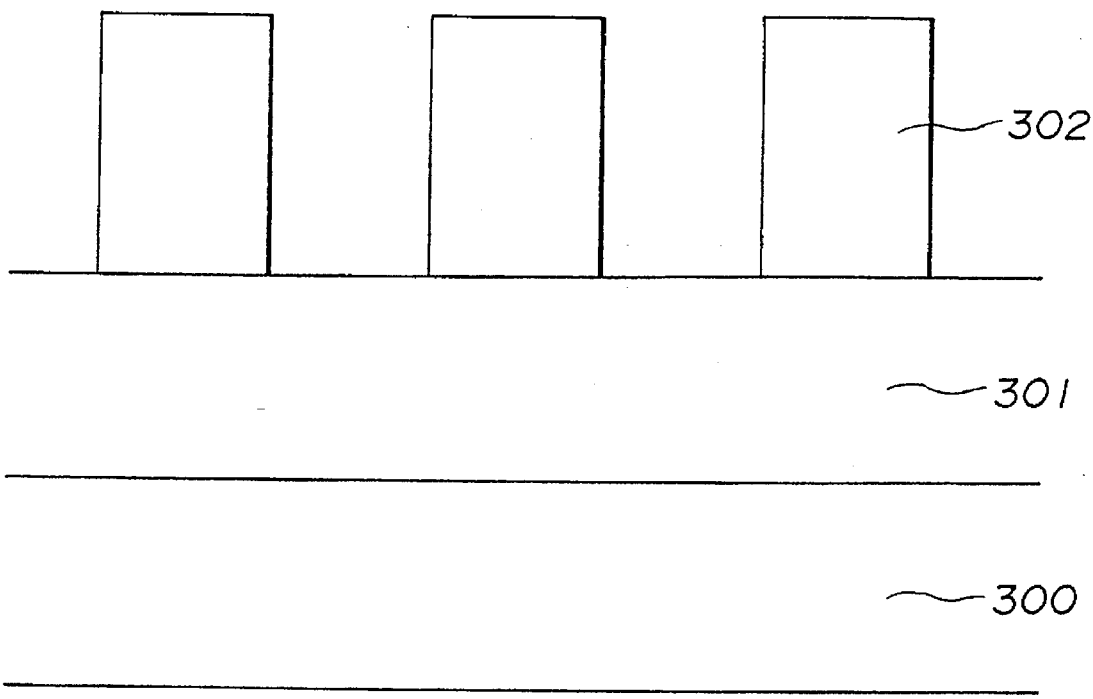
FIGS. 23(a) and 23(b) show the etching steps carried out by the etching apparatus of the ninth embodiment.
Figure 23B:
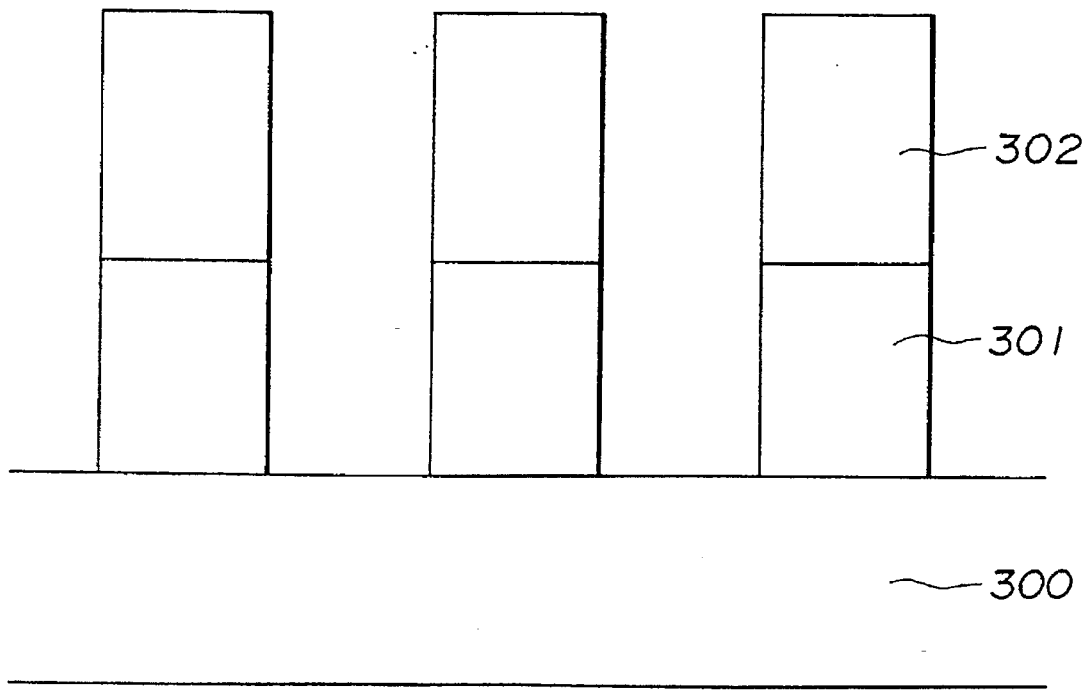

First, as shown in FIG. 23(a), a 1000-nm thick silicon oxide film 301 is formed on the silicon substrate 300. Further, a resist pattern 302 is then formed on silicon film 301. This half-finished product is handled as wafer, which is carried onto the second electrode 2 within the vacuum container 1 by a load lock mechanism and a carrying mechanism (both, not shown); it is then locked by a static chuck (not shown); and the wafer and the second electrode are then lifted together to a position 27 mm from the first electrode.

The vacuum container 1 is evacuated to about $10^{-6}$ Torr by the evacuating system 6. A $CF_4$ gas is then introduced at a rate of 50 cc/min. from the feed pipe 4 into the container 1. A high frequency (rf) power of 200 W at 13.56 Mhz is applied across the first and second electrodes 7 and 2. The power density a unit area of the susceptor at this time is 0.6 W/cm$^2$. In this case, the dipole ring 13 is not rotated, but may be rotated. The magnetic field strength at this time within the dipole ring 13 is 200 G.

When the etching is completed, supply of the high frequency power and the etching gas are stopped, the gas remaining in the chamber is evacuated, the second electrode is lowered to its original position, and the wafer is then taken out of the chamber by the load lock mechanism to provide an etched appearance of the wafer having a vertical cross section with high dimensional accuracy, as shown in FIG. 24(b).

In this way, processing is achieved without any dimensional conversion error. In addition, since the plasma density is maintained very high, the ion energy is suppressed low, high etch selectivity is obtained, and damage is reduced.

While in the embodiment the dipole ring is composed of 16 magnets, it may be composed of 12 or 8 magnets, as shown in FIG. 5.

While a gas including fluorocarbon (CF) was used to etch the silicon oxide film, a gas including mainly oxygen may be used to process the directivity of the resist, A gas mainly including chlorine may be used to process with high performance aluminum used for wiring purposes. In these cases, the effects produced by the present invention were ascertained. Other materials may be etched with a gas including at least a reactive gas such as a halogen element or oxygen, hydrogen, nitrogen.

The magnetic field strength is not limited to 200 gauss, and is selected suitably depending on a material to be etched, and a gas to be used.

Furthermore, it was conventionally recognized that a reduction in the inter-electrode spacing to about 20 mm resulted in a reduction in the discharge efficiency while a reduction in the inter-electrode spacing to 8 mm was achieved under 1,600 gauss, so that an acceptable limit of the apparatus structure required for the flow of the gas is increased. In addition, the high frequency is not limited to 13.56 Mhz, but a relatively low frequency of about 100 Khz to 1 Mhz is effective for etching an oxide film which requires a relatively high ion energy although it depends on the etched material. In order to reduce the ion energy, the use of a high frequency of about 20–100 Mhz is effective for a material, which is required to have a satisfactory etch selectivity to the mask or the underlying material, such as the phosphorus-enriched polycrystalline silicon or an aluminum alloy. In either case, in a combination of the magnetic field strength, the ion energy, plasma density and other plasma parameters can be controlled.

Figure 24:
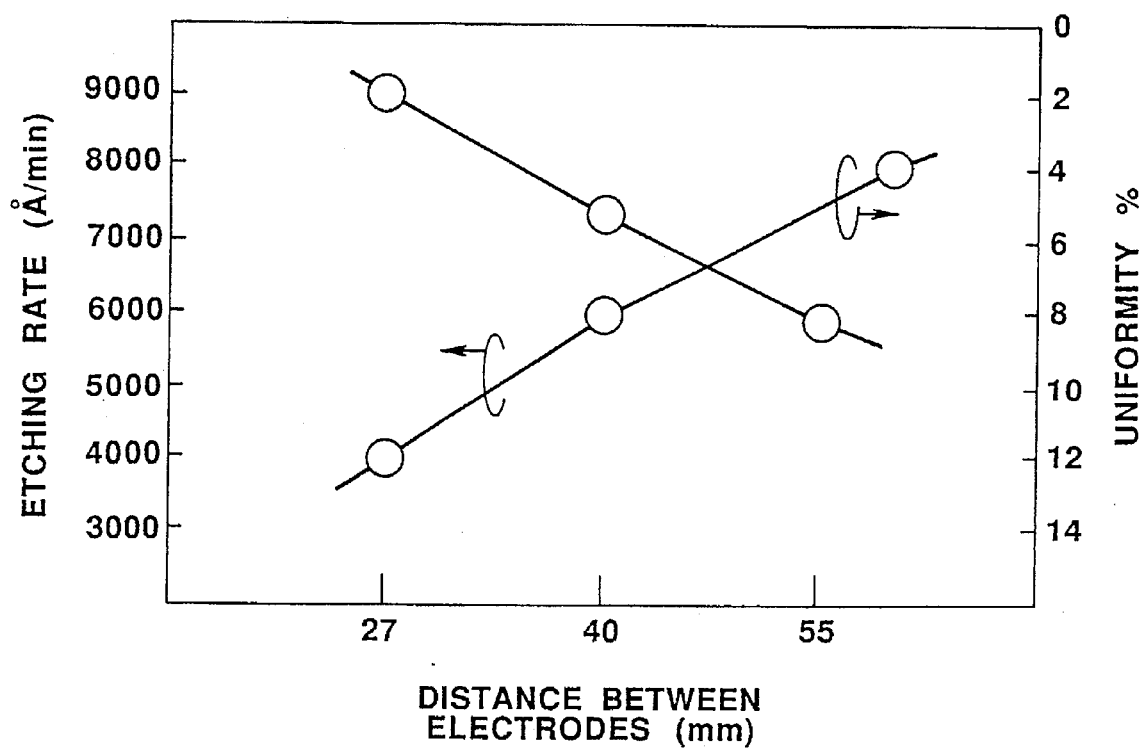
FIG. 24 shows the relationship between the distance between the electrodes and the etching rate.

By changing the vertical movement distance of the second electrode 2 using this apparatus, the electrode distance is changed to 27, 40 and 55 mm sequentially, and the silicon oxide film formed on the silicon substrate was actually etched, the result of which is shown in FIG. 24. As will be obvious from FIG. 24, a change in the inter-electrode distance changes the etching rate and the uniformity of the magnetic field. As just described above, by changing the inter-electrode distance, depending on the material to be etched, less-damage etching or higher speed etching is selected.

The inter-electrode may be changed during this etching and sequential etching may be performed.

As just described above, the present invention is not limited to the above embodiments, and is applicable to various apparatuses.

For example, when an insulating film is formed on an electrode of a MOS device and etch-back is performed for flattening purposes by an etching apparatus which uses a conventional magnet, uneven electric charging can be performed on the wafer surface due to uneven magnetic field generated by the conventional magnet. As a result, insulation brakeage occurs in the periphery of the wafer. In contrast, with the inventive apparatus, electric charges is uniform on the wafer surface to thereby prevent the occurrence of insulation break down.

Figure 25A:
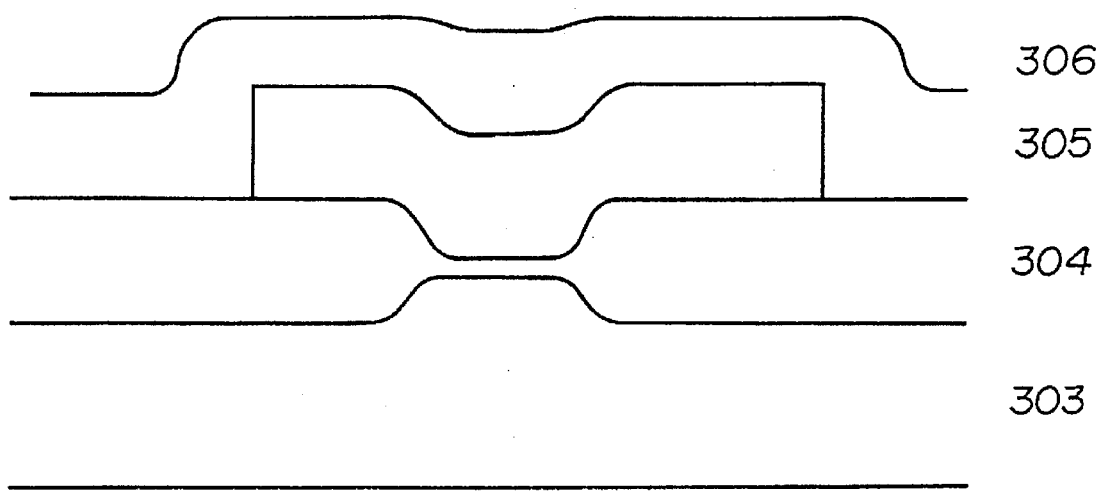
FIGS. 25(a) and 25(b) show the etching steps carried out when the inventive apparatus is used for etch-back purposes.

As the evaluation of damages, FIG. 25 show a result of the process which includes the step of forming an insulating film 304 (thin oxide film of 100 angstrom) on a silicon substrate 303, depositing a CVD oxide film 306 on a gate electrode of a MOS structure on which a polycrystalline silicon film 305 is deposited, and flattening the resulting surface of the MOS structure by etching-back.

A substrate is conveyed onto the second electrode 2 within the vacuum container 1 by the load lock mechanism and conveyance mechanism; fixed by the static chuck (not shown); and then lifted to a position 27 mm from the first electrode 7 which is the center of the dipole ring.

Figure 25B:
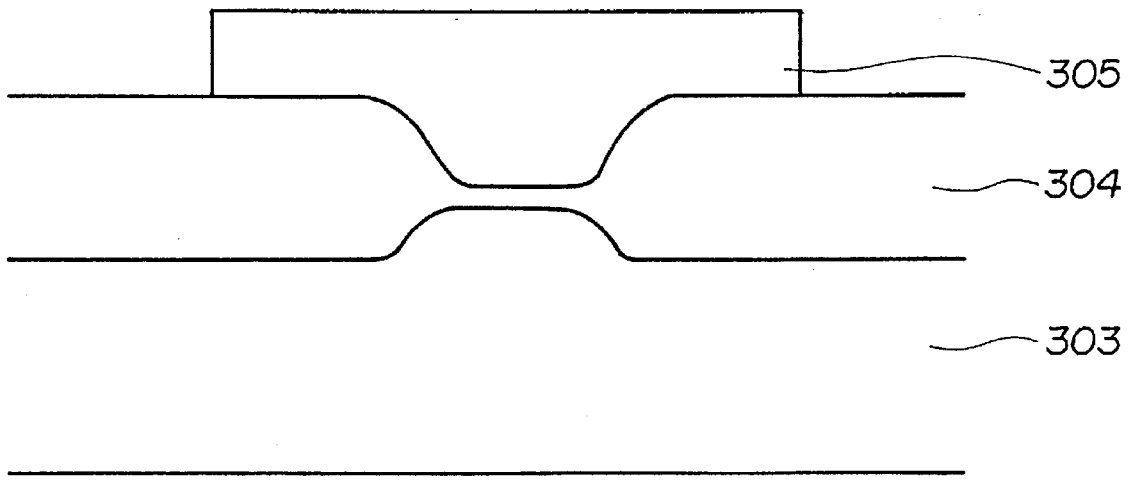

The vacuum container 1 is then evacuated by the evacuating system 6 to about $10^{-6}$ Torr; a $CF_4$ gas is fed at a rate of 50 cc/min. from the feed system 4 into the container; 1,027 W (2.7 W/cm$^2$) of a high frequency power at 13.56 Mhz is applied across the first and second electrodes 7 and 2; the CVD oxide film is etched; the high frequency power is then turned off; the feed of the etching gas is stopped; the gas remaining within the chamber is evacuated; the second electrode is lowered to its original position; the load lock mechanism is again used to take the substrate out of the chamber to thereby provide an etched substrate as shown in FIG. 25(b).

Figure 26A:
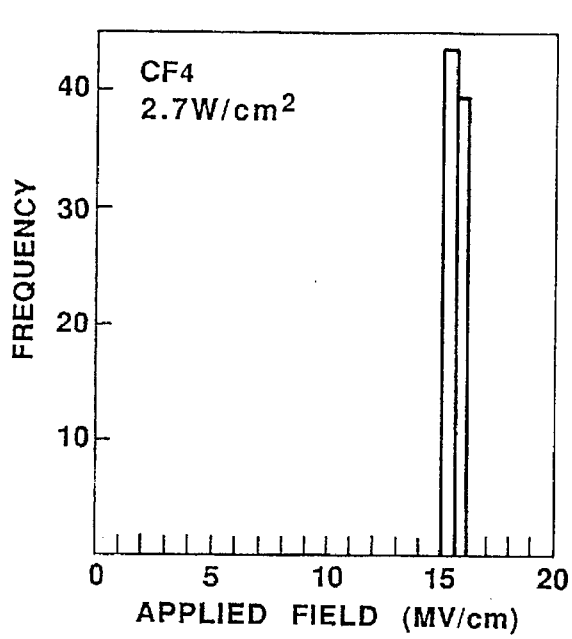
FIGS. 26(a) through 26(d) show break down frequency and gate break down on a wafer for the inventive and conventional apparatus.
Figure 26B:
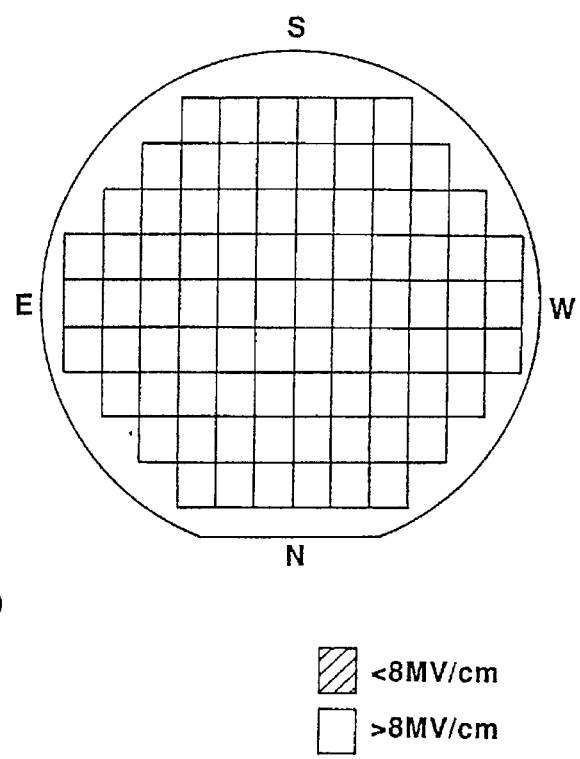
Figure 26C:
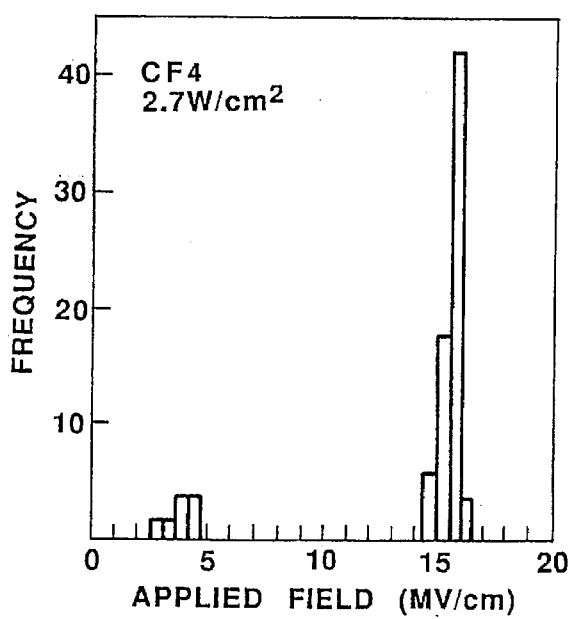
Figure 26D:
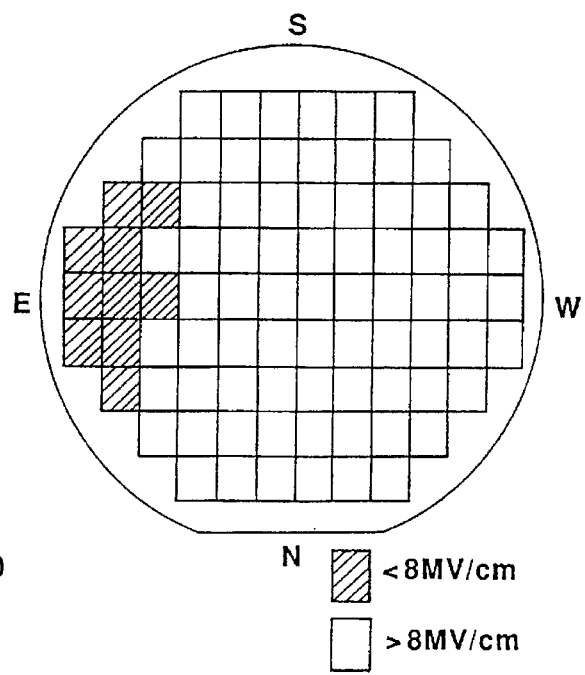

FIGS. 26(a) and 26(b) respectively show break down frequency and gate break down on the wafer surface in this apparatus occurring when an electric field of a 8 MV/cm is applied across the wafer. These Figures exhibited that there occurred no gate break down until the applied field arrived at 15 MV/cm and hence there occurred no gate break down until the applied field arrived at 8 MV/cc. FIGS. 26(c) and 26(d) show break down frequency and gate break down on a wafer surface in the conventional apparatus which occurred when an electric field of 8 MV/cm was applied across the wafer, respectively. FIGS. 26(a) and 26(d) show that gate break down occurred when the applied field was 5 MV/cm or less, and gate break down occurred at 10 places out of 82 places in the peripheral portion of the wafer by the time when the applied field arrived at 8 MV/cm.

Figure 27:
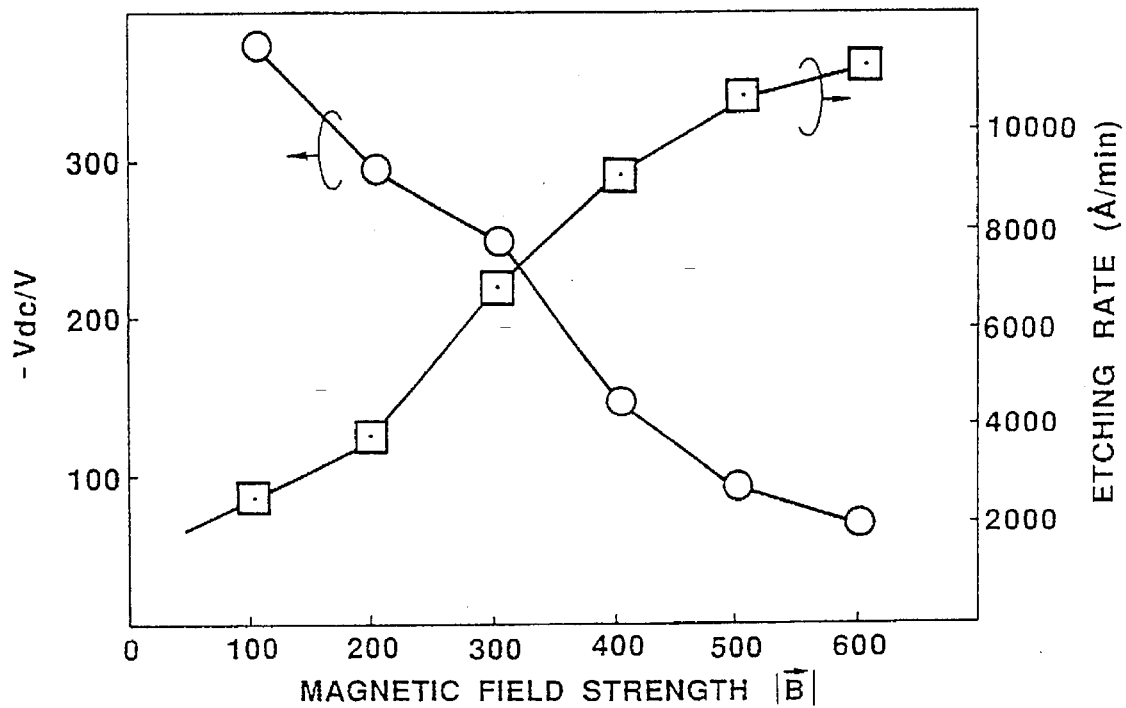
FIG. 27 shows a relationship between magnetic field, self bias voltage (Vdc) and etching rate.

FIG. 27 shows graphs indicative of the relationship of magnetic field, oxide film etching rate, and self bias voltage measured when etching was performed under the same conditions. It will be known from this result that as the magnetic field strength increases, the etching rate increases, and the self bias voltage decreases.

Figure 28:
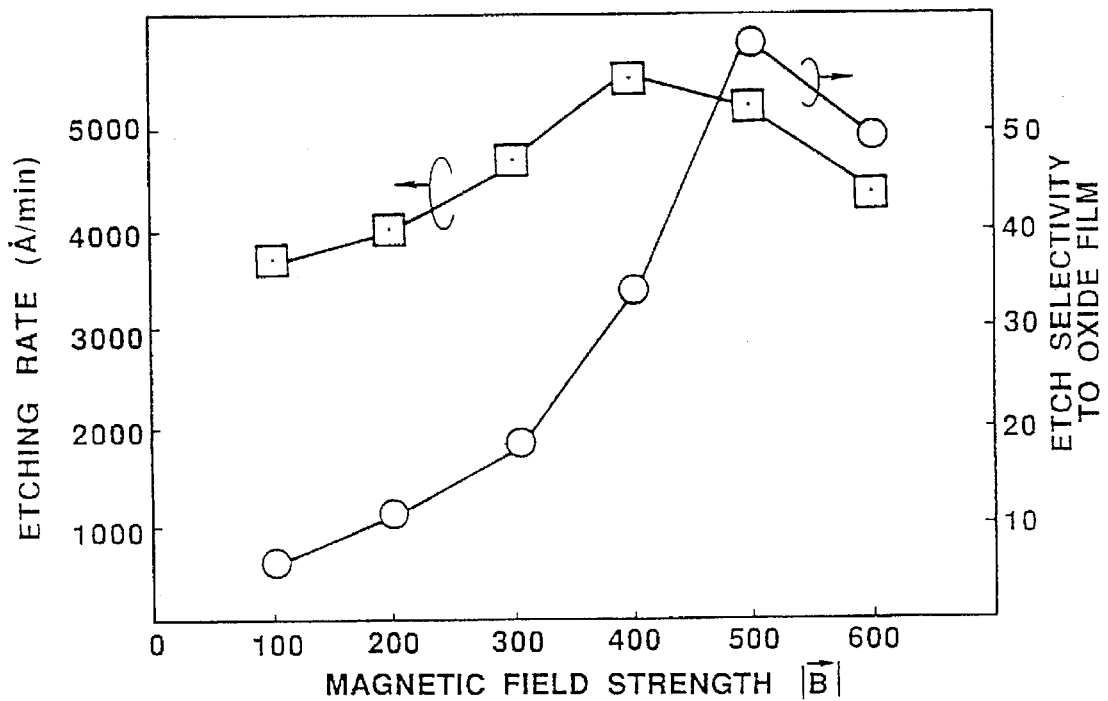
FIG. 28 shows a relationship between magnetic field, etching rate and etch selectivity.

A further embodiment will be described below in which the diameter of the dipole magnet ring and the magnetic field strength are changed. FIG. 28 shows a poly-silicon etching rate obtained when the diameter of the ring, and hence the magnetic field strength were changed under the conditions similar to those in the eight embodiment, and etching was performed. The etching gas used was $Cl_2$, 150 W (0.5 W/cm$^2$) of high frequency power at 13.56 Mhz was applied to the wafer; and the pressure was maintained at 50 Mtorr. As the magnetic field increases, the etching rate does not increase monotonously and is maximum at a magnetic field strength of about 400 G. It was found that when the etching rate of a similar oxide film was measured to try to obtain the etch selectivity, a satisfactory etch selectivity was obtained at a magnetic field strength of 500 G.

Figure 29A:
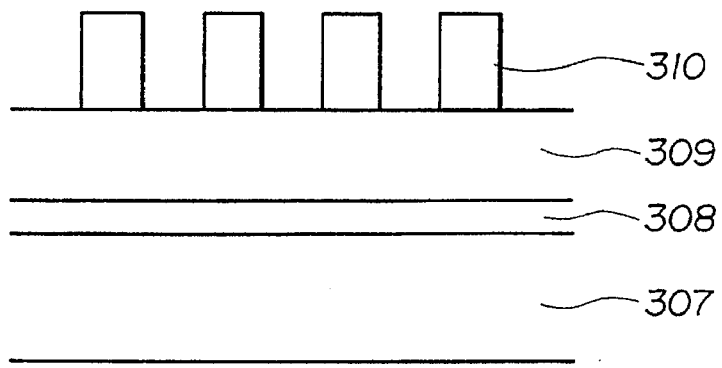
FIGS. 29(a) and 29(b) show the etching steps carried out in the ninth embodiment of the present invention.

Etching was sequentially performed using these magnetic field strengths. A silicon oxide film 308 was deposited on a silicon substrate 307, a poly-silicon film 309 was deposited by 400 nm by CVD, and a photoresist 310 was patterned to provide a wafer (FIG. 29(a)).

This wafer is carried onto the second electrode 2 within the vacuum container 1 by the load lock mechanism and the carrying mechanism; it is then locked by the static chuck (not shown); and the wafer and the second electrode are then lifted together to a position 27 mm from the first electrode.

The vacuum container 1 is evacuated to about $10^{-6}$ Torr through the evacuating system 6. A $Cl_2$ gas is then introduced at a rate of 50 cc/min. from the feed system 4 into the container 1. A high frequency (rf) power of 150 W (0.5 W/cm$^2$) at 13.56 Mhz is applied across the first and second electrodes 7 and 2 so that the magnetic field strength is 400 G to adjust the diameter of the dipole ring to etch the poly-silicon film.

Immediately before the underlying silicon oxide film 308 is exposed, the diameter of the dipole ring is reduced such that the magnetic field is 500 G to thereby perform over-etching.

Figure 29B:
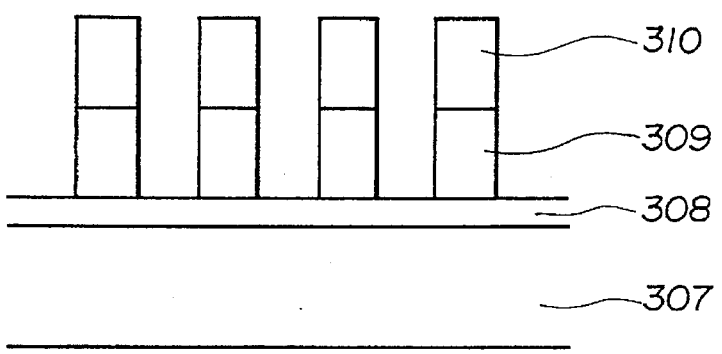
Figure 30:
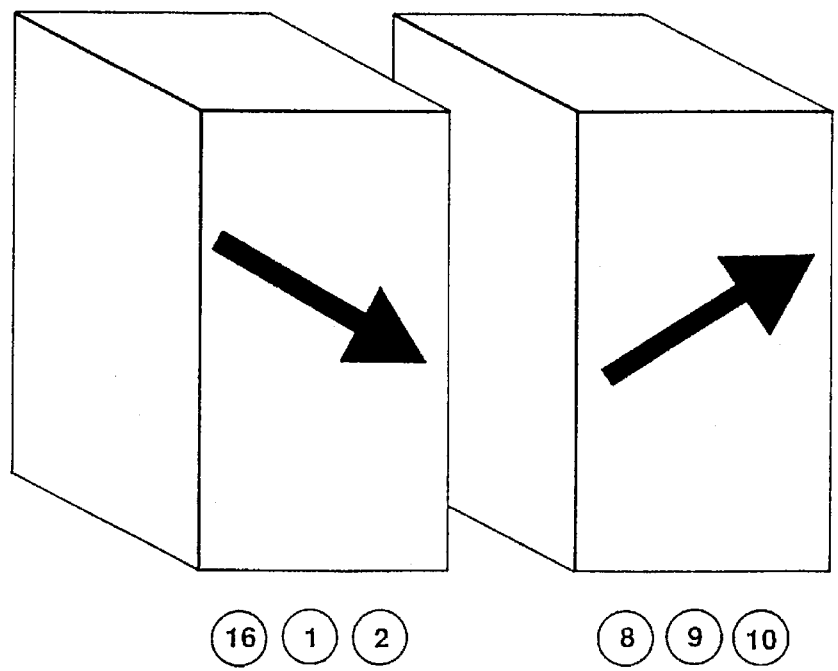
FIG. 30 illustrates the essential portion of a dipole ring according to the ninth embodiment of the present invention.

When the etching is completed, supply of the high frequency power and the etching gas are stopped, the gas remaining in the chamber is evacuated, the second electrode is lowered to its original position, and the wafer is then taken out of the chamber by the load lock mechanism to provide a satisfactory etched appearance of the wafer, as shown in FIG. 29(b).

As described above, the etching rate is initially set at a high value, the magnetic field strength is halfway increased and etching is performed with high etch selectivity, so that high rate etching is performed with a high etch selectivity maintained.

Figure 31A:
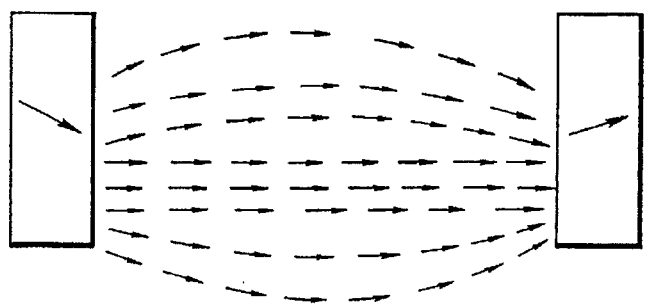
FIGS. 31(a) and 31(b) show the positions of parallel magnetic fields of the etching apparatus for FIG. 29 and the conventional etching apparatus.
Figure 31B:
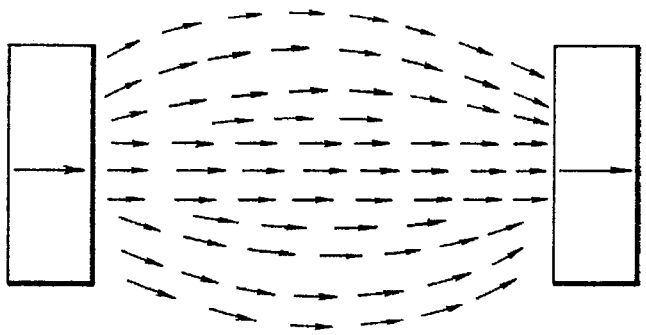

A tenth embodiment of the present invention will next be described in which the height of a space for a parallel magnetic field is changed. In this embodiment, the dipole ring 13 of FIGS. 18 and 20 is provided with a plurality of magnets M1–M16 arranged so as form a ring in which the direction of magnetization of the magnets makes a complete rotation along half the circumference in a plane perpendicular to the axis of the ring. Three sets of the magnets, M16, M1, M2 and M8, M9, M10, have the direction of magnetization toward the central axis of the ring and the strengths of the magnets are substantially the same but the directions are opposite. As shown in FIG. 31(a), with this arrangement, the parallel magnetic field generated by the dipole ring 13 can be positioned deviated from the center of the dipole ring 13. For comparing purposes, FIG. 31(b) shows the position of the parallel magnetic field generated by the arrangement of FIG. 18 which contains no directional components perpendicular to the ring.

For example, a parallel-magnetic field can be generated at a position which is 5 cm lower than the midpoint height of the dipole ring 13. Even at that position, uniformity is obtained which corresponds to the distribution of the magnetic field at the midpoint of the conventional dipole ring, that is, the distribution of the magnetic field in the XY space is less than 15%, and the distribution of the vertical components is less than 4%.

Figure 32:
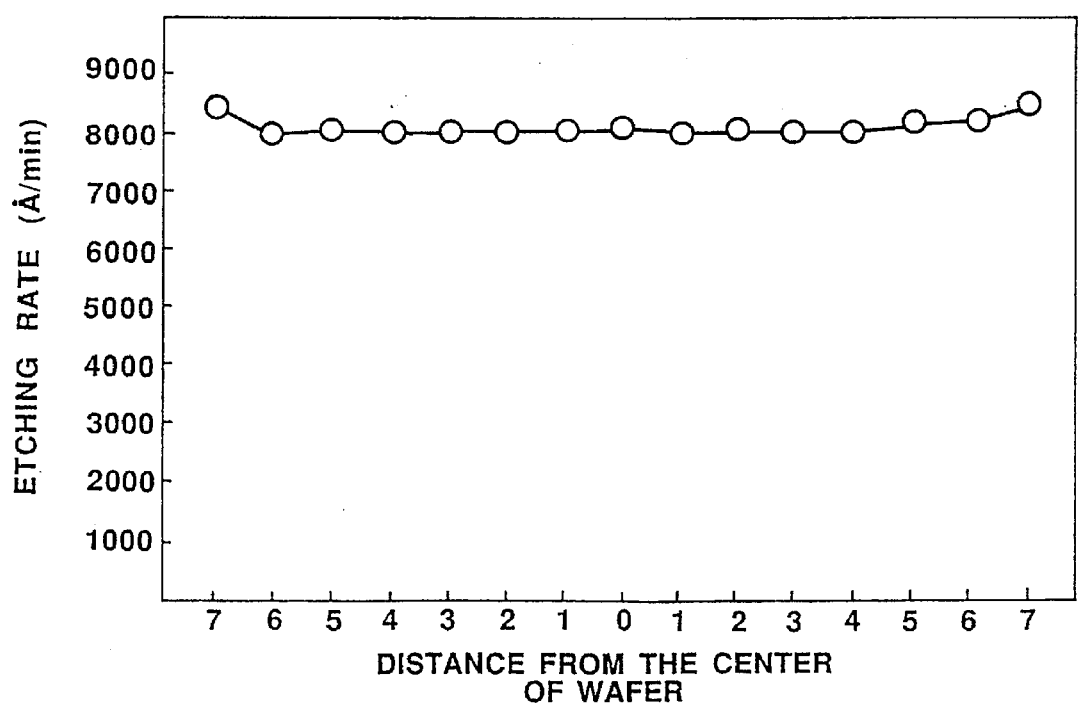
FIG. 32 shows the relationship between the distance from the center of a wafer and the etching rate when etching is performed using the dipole ring of the ninth embodiment.

As shown in FIG. 32, this apparatus also provides uniformity similar to that obtained by the use of the conventional dipole ring. Generation of a parallel-magnetic field space in any position within the ring provides the characteristic which the conventional dipole ring has and greatly reduces the vertical distance through which the wafer is driven, and the wafer conveyance mechanism is greatly simplified compared to the conventional apparatus.

The vertical components may greatly be changed during etching.

While in the above embodiments magnetic generating means such as the dipole rings was provided outside the vacuum container, they may be provided inside.

The present invention is effective not only for processing electrical parts directly, but also similarly for film formation or surface processing on an already formed electric part or for film formation and surface processing of lead electrodes connected to the underlying electric parts. The electric parts are not limited to MOS structures. They include all electric parts which have electrical functions and are deteriorated by voltages and currents applied thereacross and flowing therethrough, respectively; that is, pn junctions, transistors and capacitors having various structures.

Another application is implantation of impurities into the substrate. A parallel-flat plate type plasma apparatus is used. A gas which contains boron, for example, a $BF_3$ gas, is fed into the plasma apparatus and a plasma is generated. A gas in the plasma is dissociated in the plasma and the B atoms are implanted into the substrate. At this time, since there are many F atoms, the gas pressure is reduced to $10^{-5}$ Torr to prevent etching by the F atoms. By applying the magnetic field as in the present invention, a plasma is generated even at such a low gas pressure and the ion energy is suppressed to about scores of several Ev to 300 Ev to thereby form a very shallow impurity layer. Also in the present invention, effects such as uniformity or a reduction in damage are similarly realized.

Figure 33:
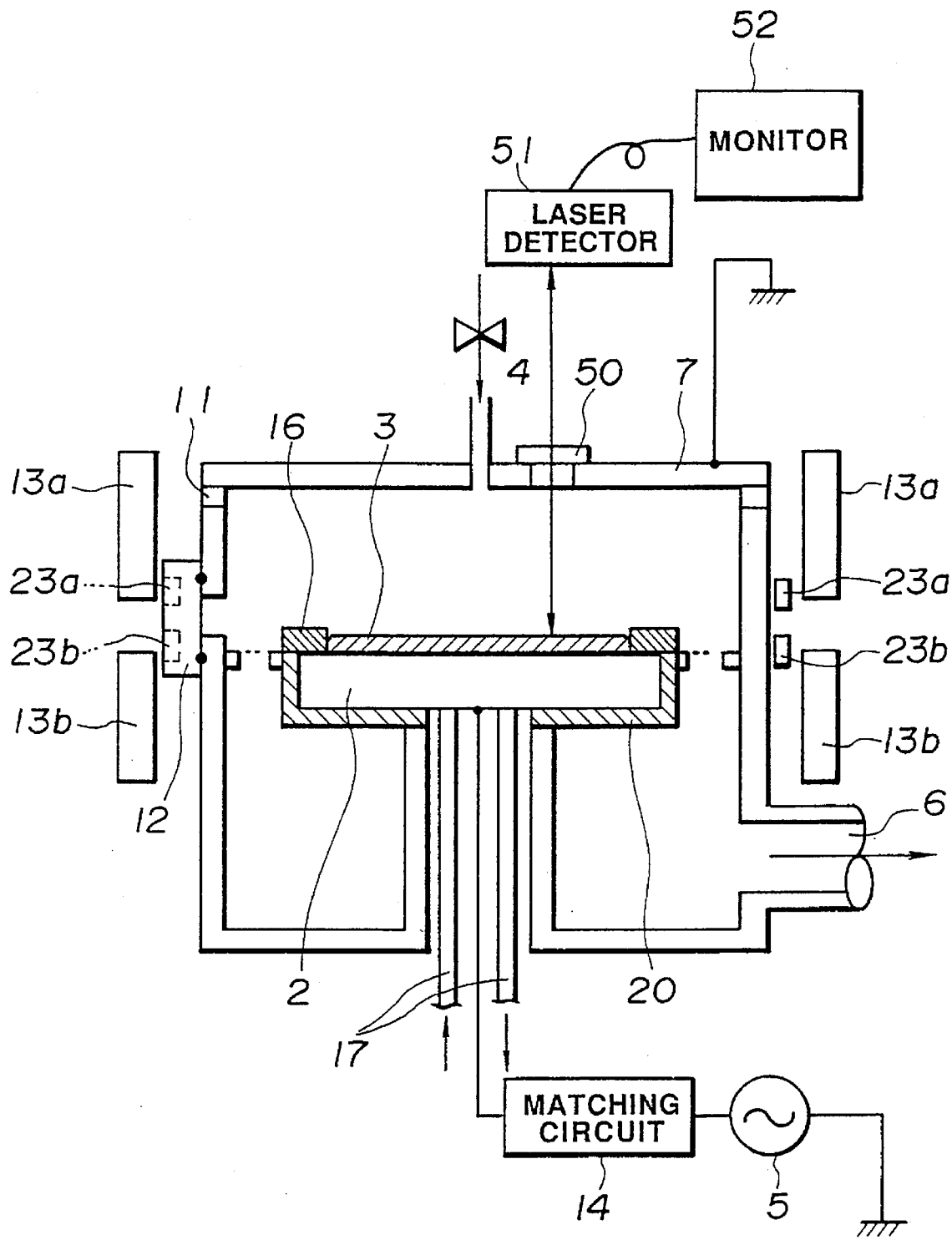
FIG. 33 shows an etching apparatus according to the eleventh embodiment of the present invention.

FIGS. 33 and 34 show an etching apparatus of an eleventh embodiment of the present invention.

Figure 34A:
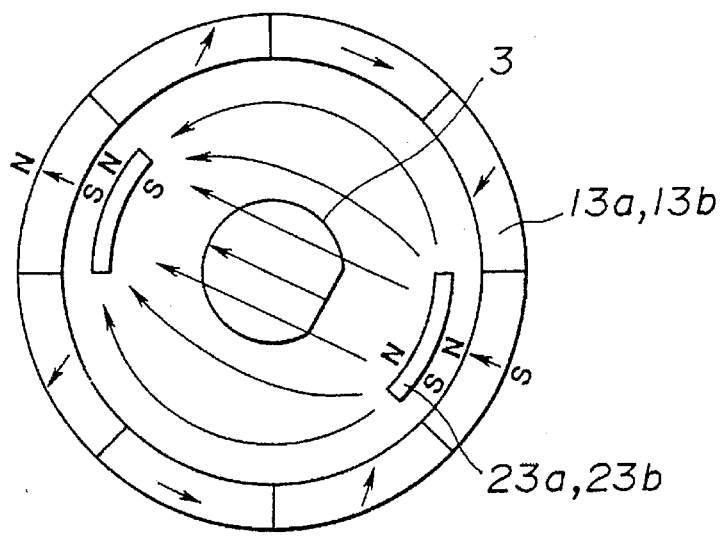
FIGS. 34(a) through 34(c) show a dipole ring of the apparatus of FIG. 33.
Figure 34B:
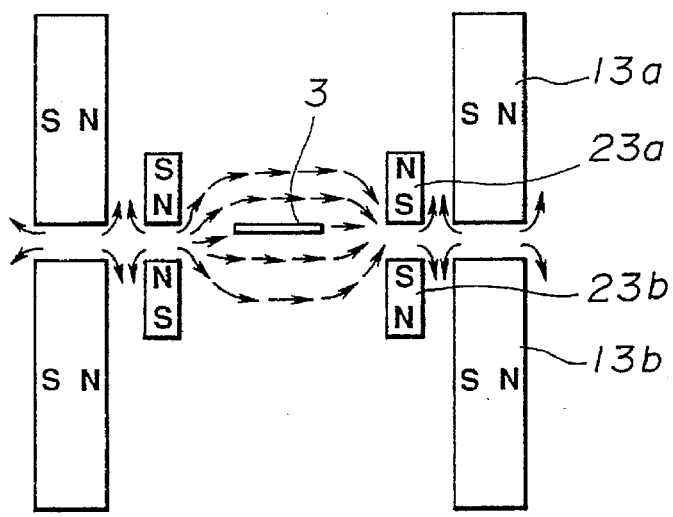
Figure 34C:
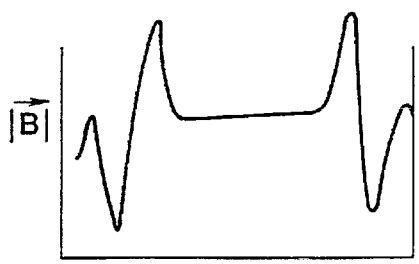

The etching apparatus is characterized in that two pairs of upper and lower auxiliary magnets 23a and 23b are disposed in the direction of N-S magnetic force lines within a pair of upper and lower dipole rings 13a and 13b so as to provide an increased magnetic field at the peripheral portion of the container to confine a plasma satisfactorily within the magnetic field. FIG. 33 shows a diagrammatic overall structure of the apparatus; FIGS. 34(a) and 34(b) are respectively a horizontal cross-sectional view and a vertical side cross-sectional view of the essential portion of the apparatus of FIG. 33; and FIG. 34(c) shows a synthetic magnetic field formed by the pair of dipole rings and the two pairs of auxiliary magnets.

The etching apparatus is provided with a first electrode 7 which includes the upper wall of the vacuum container 1 and a second electrode 2 which is disposed opposite to the first electrode 2 and also functions as a substrate support. An electric power generated by the high frequency source 5 is applied across the first and second electrodes 7 and 2 through a matching circuit 14 to produce an electric field. A reactive gas is fed through a gas inlet 4 into a space where the electric field is perpendicular to a magnetic field parallel to a surface of a wafer 3 and formed by dipole rings 13a, 13b and auxiliary magnets 23a, 23b disposed outside the vacuum container 1 and the resulting plasma is confined by electric charging; ions accelerated out of the plasma by a self-biasing electric field induced on the wafer surface impinge on the wafer to promote the etching reaction.

FIG. 34(a) shows an illustrative view of the essential portions of the dipole rings 13a, 13b of FIG. 33 viewed from above. The dipole rings 13a, 13b each is provided with magnets 30 concentrically surrounding the outer periphery of the cylindrical container 1. A magnet disposed at an angle of θ to a magnet $30_0$ magnetized in the direction of magnetization 35 is magnetized in a direction which is rotated by 2θ relative to the direction of magnetization 35. A magnet disposed at an angle of 180 degrees to the magnet $30_0$ is disposed along the ring so as to have the direction of magnetization 35 again. Since forces act on the individual magnets which are components of the ring to twist them, they are fixed to a stubborn non-magnetic yoke (not shown), which may instead be a magnetic yoke to reduce a leakage magnetic field.

Figure 35A:
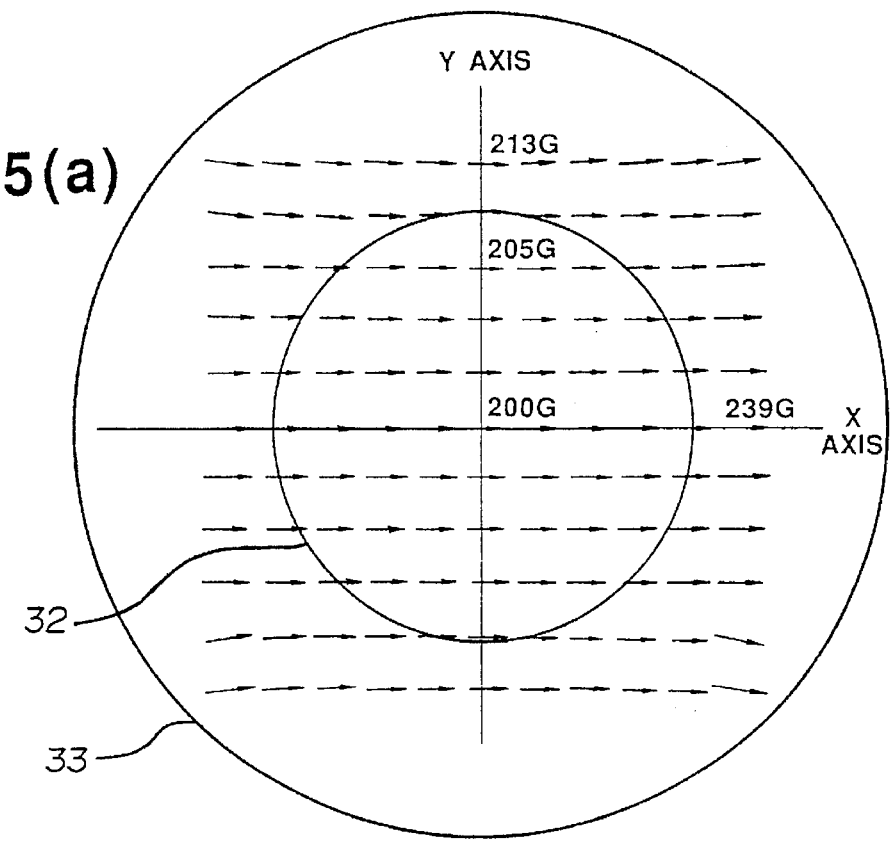
FIGS. 35(a) and 35(b) show a distribution of magnetic field of the etching apparatus of the eleventh embodiment.
Figure 35B:
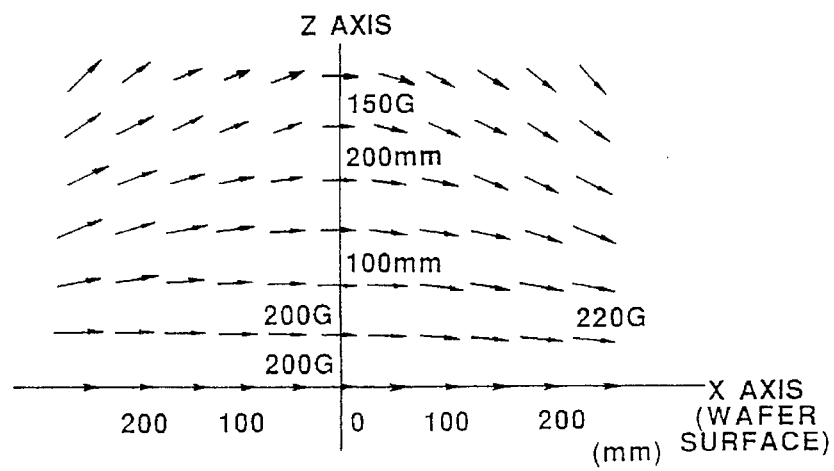

FIGS. 35(a) and 35(b) illustrates a distribution of magnetic field produced by this dipole ring. As will be obvious from FIGS. 35(a) and 35(b), the difference in the strengths of the magnetic fields produced by the dipole magnets between the central and peripheral portions of the wafer can be suppressed to within 20%. Uniformity is such that the tilt of the magnetic field in an XY plane can be suppressed so as to be less than ±5 degrees. In the axial direction of the container, the difference in magnetic field can be suppressed to within ±5% in the central portions of the dipole magnets which involve ⅓–⅔ of their overall height and the tilt of the magnetic field is suppressed to within ±6 degrees. The use of magnets having a circular cross section or an increased number of magnets will contribute to the formation of a further uniform magnetic field. In contrast, the conventional apparatus of FIG. 57 has a ratio of more than 2 in magnetic field strength of the peripheral to central portions of the wafer. Similarly, in the conventional apparatus, even above the wafer or even in a region where a plasma is formed, the vertical magnetic field strength is larger especially in the peripheral portion of the wafer than in its central portion to thereby disturb the distribution of the plasma.

Furthermore, a fluid is fed through a cooling pipe 17 in the second electrode 2 as the substrate support to thereby control the temperature of the substrate efficiently. This is because the magnetron plasma produced by the present invention has high density and a quantity of heat emitted from the plasma to the substrate is large compared to the conventional apparatus.

The vacuum container is constructed such that the first electrode 7 is electrically isolated from the lower portion of the container by an insulator 11 disposed in the vicinity of the first electrode 7. Reference numerals 4 and 6 denote a reaction gas feeding system and an evacuating system, respectively. Reference numeral 20 denotes an insulator which insulates the second electrode. A protective ring 16 is disposed on the second electrode so as protect the periphery of a wafer on the second electrode 2 from direct exposure to the plasma. The material of the protective ring 16 is selected from the Group of ceramics consisting of SiC, alumina, AlN and BN; carbons having various structures; Si; organic compounds; metals; and alloys, depending on the etched film and gas used.

While the magnet is provided above the vacuum container in the conventional apparatus, the dipole rings 13a, 13b are provided around the outer periphery of the sidewall of the container in the present invention. Thus, the back of the first electrode can be used for a monitor or the like. Therefore, the monitor 52 which monitors the state of a wafer surface and more particularly the etching depth through a quartz window 50 by means of a laser detector 51 is provided above the vacuum container 1.

The dipole rings 13a, 13b have therebetween a slit through which movement of a wafer into/out of the vacuum container is performed through a gate valve 12 by a load lock mechanism and a carrying mechanism after the auxiliary magnets 23a, 23b are lifted to a position (shown in the dotted line).

Alternately, a mechanism which moves the second electrode vertically may be provided and a gate valve may be provided at a position where the gate valve is lowered to move a wafer into/out of the container, such that the electrode is lowered and the wafer is processed. Conversely, a mechanism may be provided which moves a wafer into/out of the container at a position where the electrode is lifted relative to the dipole rings.

As just described above, the arrangement of the dipole ring magnets results in a markedly uniform magnetic field between the opposite electrodes which produce a plasma and also provides a high magnetic field strength, for example, of up to several kilogausses, compared to the conventional apparatus. Thus, the plasma density and hence processing rate and characteristic are improved. The uniformity of a surface of wafer is further improved especially when the wafer has a large diameter. In addition, static break down of the MOS structure of a wafer which would otherwise be caused due to unevenness of the plasma is avoided, advantageously. Since the magnets are arranged around the outer periphery of the cylindrical side of the reactive container, the upper portion of the container (on the anode side) which is required to be opened in maintenance can be opened. This is also effective for monitoring the process or applying radio frequency power to the anode. Even when the magnets and a wafer are rotatable relative to each other to provide further uniformity, the movement of the magnets is not required in maintenance as is in the conventional apparatus with the magnet disposed on the anode side. Thus, the magnets are fixedly attached, for example, by a rail provided on the side of the reactive container and the apparatus is easy to handle.

A method of etching actually a silicon oxide film formed on a silicon substrate using the present apparatus will be now described.

Figure 36A:
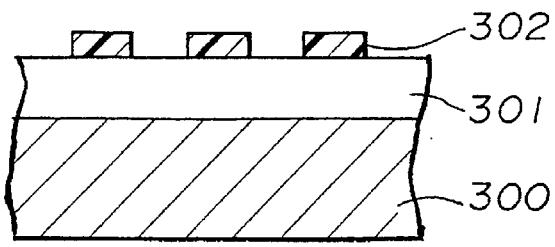
FIGS. 36(a) and 36(b) show an etching method using the etching apparatus of the eleventh embodiment.

First, as shown in FIG. 36(a), a 1000-nm thick silicon oxide film 301 is formed on a silicon substrate 300. Further, a resist pattern 302 is then formed on the silicon film 301. This half-finished product is handled as a wafer, which is carried through between the dipole rings 13a, 13b onto the second electrode 2 within the vacuum container 1 by a load lock mechanism (both, not shown) and a carrying mechanism and it is then locked by a static chuck (not shown).

The vacuum container 1 is evacuated to about $10^{-6}$ Torr through the evacuating system 6. A $CF_4$ gas is then introduced at a rate of 50 cc/min. from the feed system 4 into the container 1. A high frequency (rf) power of 200 W at 13.56 Mhz is applied across the first and second electrodes 7 and 2. The power density a unit area of the susceptor at this time is 0.6 W/cm$^2$. In this embodiment, the dipole rings 13a, 13b are not rotated. However, they may be rotated. The magnetic field strengths at this time within the dipole rings 13a, 13b are 200 G. The gas is then evacuated by a vacuum pump (not shown) through a baffle (not shown) whose opening is covered with a metal mesh to prevent a wraparound of the plasma into the opening, evacuating system 6 and a conductance valve whose discharge rate is adjustable with a variable opening percentage. The inner pressure of the chamber was set at 40 Mtorr by adjustment of the conductance value.

Figure 36B:
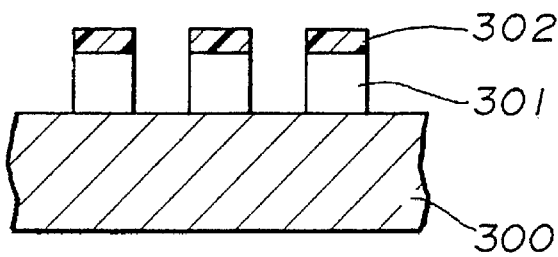

When etching is completed, supply of the high frequency power and the etching gas is stopped, the gas remaining in the chamber is evacuated, and the wafer is then taken out of the chamber by the load lock mechanism to thereby providing a satisfactory etched configuration of the wafer having a vertical cross section with high accuracy, as shown in FIG. 36(b).

In this way, processing is achieved without any dimensional conversion error. In addition, since the plasma density is maintained very high, the ion energy is suppressed low; high etch selectivity is obtained; and damage is reduced.

In order to etch the silicon oxide film, a gas including, for example fluorocarbon (CF), was used. In order to process the directivity of a resist, a gas including mainly oxygen may be used. Aluminum used for wiring purposes may be processed with high performance with a gas including chlorine mainly. The effects produced by the present invention were ascertained even in those modifications. Alternatively, etching may be achieved with a gas including at least a reactive gas such as a halogen element, oxygen, hydrogen or nitrogen.

The magnetic field strength is not limited to 200 gauss, and is selected suitably depending on a material to be etched, and a gas to be used.

Furthermore, it was recognized that a reduction in the inter-electrode spacing to about 20 mm resulted in a reduction in the discharge efficiency in the conventional apparatus while a reduction in the inter-electrode spacing to 8 mm under 1,600 gauss was achieved, so that an acceptable limit of the apparatus structure required for the flow of a gas was increased. In addition, the high frequency is not limited to 13.56 Mhz, but a relatively low frequency of about 100 Khz to 1 Mhz is effective for etching an oxide film which requires a relatively high ion energy although it depends on the etched material. In order to reduce the ion energy, the use of a high frequency of about 20–100 Mhz is effective for a material, which is required to have a satisfactory etch selectivity to the mask or the underlying material, such as phosphorus-doped polycrystalline silicon or an aluminum alloy. In either case, in a combination of the magnetic field strength, the ion energy, plasma density and other plasma parameters can be controlled.

As described above, the present invention is not limited to the embodiment and is applicable to various apparatuses.

Figure 44:
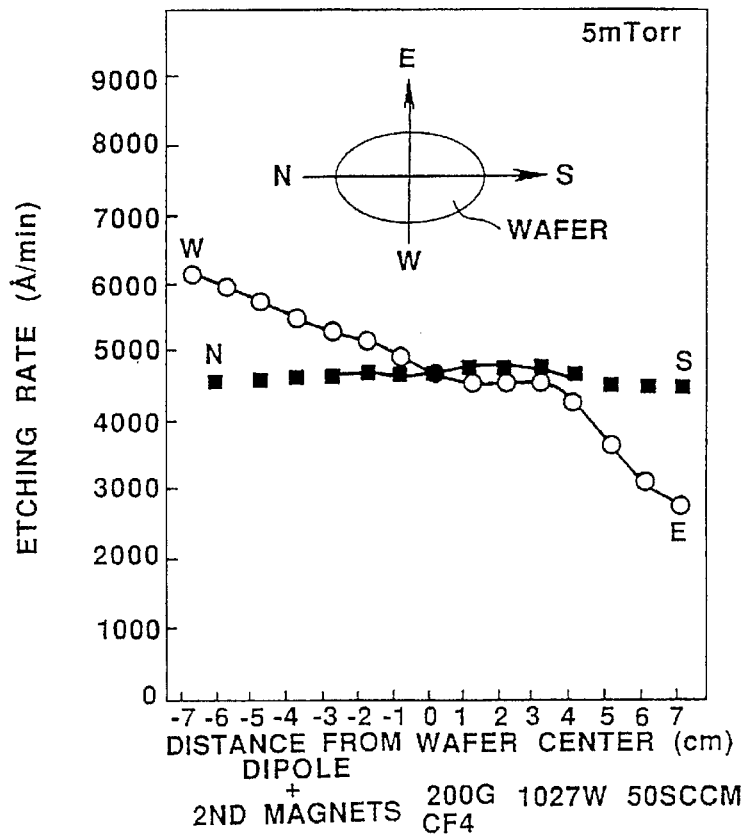
FIG. 44 shows the relationship between the distance from the center of a wafer in and the etching rate of an etching apparatus according to the eleventh embodiment of the present invention.
Figure 45:
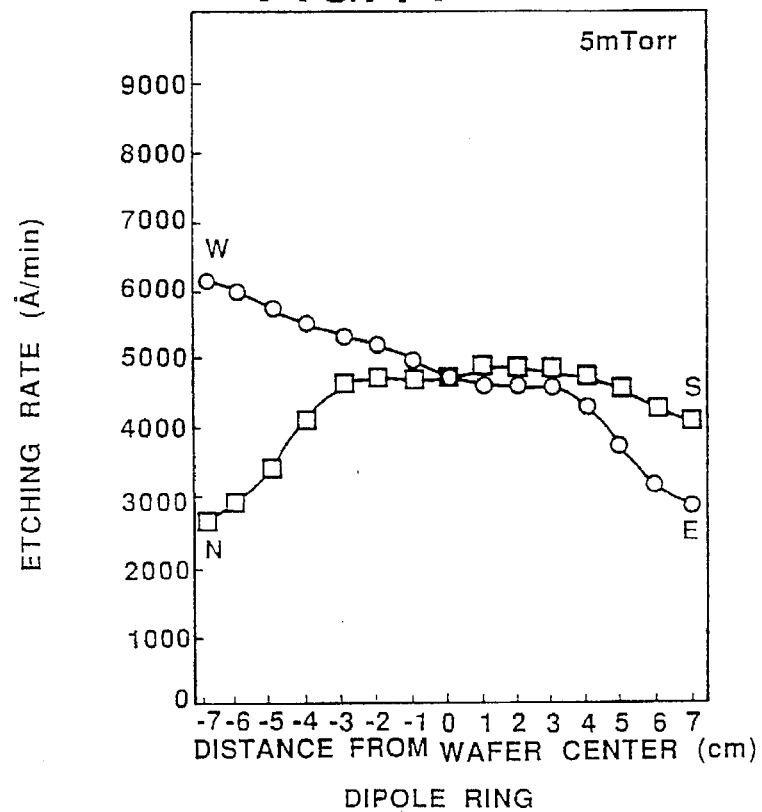
FIG. 45 shows the relationship between the distance from the center of a wafer in and the etching rate according to the conventional etching apparatus.

A wafer was empirically etched in the eleventh embodiment and the relationship between the distance from the center of the wafer and the etching rate was measured. As a result, it was found that uniformity of the etching rate was greatly improved in the N-S direction, as shown in FIG. 44. FIG. 45 shows the result of a similar experiment using the conventional etching apparatus with no magnetic field gradient for comparing purposes.

Figures 37A, 37B:
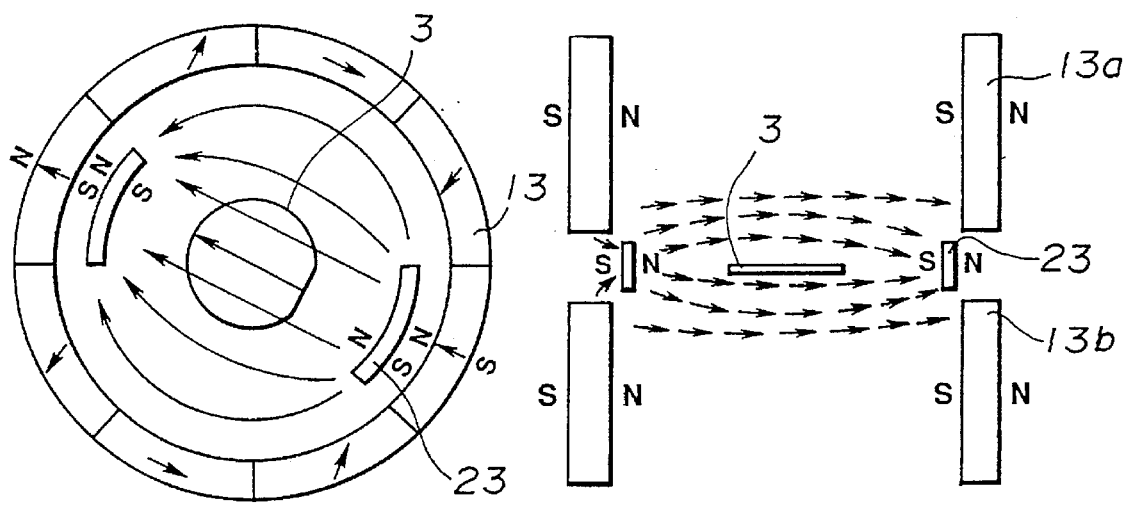
FIGS. 37(a) through 37(c) show a modification of the dipole ring.
Figure 37C:

While in the tenth embodiment, the two pairs of auxiliary magnets are provided, a modification may be such that as shown in FIGS. 37(a)–(c) a pair of auxiliary magnets 23 may be provided in the N-S direction in the magnetic field produced by the first magnetic generating means composed of dipole rings 13a, b. Also, in this case, a magnetic field is obtained which is parallel to a surface of a wafer 3 placed in the magnetic field. As shown in FIG. 37(c), the peripheral magnetic field is increased to thereby confine the plasma to within the magnetic field.

Figure 38A:
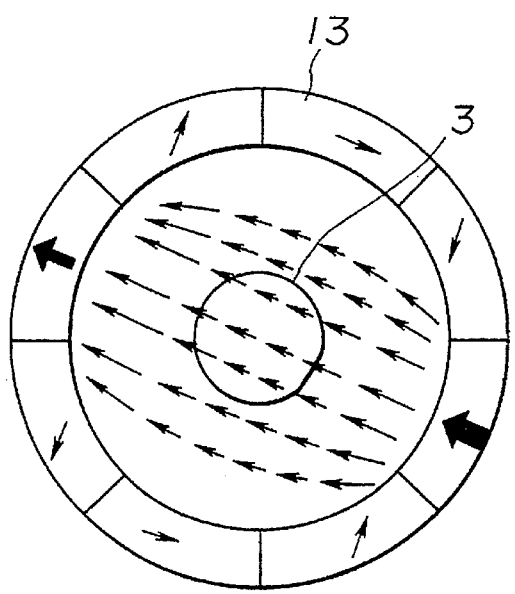
FIGS. 38(a) through 38(c) show another modification of the dipole ring.
Figure 38B:
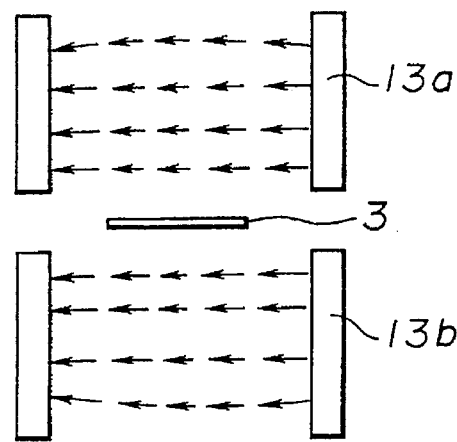
Figure 38C:
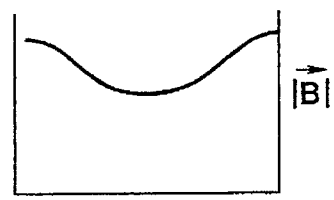

As shown in FIGS. 38(a)–(c), the magnets having the same direction of magnetization as the first magnetic field generation means are stronger in magnetic force than others. Thus, also in this case, a magnetic field parallel to the surface of the wafer 3 is obtained. The peripheral magnetic fields at those magnets are higher than the other field to thereby confine the plasma satisfactorily to within the magnetic field.

Figure 39A:
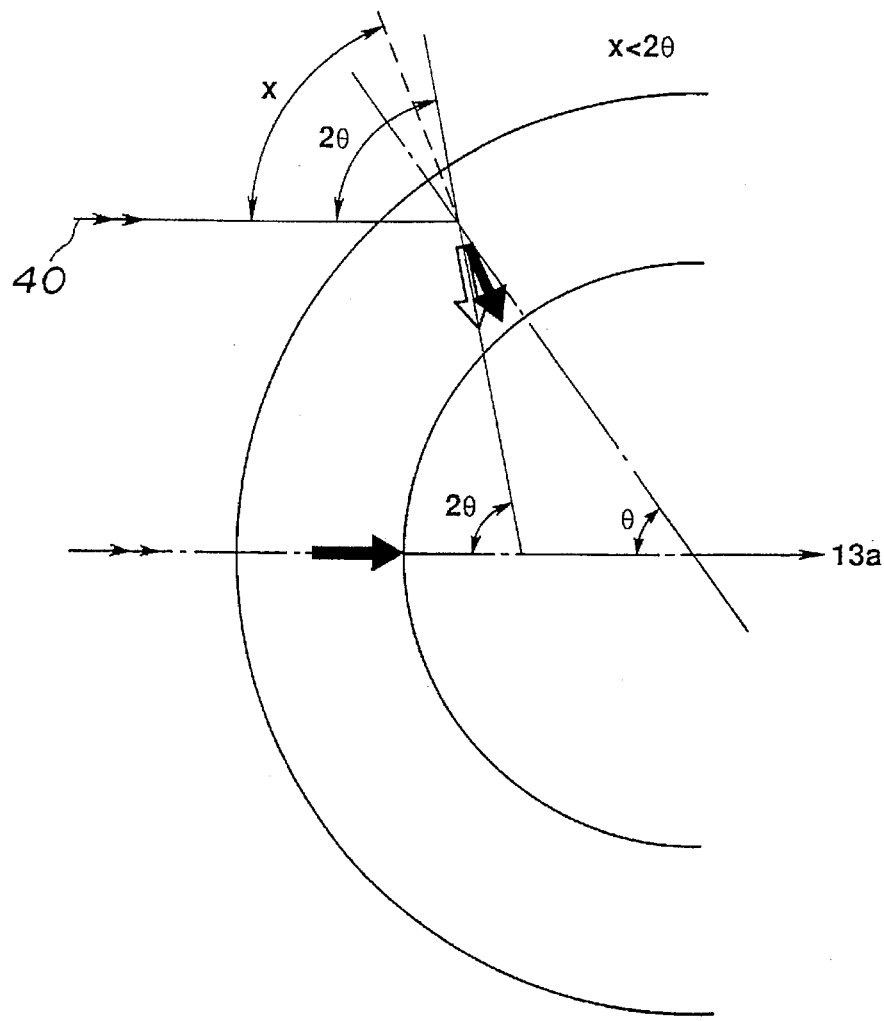
FIGS. 39(a) and 39(b) show still another modification of the dipole ring.
Figure 39B:
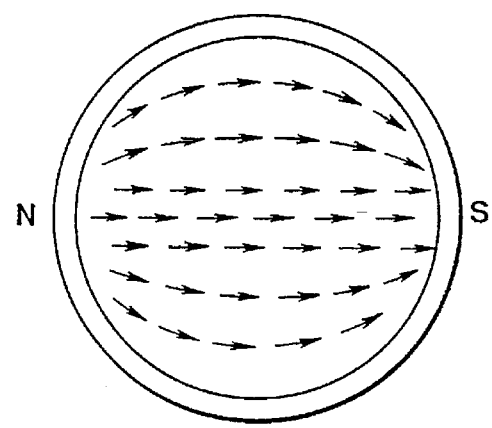

FIG. 39 shows a change in the angle of the magnets in the N-S direction and having the same direction of magnetization as the dipole rings of the embodiments. In the conventional dipole rings, the magnet disposed at θ to the direction of magnetization 40 has the direction of magnetization rotated by 2θ from the direction of magnetization 40. Magnetization in which the angle x<2θ, as shown in FIG. 39(a) increases the magnetic field in the direction of connection of the magnetic poles to thereby confine the plasma, as shown in FIG. 39(b).

FIGS. 40(a), 40(b) show the arrangement of three dipole rings 13p, 13q and 13r having the same structure and same central axis with the upper and lower dipole rings 13p, 13r having the direction of magnetization rotated 180 degrees from that of the intermediate ring 13q. A wafer 3 is placed in the magnetic field produced by the intermediate ring 13q. According to this arrangement, the magnetic field from the intermediate ring is canceled partly at the center of the wafer by the magnetic fields generated by the upper and lower dipole rings 13p, 13r, so that the central magnetic field is weaker than the peripheral one to thereby confine the plasma satisfactorily.

FIGS. 41(a), 41(b) show a modification where the shapes of magnets constituting a dipole ring are successively changed such that the magnets at N and S poles are longest. Thus, the magnetic field densities at the N and S poles are maximum to thereby confine the plasma satisfactorily. Even if the length of the magnets at the N and S poles is minimum, confinement of the plasma on the wafer is achieved satisfactorily. If a longer magnet is thinner, and a shorter magnet is thicker to make the respective strengths of the magnets equal, a leakage magnetic field is reduced.

Figure 42:
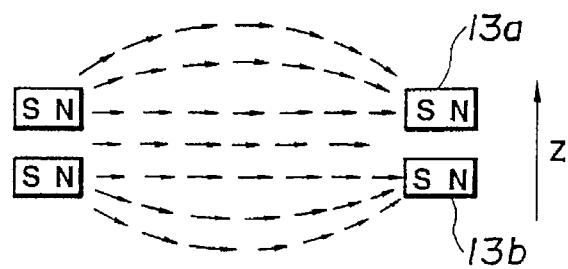
FIG. 42 shows a modification of the dipole ring.

FIG. 42 shows a structure of two stacked dipole rings having a minimum dimension in the Z direction to thereby increase the peripheral magnetic density. By all those structures, plasmas can be confined more or less.

A twelfth embodiment of the present invention will next be described where the respective magnetic strengths of the magnets which constitute a dipole ring are changed with a gradient of magnetic field strength in the E-W direction to thereby provide a gradient of the electron density positively.

Figure 43A:
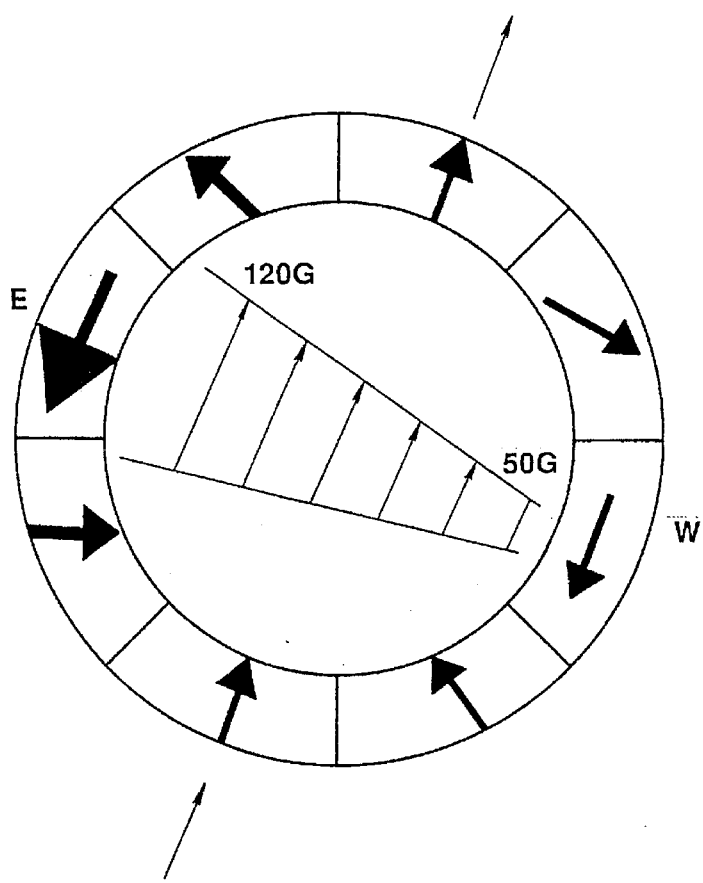
FIGS. 43(a) and 43(b) show a dipole ring according to the twelfth embodiment.
Figure 43B:
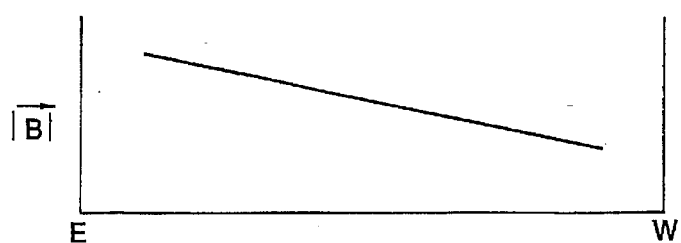

In FIGS. 43(a), and 43(b), the magnetic field strengths of the magnets of a dipole ring are larger in the vicinity of the E pole and smaller in the vicinity of the W pole such that there is a gradient from the E to the W to thereby prevent collection of electrons in the plasma near the W pole and hence an increase in the local reactivity.

The remaining structure is the same as the corresponding one of the previous embodiments.

Figure 46:
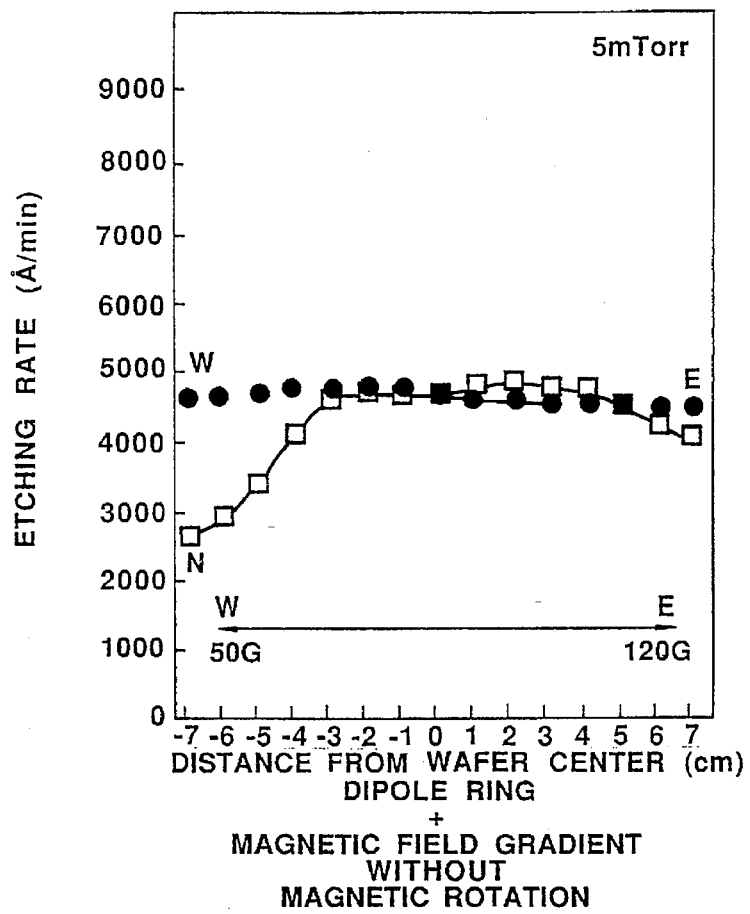
FIG. 46 shows the relationship between the distance from the center of a wafer and the etching rate when etching is performed using a dipole ring according to the twelfth embodiment of the present invention.

A wafer was etched by this apparatus under the same conditions as in the eleventh embodiment and the relationship between the distance from the wafer center and the etching rate was measured. As a result, it will be understood that the etching rate is uniform in the W-E direction, as shown in FIG. 46. FIG. 45 shows the result of a similar experiment using a conventional etching apparatus with no gradient of magnetic field strength for comparing purposes. Preferably, correction to both the lengths of the magnets and the gradient of the magnetic field strength in the E-W direction improves both the uniformity of the etching rates in the N-S and E-W directions.

According to this apparatus, processing without dimension conversion errors is achieved. In addition, since the plasma density is maintained very high, the ion energy and hence damage are suppressed low.

Figure 47:
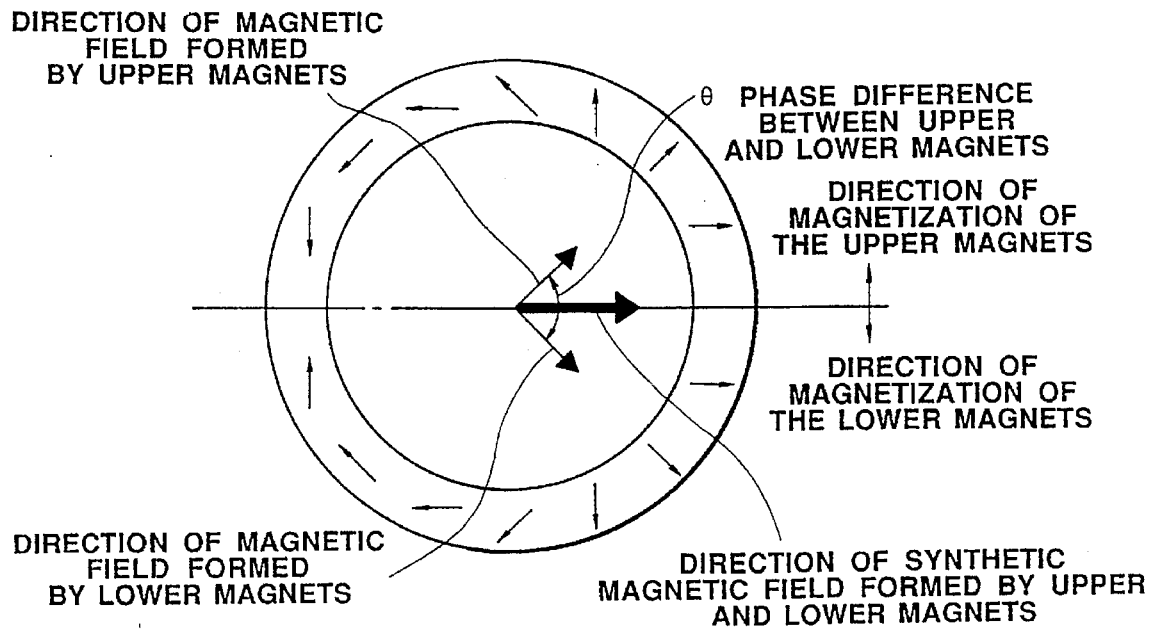
FIG. 47 shows the relationship between the difference in phase between the upper and lower dipole rings and a magnetic field synthesized from the magnetic fields of the upper and lower dipole rings.

While in the eleventh embodiment the upper and lower dipole rings having the same direction of magnetization are rotated synchronously, the upper and lower dipole rings may have a phase difference such that the synthetic magnetic field has a given direction, as shown in FIG. 47.

Figure 48:
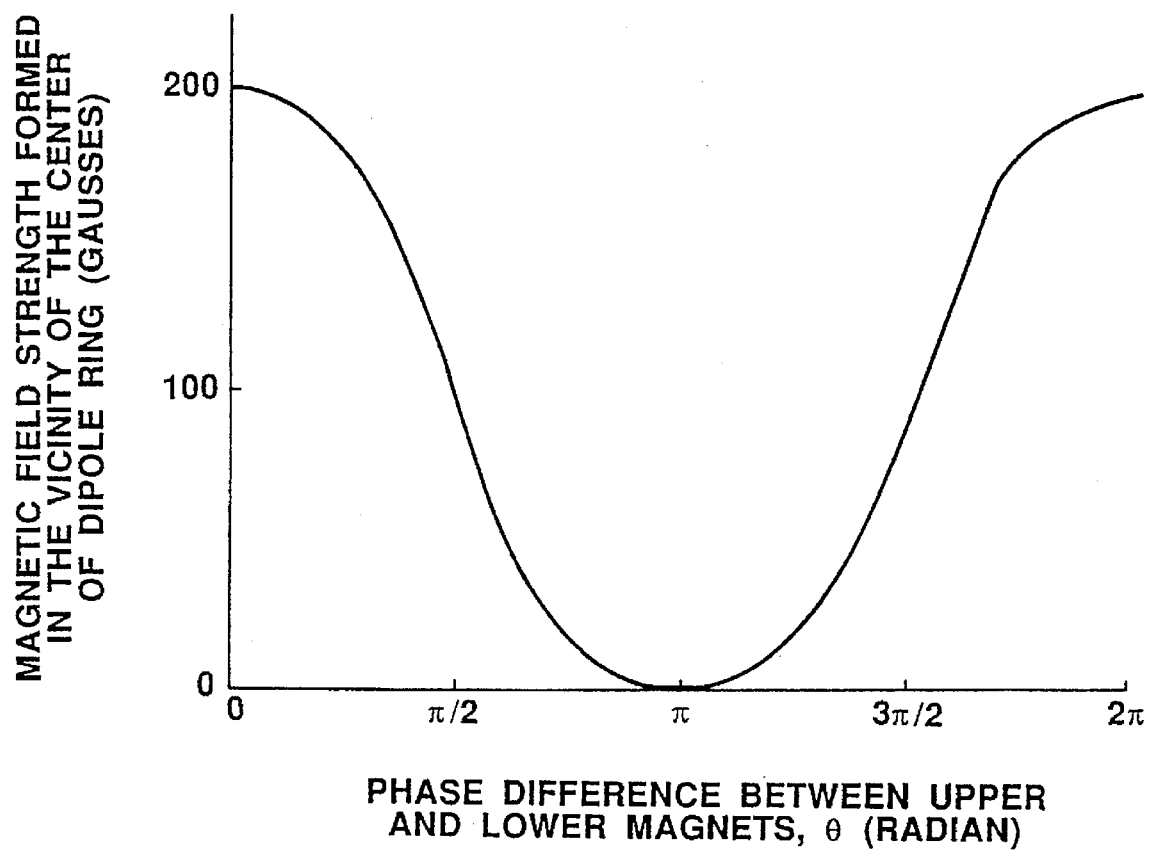
FIG. 48 shows the relationship between the difference in phase between the upper and lower dipole rings and the magnetic field strength.

FIG. 48 shows the result of measurement of the relationship between the magnetic field strength and the difference in magnetization direction between the upper and lower magnets. The provision of the upper and lower dipole rings having a different phase difference therebetween serves to adjust the magnetic field strength. Although the required magnetic field strength varies depending on a process to be performed, control of the phase difference by a set of magnets provides a required magnetic field.

Figure 49A:
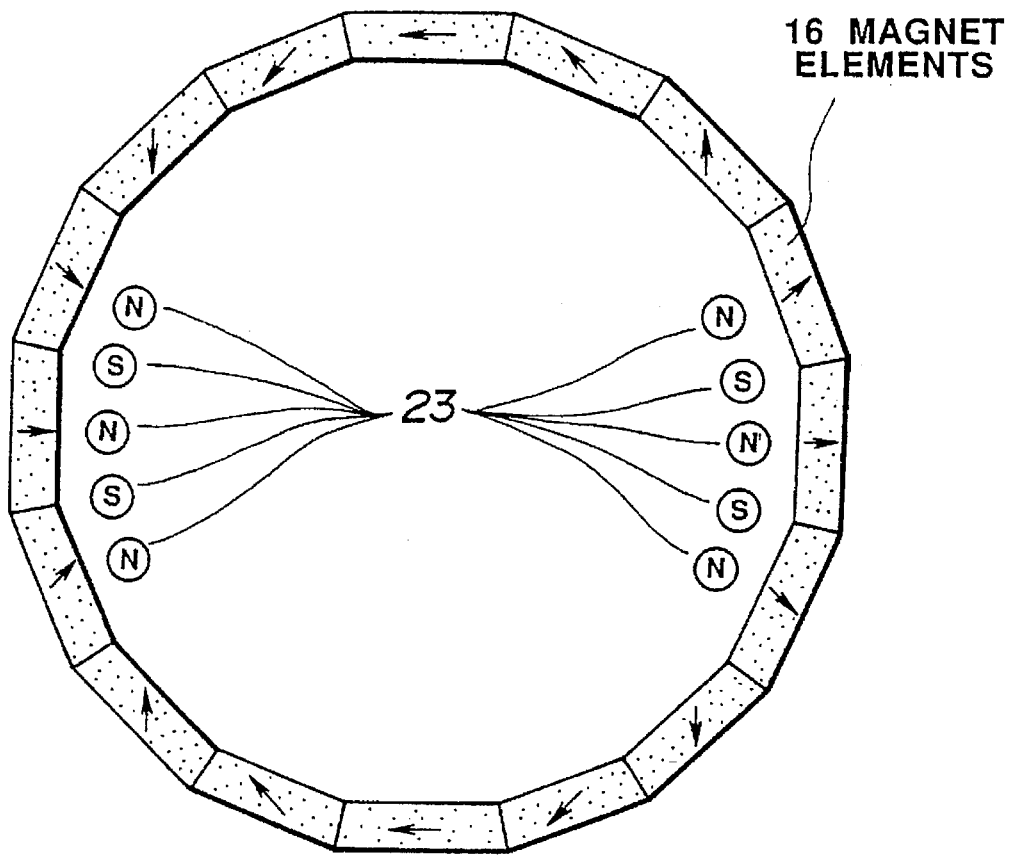
FIGS. 49(a) and 49(b) show a modification of the dipole ring.
Figure 49B:

FIG. 49 shows a modification of the eleventh embodiment where two groups of opposing auxiliary magnets 23 alternate in magnetization direction are arranged in the magnetic field of the magnets constituting a dipole ring 13 to thereby increase the magnetic field strengths in the peripheral portions of a wafer to confine a plasma and hence compensate for a possible decrease in the etching rate there. When in the present arrangement the dipole ring is rotated relative to the substrate to be processed since the two groups of auxiliary magnets are provided in the N-S direction which is the magnetized direction of the dipole ring, either the auxiliary magnets may be rotated in phase with the dipole ring or the auxiliary magnets may be rotated with only the dipole ring fixed.

Figure 50A:
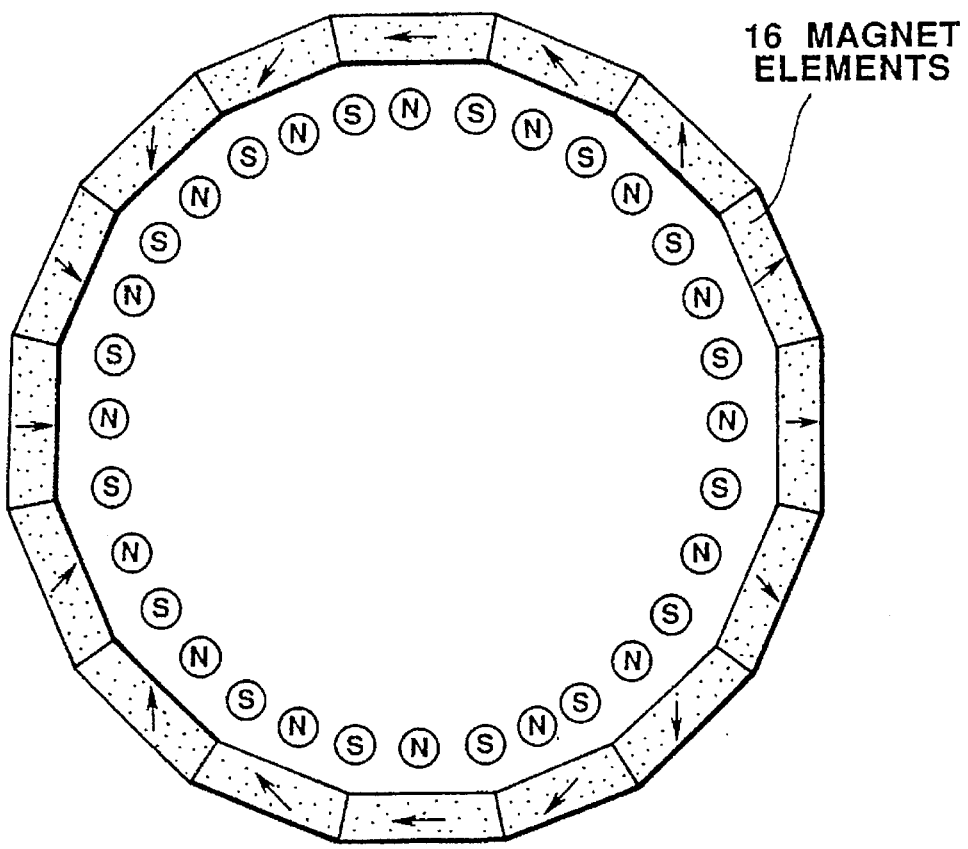
FIGS. 50(a) and 50(b) show another modification of the dipole rings.
Figure 50B:
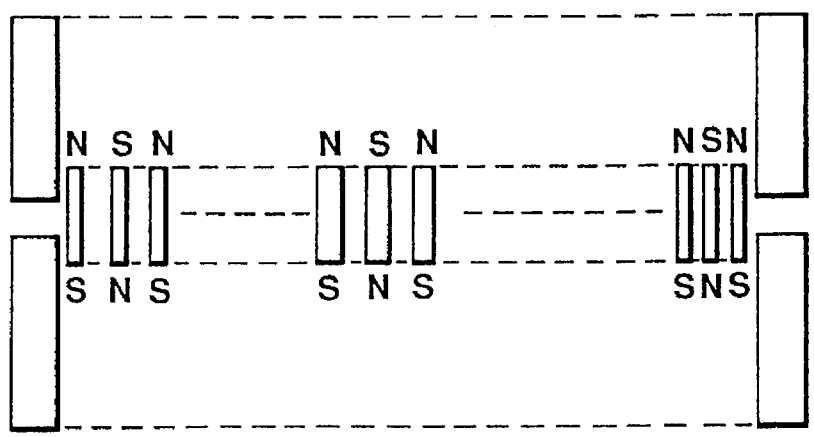

Similar effects will be produced by a ring arrangement of a plurality of auxiliary magnets 23 alternate in polarity within a dipole ring 13, as shown in FIG. 50. In this case, the plurality of auxiliary magnets 23 is not required to be rotate, for example, may be fixed to either the inner or outer wall of the vacuum container even when the dipole ring 13 is rotated.

According to the present invention, improvements to the film forming speed and uniformity of magnetic field strength, reduction in damages, and the formation of a high density plasma are achieved. Since the decomposition and reaction of a gas in the gaseous phase advance, the quality of the formed film is improved.

The thirteenth embodiment of the present invention will be described in which a magnetron RIE layer provided with dipole ring magnets capable of changing a slit width therebetween is used. Etching is performed while the slit width is changed.

Figure 51:
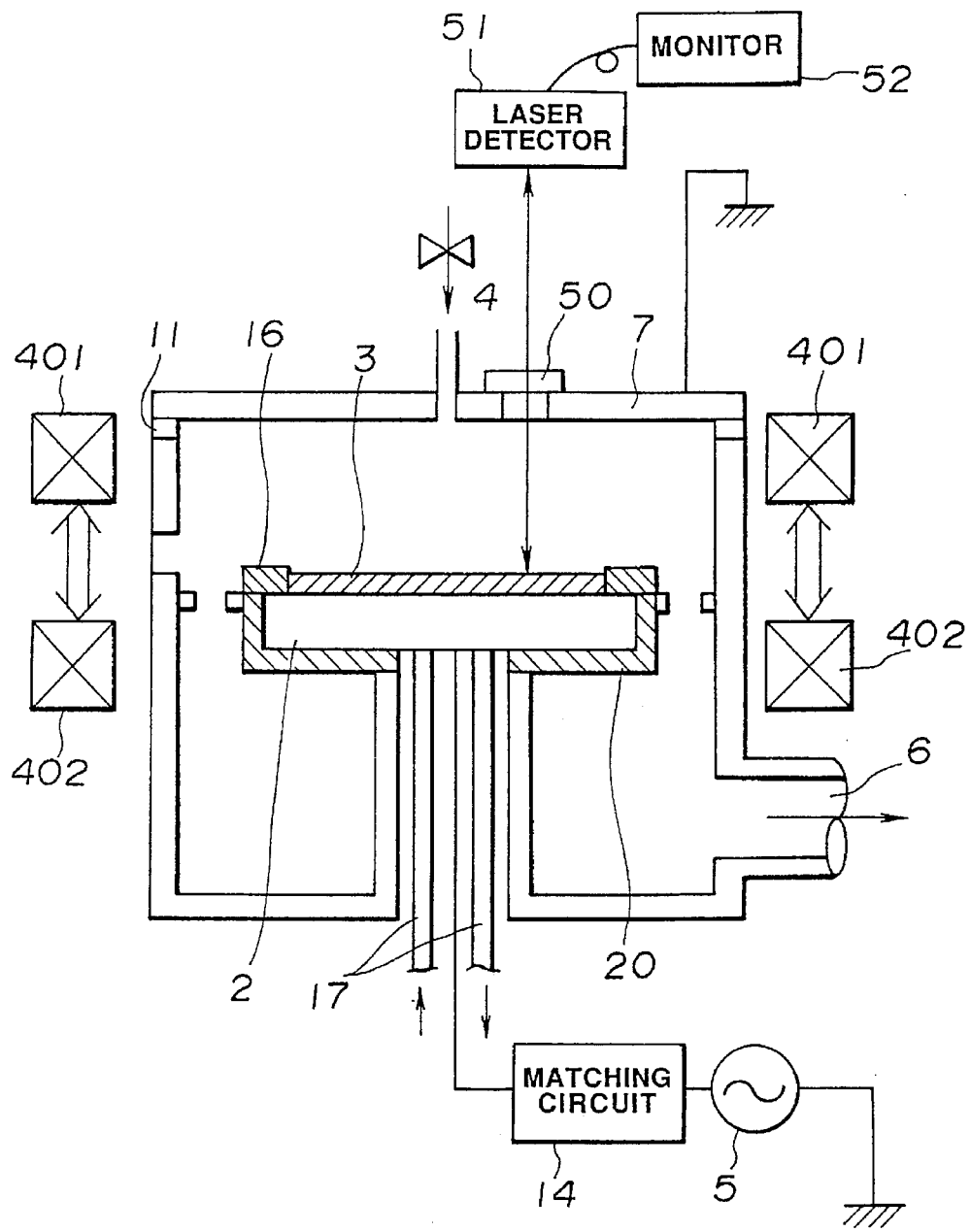
FIG. 51 shows an etching apparatus according to the thirteenth embodiment of the present invention.
Figure 53A:
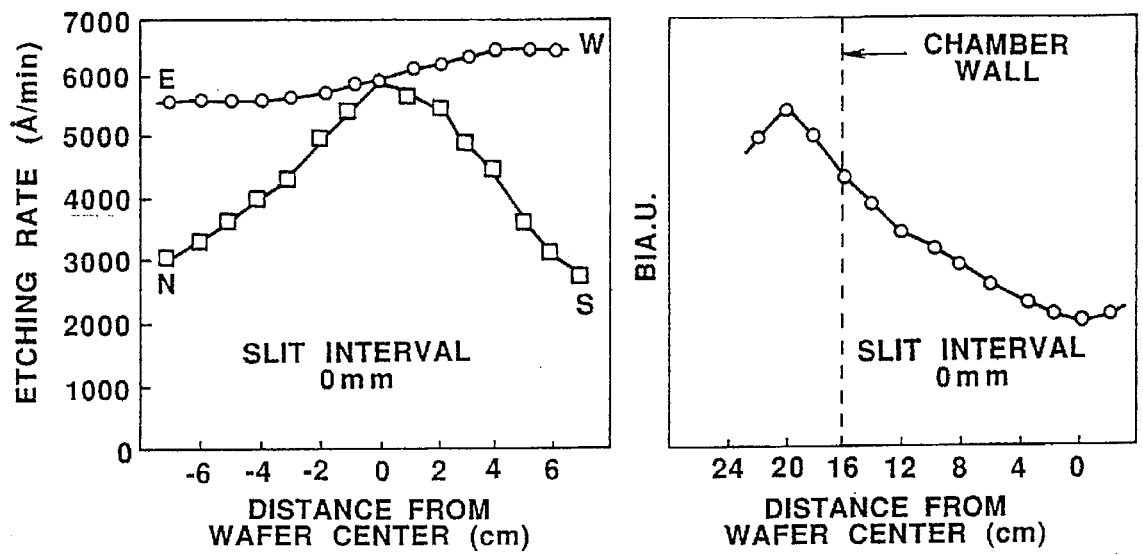
FIGS. 53(a) and 53(b) show the distribution of the etching speed in the surface of a wafer using the etching apparatus of the thirteenth embodiment.
Figure 53B:
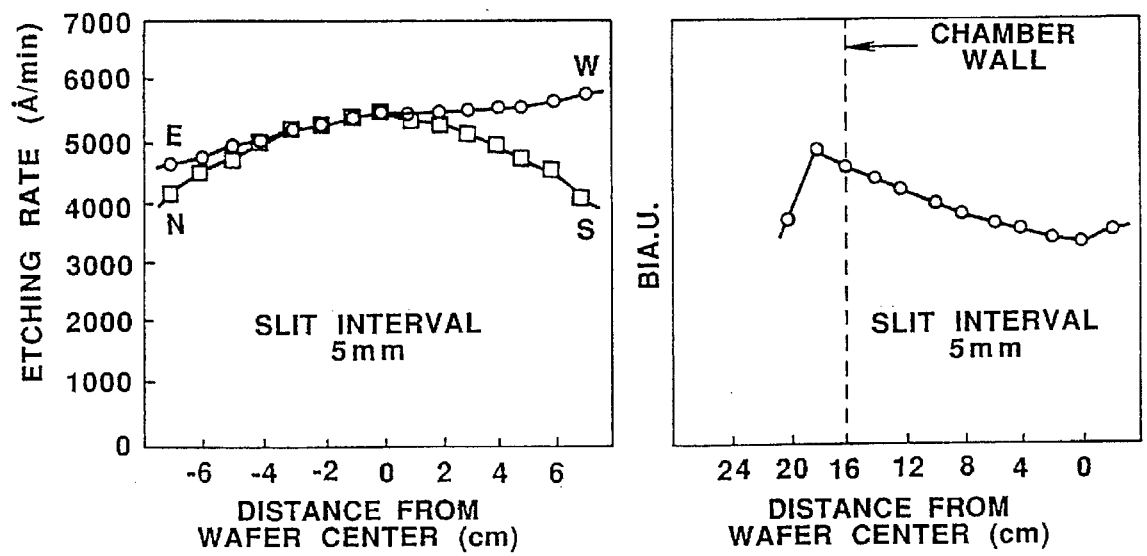
Figure 54A:
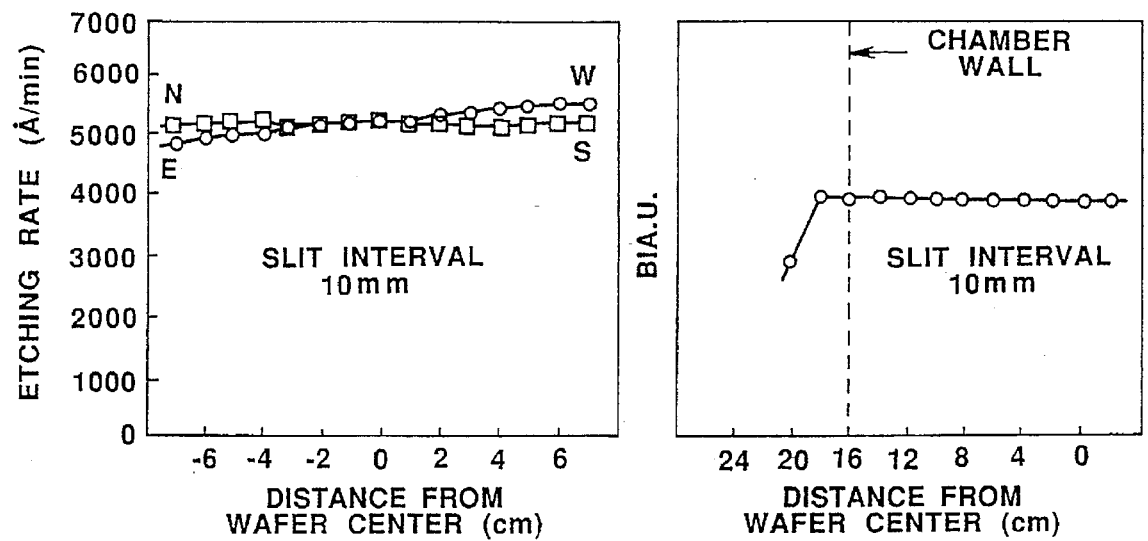
FIGS. 54(a) and 54(b) show the distribution of the etching speed in the surface of a wafer using the etching apparatus of the thirteenth embodiment.
Figure 54B:
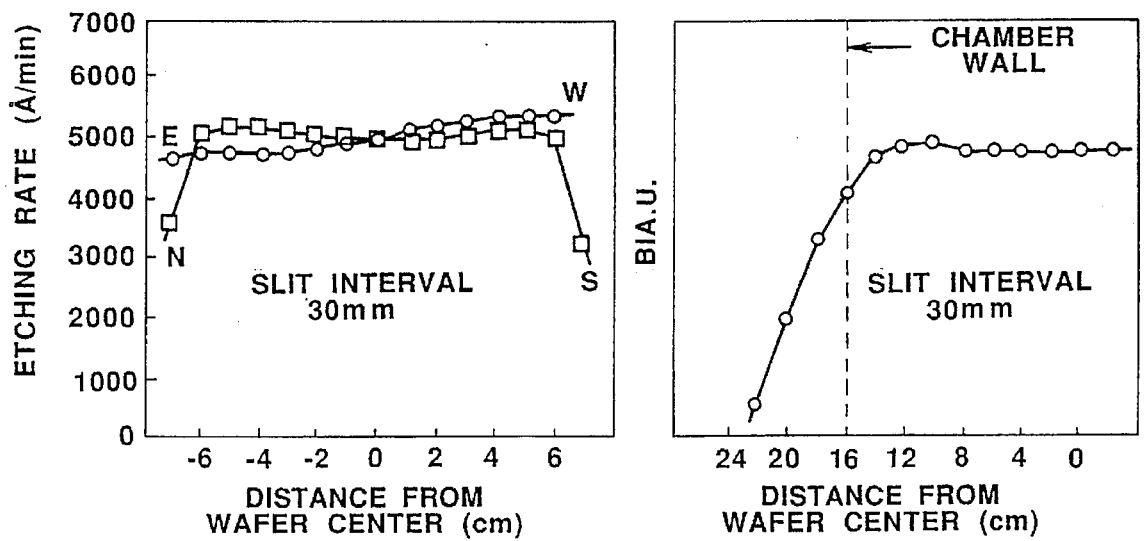

Referring to FIG. 51, dipole rings 401 and 402 are movable vertically to set the interval therebetween at a desired value. A test wafer comprises a silicon substrate and a 1,100 nm thick oxide film formed thereon is fed onto a cathode electrode 2 in a etching chamber (vacuum container) 1 by a load lock mechanism (not shown) and is fixed by a electrostatic chuck (not shown). After setting the slit width between the dipole rings 401 and 402 at a desired value, $CF_4$ is fed into the chamber 1 at a flow rate of 100 SCCM and the internal pressure of the chamber 1 is adjusted to be 0.5 Mtorr. A high frequency power of 13.56 Mhz is applied to the cathode electrode 2 with an electric power of 2.7 W/cm$^2$. The etching is performed for 60 seconds. The etched wafer is then taken of the chamber 1 by the load lock mechanism and the distribution of the etching rates on the etched wafer surface are measured. FIGS. 53 and 54 show distribution of etching rates in the wafer with respect to the slit width. FIG. 53(a) shows distribution of the etching rates for a zero slit width. Since the magnetic field in the chamber 1 becomes a mirror magnetic field when the slit width is zero, the etching rate at the center of the wafer is very high compared with the periphery of the wafer. FIG. 53(b) shows the distribution for 5-mm slit width. As the small slit width is provided, the mirror magnetic field weakens so that the concentration to the center of the wafer weakens. As a result, uniformity of the distribution becomes improved compared with zero slit width although the etching rate is still high at the center. FIG. 54(a) shows the distribution for 10-mm slit width. In this case, the magnetic field strength in the chamber 1 is substantially uniform and the uniformity of the etching rate distribution is greatly improved. FIG. 54(b) shows the distribution for 30-mm etching interval. In this case, although the magnetic field strength is uniform in a region directly above the wafer, it decreases in a region near the inner chamber wall. This causes the etching rate to be decreased in the vicinity of the wafer periphery. The optimum slit width varies depending on the factors such as the inner diameter of the chamber and the dipole rings as well as the strength and shape of magnet elements constituting the dipole rings. Therefore, by selecting the slit width considering the foregoing, uniform etching can be performed.

A fourteenth embodiment of the present invention will be described in which a dividing member for dividing the space in the vacuum container is provided around the outer periphery of a wafer to be processed.

Figure 55:
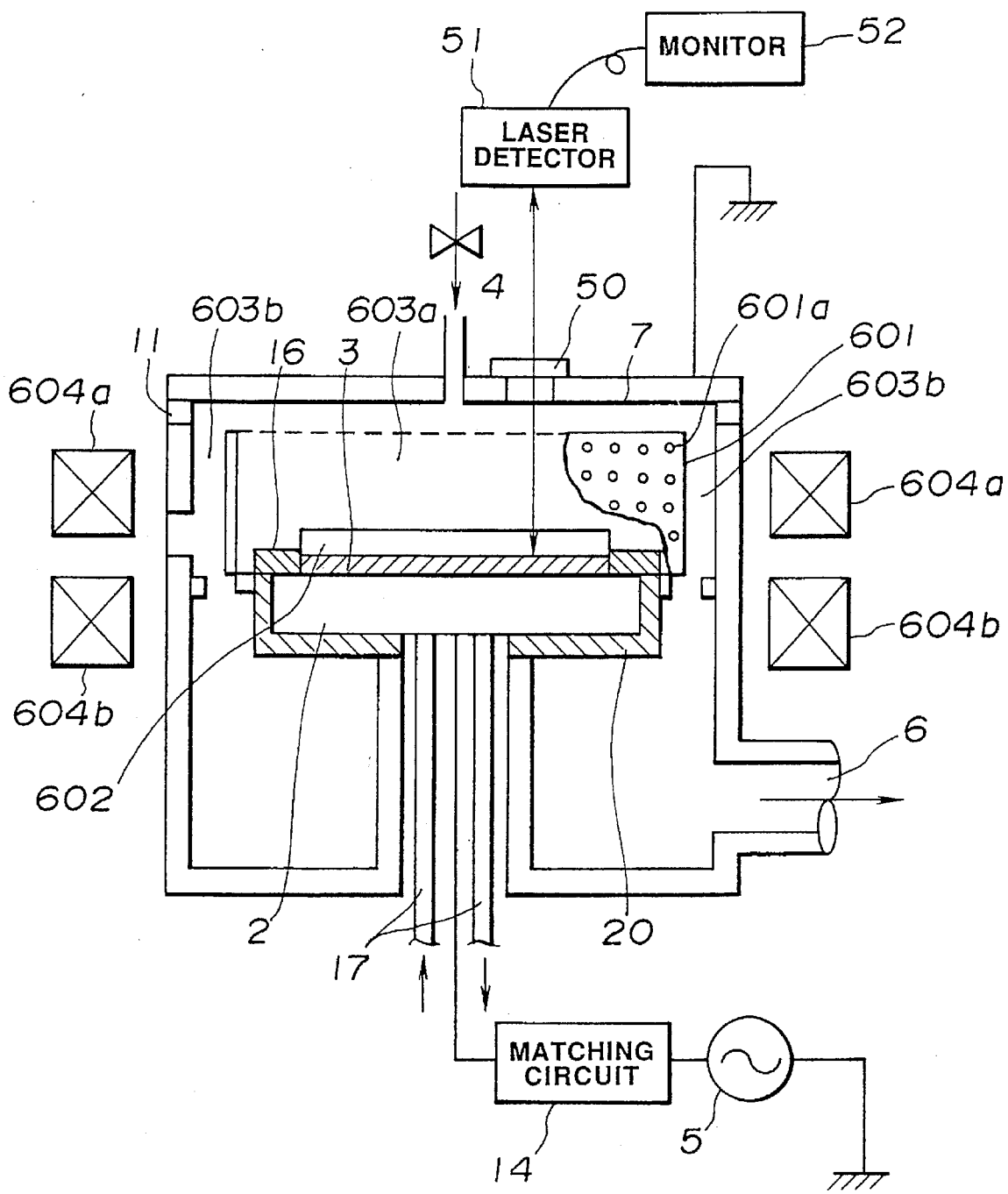
FIG. 55 shows an etching apparatus according to the thirteenth embodiment of the present invention.

Referring to FIG. 55, a dividing member 601 takes the form of a hollow cylinder and is provided such as to surround a cathode 3 on which the wafer is placed. The dividing member 601 divides the inner space of the container Into a region 603a where the wafer 602 is placed and a region 603b where no substrate to be processed is placed. The dividing member 601 is made of a porous material with pores 601a having a diameter of approximately 5 mm through which gas is evacuated out of the region 603a. The dividing member 601 may be made of a net with mesh of approximately 1 mm. The material of the dividing member 601 may be selected among metals such as aluminum whose surface is almetized and insulating materials such as ceramics. When the dividing member 601 is made of a metal, it may be grounded or kept at a predetermined potential.

Figure 52:
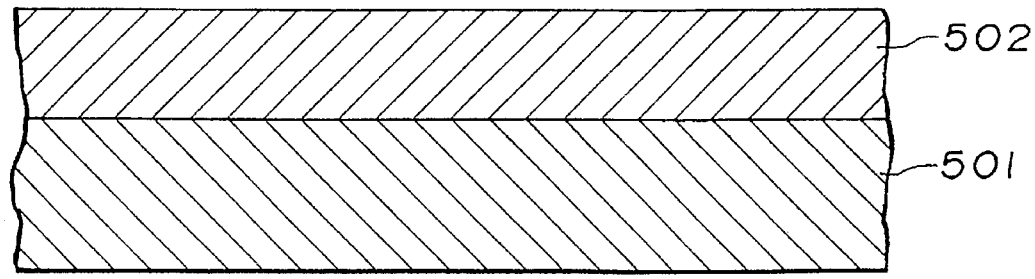
FIG. 52 shows a substrate to which etching is performed by the etching apparatus of the thirteenth embodiment.

Etching of the wafer 602 by using this apparatus will be described next. The wafer 602 comprising a silicon substrate 501 and a 1100-nm thick oxide film 502 formed thereon as shown in FIG. 52 is conveyed from a load chamber (not shown) onto a cathode electrode 2 within the etching chamber (vacuum container) 1 and fixed by a electrostatic chuck (not shown). After setting the slit width between the dipole rings 401 and 402 at a desired value, $CF_4$ is fed into the chamber 1 at a flow rate of 100 SCCM and the internal pressure of the chamber 1 is adjusted to be 0.5 Mtorr. A high frequency power of 13.56 Mhz is applied to the cathode electrode 2 with an electric power of 2.7 W/cm$^2$. The etching is performed for 60 seconds. The etched wafer is then taken of the chamber 1 by the load lock mechanism and the distribution of the etching rates on the etched wafer surface are measured.

Figure 56A:
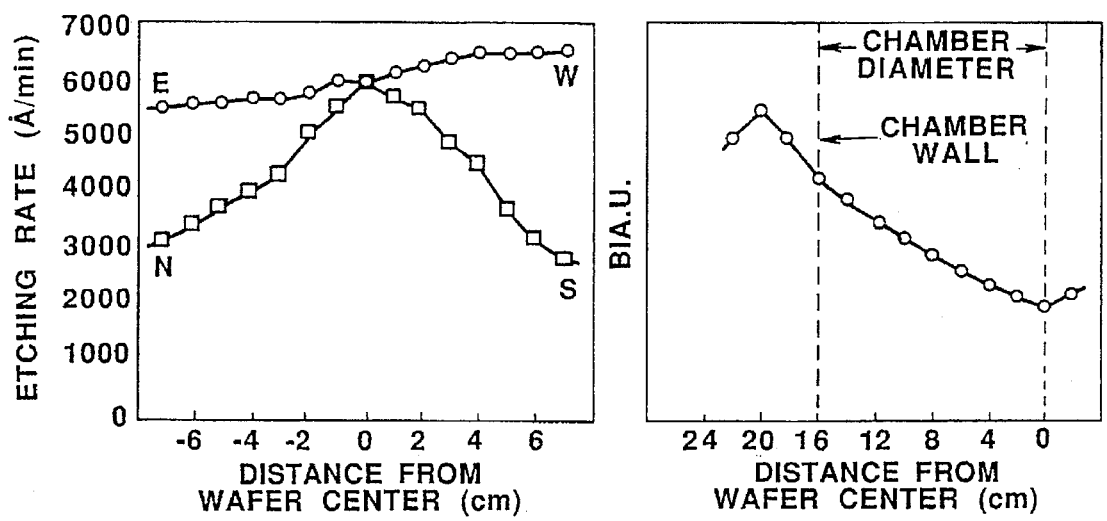
FIGS. 56(a) through 56(c) show the distribution of the etching speed in the surface of a wafer using the etching apparatus of the fourteenth embodiment in comparison with the distribution using the conventional apparatus.
Figure 56B:
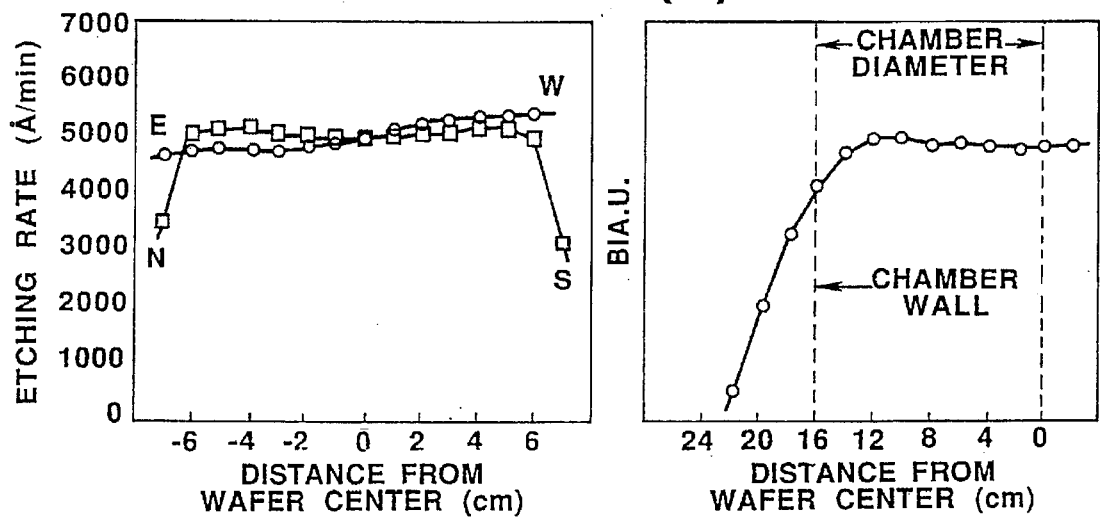

FIG. 56(a) shows the etching rate distribution for zero slit width between the dipole rings 604a and 604b in which the magnetic filed in the chamber 1 ia a mirror magnetic field so that the density of plasma at the center of the wafer 602 is high and the etching rate at the center of the wafer 602 is very high compared to the periphery of the wafer 601. FIG. 56(b) shows the etching rate distribution in which a slit is provided between the dipole rings. In this case, no mirror magnetic field is formed and the etching rate is uniformly distributed around the center of the wafer. However, the magnetic field strength is greatly reduced near the inner wall of the chamber due to the slit so that the etching rate is reduced near the inner wall.

Figure 56C:
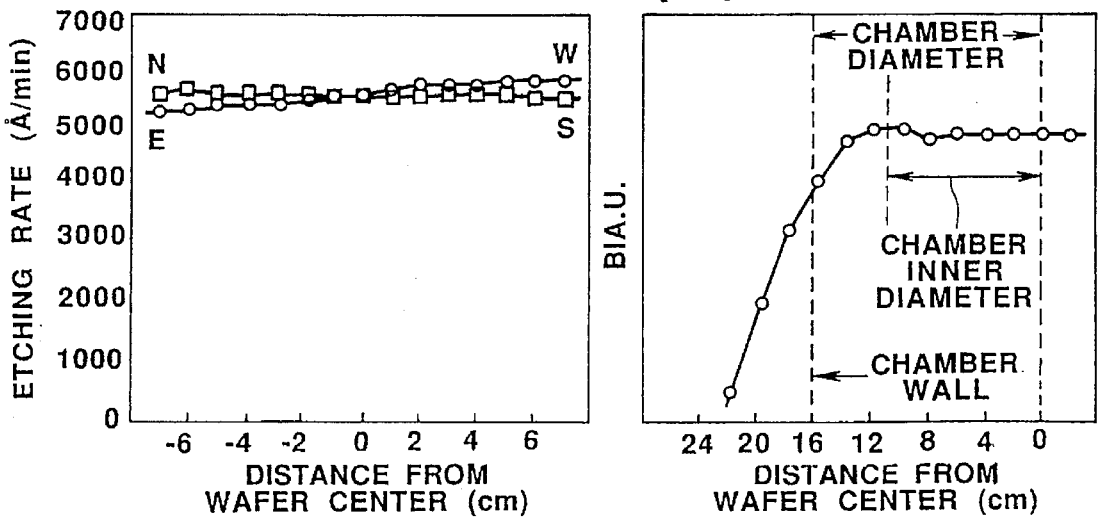

Then, the wafer 602 is etched by the magnetron RIE apparatus having the dividing member 601 and a slit between the dipole rings 604a and 604b as shown in FIG. 55. The dividing member 601 is arranged such that electric discharge takes place only in a limited region of directly above the wafer 602 and where the magnetic field strength formed by the dipole rings is uniform. FIG. 56(c) shows the distribution of etching rate in the wafer surface in this etching process. In this case, etching is performed only in the space where a uniform magnetic field is present even in the etching at a low pressure of approximately 0.5 m Torr and is not influenced at all by the reduction in the magnetic field in the vicinity of the inner wall of the chamber.

In the above two embodiments, $CF_4$ is used as a reactive gas. However, $CF_4/H_2$ may be used.

Although the dipole rings are provided outside the vacuum container in the above embodiments, it may also be provided inside the container.

The present invention is applicable not only for processing electric parts directly, but also for film formation and surface processing on electric parts formed on a substrate and for film formation and surface processing for lead electrodes to be connected to underlying eclectic parts on the substrate. The electric parts are not limited to MOS structures, but include any electric parts such as pn junction structure, transistors and capacitors having various structures which have electrical functions and are likely to be damaged by voltage and electric current applied thereacross and flowing therethrough.

Another application of the present invention includes the implantation of impurities into a substrate. A gas which contains boron such as $BF_3$ gas is fed into a parallel-plate type plasma apparatus for generating plasma therein. The gas is dissociated in the plasma and B atoms are implanted into the substrate. At this time, since a great number of F atoms are present, the gas pressure is reduced to $10^{-5}$ Torr to prevent the etching. By applying the magnetic field as in the present invention, plasma is generated even at a low gas pressure and the energy of ions is suppressed to a level about several tens to 300 Ev so that a very shallow impurity layer can be formed. In this embodiment, uniformity of the magnetic filed and reduction of damage are also realized.

While the present invention was described with respect to the embodiment of the magnetron plasma processing apparatus and method which mainly handles etching, CVD, film formation by sputtering, impurity implantation, using a dipole ring, the present invention is not limited to the embodiment, and is applicable to other processes and apparatuses which use other magnetizing plasmas. For example, the magnetic field strength is selected in a range of scores -thousands of gauss, depending on a process effected.

The present invention is usable in plasma CVD apparatuses; sources of plasma ions for apparatuses which improve wafer surfaces using a plasma, and for ion implantation apparatuses; apparatuses which generate ECR or Whistler (Helicon) wave plasmas and use them as sources of plasma, electrons, ions or neutral active seeds.

In the arrangements, a high frequency or direct current power may be applied to the individual first and second electrodes. While the high frequency used was 13.56 Mhz in many cases, such frequency may be selected in a range of a low frequency of about 100 Khz to a higher frequency of several hundreds of Mhz depending on application to thereby adjust the magnetic field strength and ion energy.

Concerning a pair of opposing two magnet elements in the dipole ring, one of the opposing magnet elements is not necessarily positioned at the opposing position (180 degree rotating position) of the other one of the opposing magnet elements as long as the direction of the magnetic field at the opposing position is equal to the magnetization direction of the other one of the magnet elements. For example, it may be so arranged that the direction of the synthetic magnet field generated by two magnet elements adjacent to the opposing position is equal to the magnetization direction of the other one of the magnet elements.

When a small magnet is used in order to decrease the size of the apparatus, there arises a problem that the magnetic field generated by the magnet is likely to become nonuniform. As described above, however, this nonuniform magnetic field can be compensated for by providing a slit in the magnet.

Specifically, by forming a slit in the magnet, the magnetic field strength decreases around the peripheries of a wafer through the inner wall of the chamber (Refer to FIGS. 53(a), 53(b), 54(a) and 54(b) and the description relating thereto). However, in order for a wafer to pass through the slit during the transportation of the wafer, the slit should have a width of 3 cm or greater as described in the description relating to FIG. 6. However, with the slit of 3-cm width, the magnetic field in the peripheries of the wafer becomes weaker as shown in FIG. 54(b), thereby to cause problems such as lowering of the etching rate in the peripheral portions of the wafer.

The problems become more serious as the chamber and the dipole ring magnet become larger to cope with an increased size of a wafer having a diameter as large as 12 inches.

Figure 62:
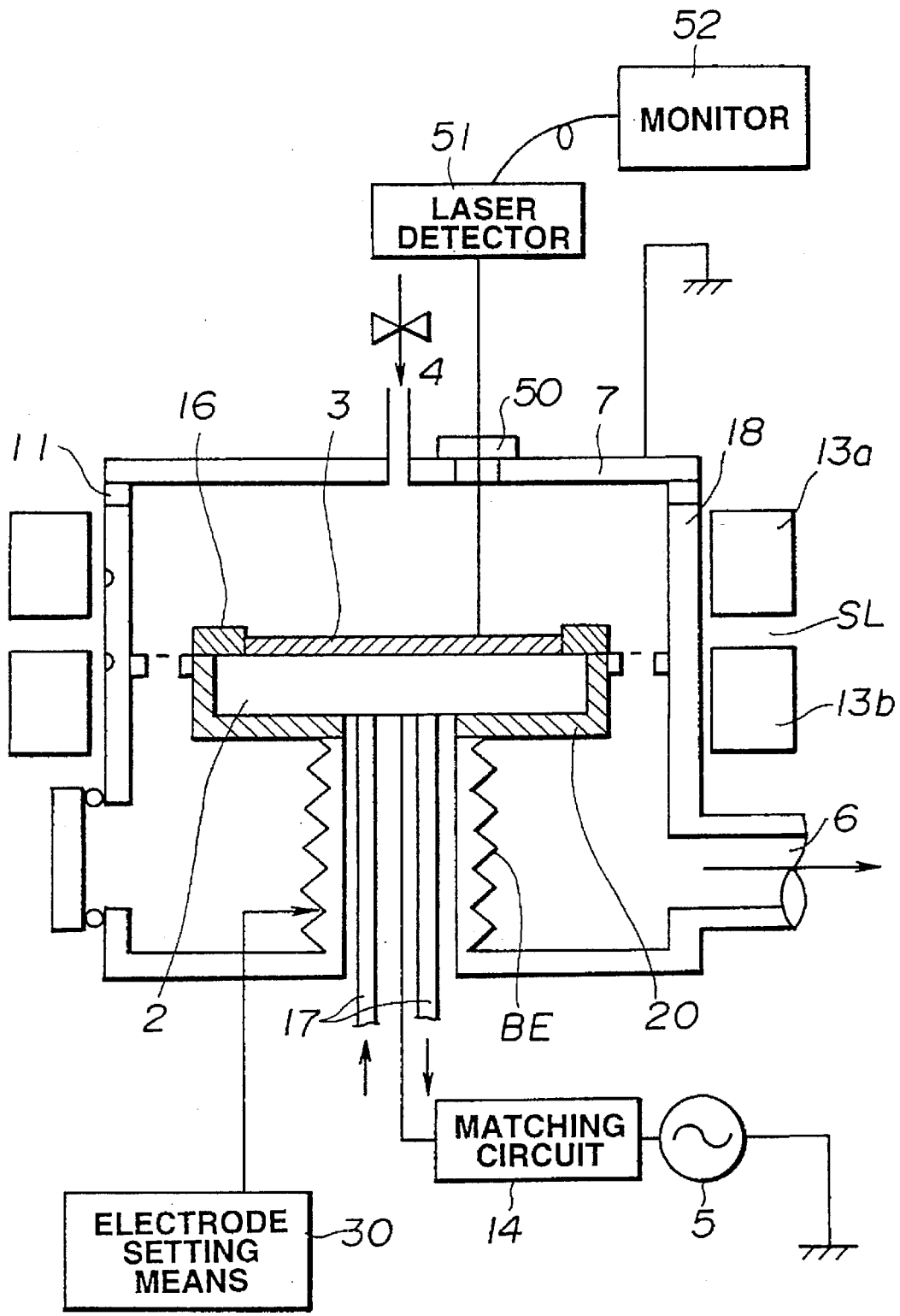
FIG. 62 shows another embodiment of a surface processing apparatus.

By constructing the apparatus as shown in FIG. 18 in which a wafer is transported through the lower portion of the chamber, the wafer is not necessary to pass through the slit and therefore the width of the slit does not have to be as large as 3 cm. In this apparatus, the slit can be designed freely so that it is constructed such as to generate a uniform magnetic field. FIG. 62 illustrates an example of such a surface processing apparatus. In FIG. 62, same reference numerals or symbols are assigned to the same components in FIG. 18.

In the apparatus of this type where a transportation path of wafers is provided at a lower porion of the apparatus, it is necessary to lower a cathode 2 down to the transportation position in order to place a wafer on the cathode 2.

Therefore, it becomes necessary to provide a mechanism for driving the cathode 2 upward and downward and a bellows BE for securing the vacuum sealing of the chamber as in the apparatus of FIG. 18. In order to be durable for the drive of several hundreds of thousand times, the bellows BE should be several times as long as its driving distance (stroke). Meanwhile, in order to make the apparatus smaller, it is necessary to shorten the stroke. One of the factors to determine the stroke is a height of the dipole ring magnet (13a, 13b). When it is desired to make the apparatus smaller, the dipole ring magnet having a small height must be used.

On the other hand, as the height of the dipole ring magnet becomes smaller, the magnetic field strength at the central portion of the chamber (magnet) decreases while the mirror ratio increases. This will result in the nonuniform plasma density.

In order to generate a uniform magnetic field, it is effective to positively utilize the slit formed in a magnet. Specifically, when a slit is provided in the magnet, the magnetic field generated in the apparatus is lowered around the inner wall of the chamber (peripheries of a wafer) near the slit relative to the central portion of the chamber. By providing a slit SL having an appropriate width as shown in FIG. 62, a uniform magnetic field can be generated at a desired height as seen in FIG. 54(a).

Figure 63:
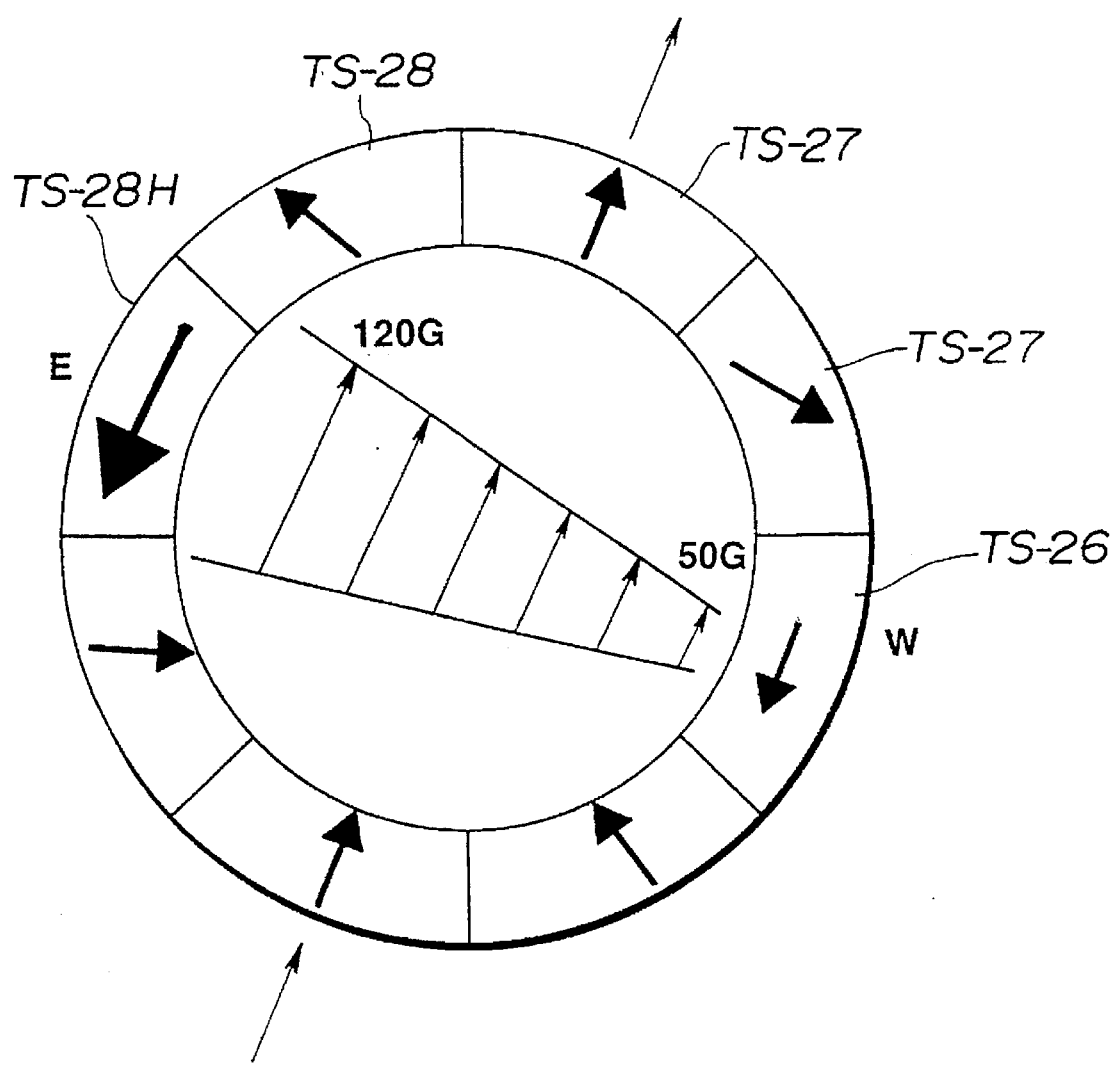
FIG. 63(a) shows a dipole ring structure for forming a gradient of magnetic field strength from the E pole toward the W pole.
FIG. 63(b) shows the distribution of the magnetic field strength formed by the dipole ring of FIG. 63(a)
Figure 63:
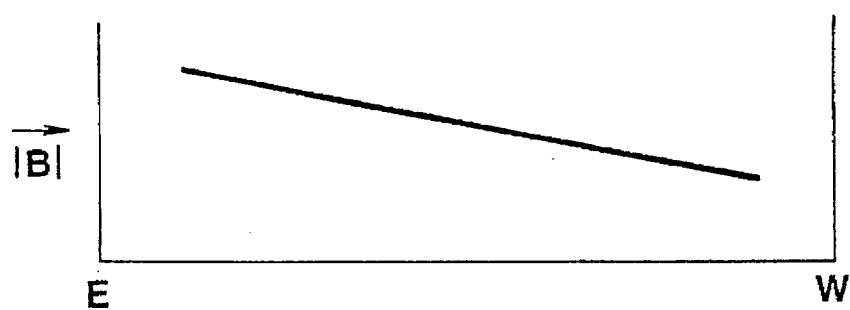

As other embodiments, methods of forming a gradient of the magnetic field strength in the direction toward the W pole from the E pole as shown in FIG. 63(b) will now be described.

The following methods can be thought of to form a gradient of magnetic field strength as shown in FIG. 63(b).

From the E pole through the W pole,

1. Change the strength (material) of the magnet
2. Change the length (height), thickness or the material of peripheral members such as a pole piece
3. Change the width of the slit
4. Change the distance from the center of the magnet
5. Deviate the magnetization direction of the magnet Each of the above methods will now be described.

In FIG. 63(a), arrows represent the directions and strength of the magnetic fields for respective magnet elements. The gradient of magnetic field strength can be formed either by changing the material of each magnet element or by changing the magnetization strength of the magnet at the time of magnetization. Incidentally, Toshiba Corporation of Japan manufactures a series of Sm-Co alloy magnets called Tosrex including TS-26, TS-27, TS-28 and TS-28H. When Tosrex magnets are used, the gradient of magnetic field can be formed by disposing TS-28H or TS-28 around the E pole, TS-27 around the N and S poles and TS-26 around the W pole.

Figure 64:
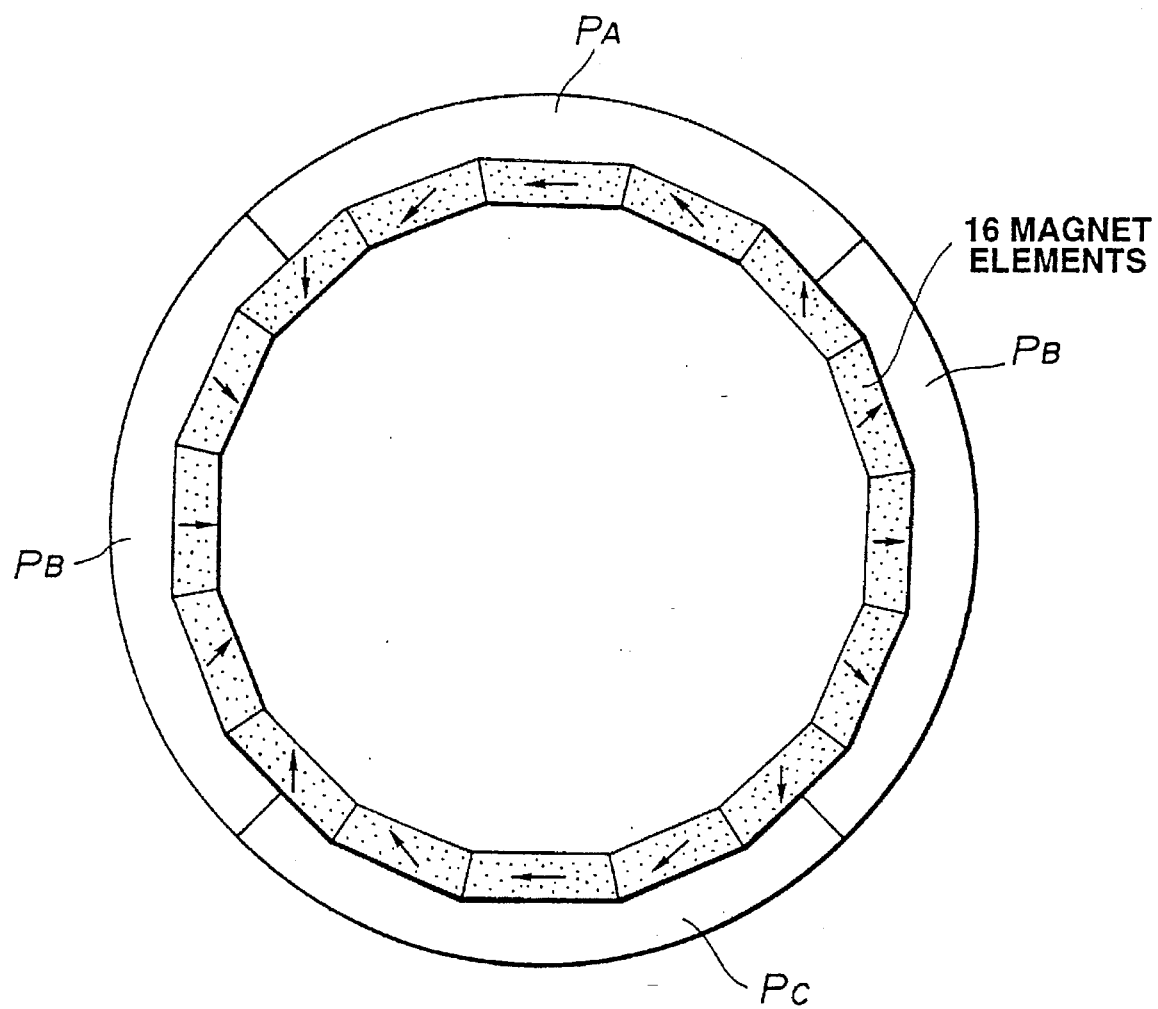
FIG. 64 shows another embodiment of a dipole ring structure for forming a gradient of magnetic field strength.

Further, referring to FIG. 64, the distribution of the magnetic field strength within a dipole ring can be controlled to some extent by selecting the material of peripheral members such as a pole piece. For example, as a material of the pole piece HP, a magnetic material having a large permeability (material $P_A$) is used around the E direction, a magnetic material having a small permeability (material $P_C$) is used around the E direction and a magnetic material having an intermediate permeability (material $P_B$) is used around other directions. When combined with the method of magnetization strength change, this method of changing the material of peripheral members will be more effective.

However, it is not possible to preform a fine adjustment of the magnetic field strength by only changing the materials.

Figure 65B:
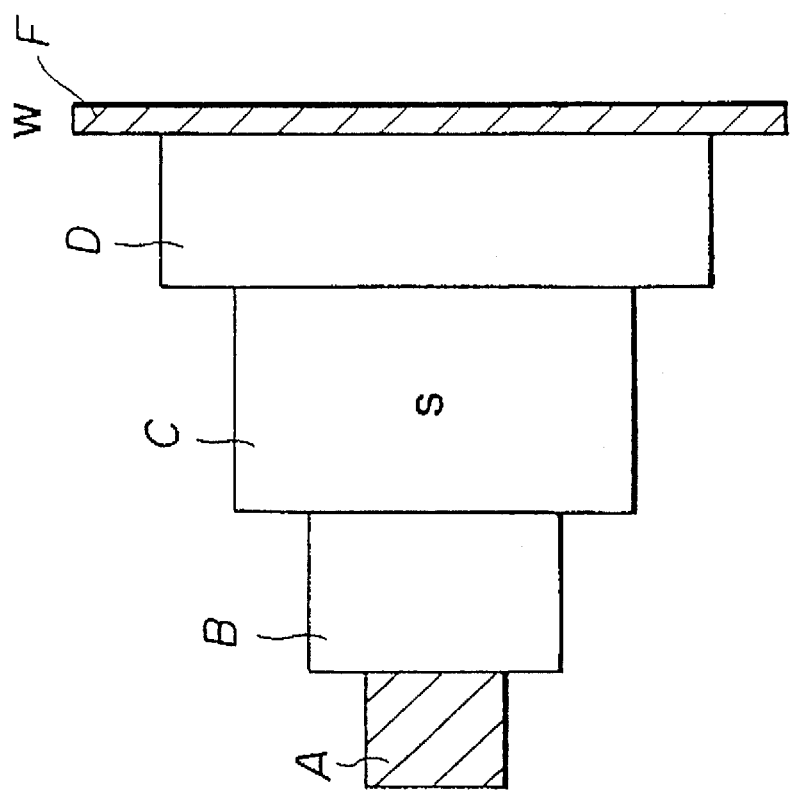
FIGS. 65(a) and 65(b) show still another embodiment of a dipole ring structure for forming a gradient of magnetic field strength.
Figure 65A:
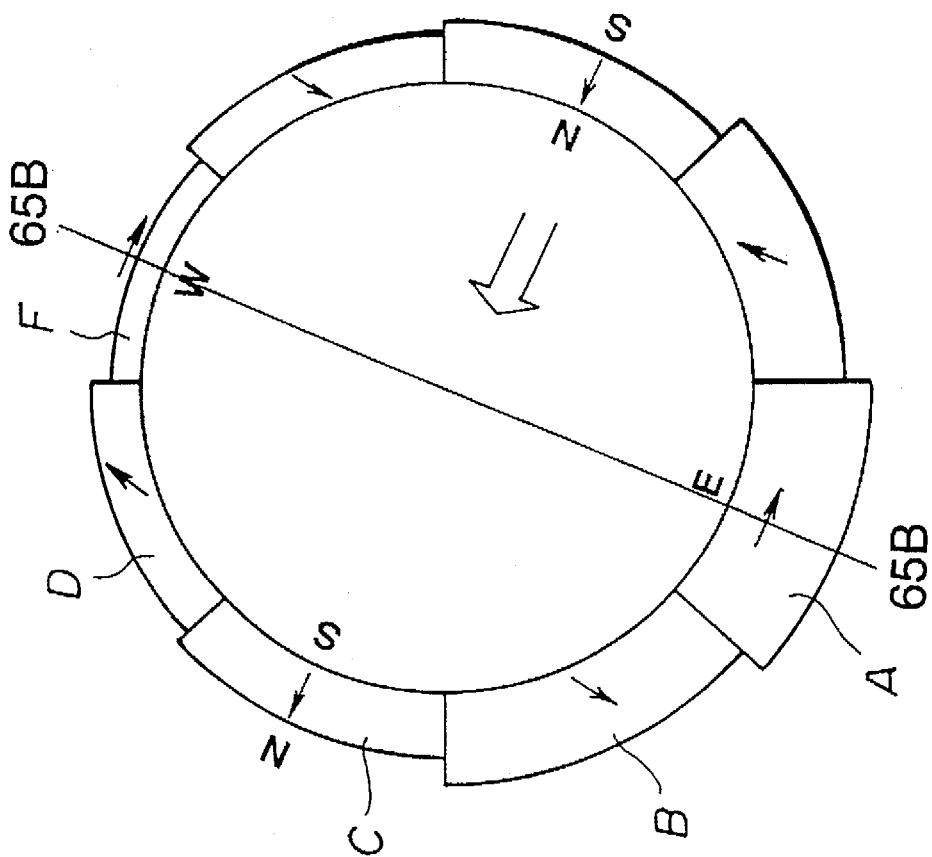

Thus, an example of changing the height and the thickness of magnets is shown in FIGS. 65(a) and 65(b).

Referring to FIG. 65(a), around the E pole where a strong magnetic field is required, it is desirable to increase the electron density. This can be realized by forming a magnetic field distribution such that the magnetic field strength near the chamber inner wall (positions of north-west NE and south-east SE directions) is larger than that at the central EW axis so that a so-called mirror ratio is increased so as to concentrate electrons at a central portion. Therefore, a thick magnet element having a large permeability is used (element A).

On the other hand, around the W pole, it is desirable to obtain a magnetic field having a small and relatively uniform strength up to near the chamber inner wall, that is, positions of north-west (NW) and south-west (SW) directions. Therefore, a magnetic element at the W pole (element F) is thinner and higher than the magnetic element at the E pole. Magnet elements between the E and W poles have successively changed their height and thickness.

Now, an example of forming a gradient of magnetic field strength by changing the width of a slit will be described.

Figure 66A:
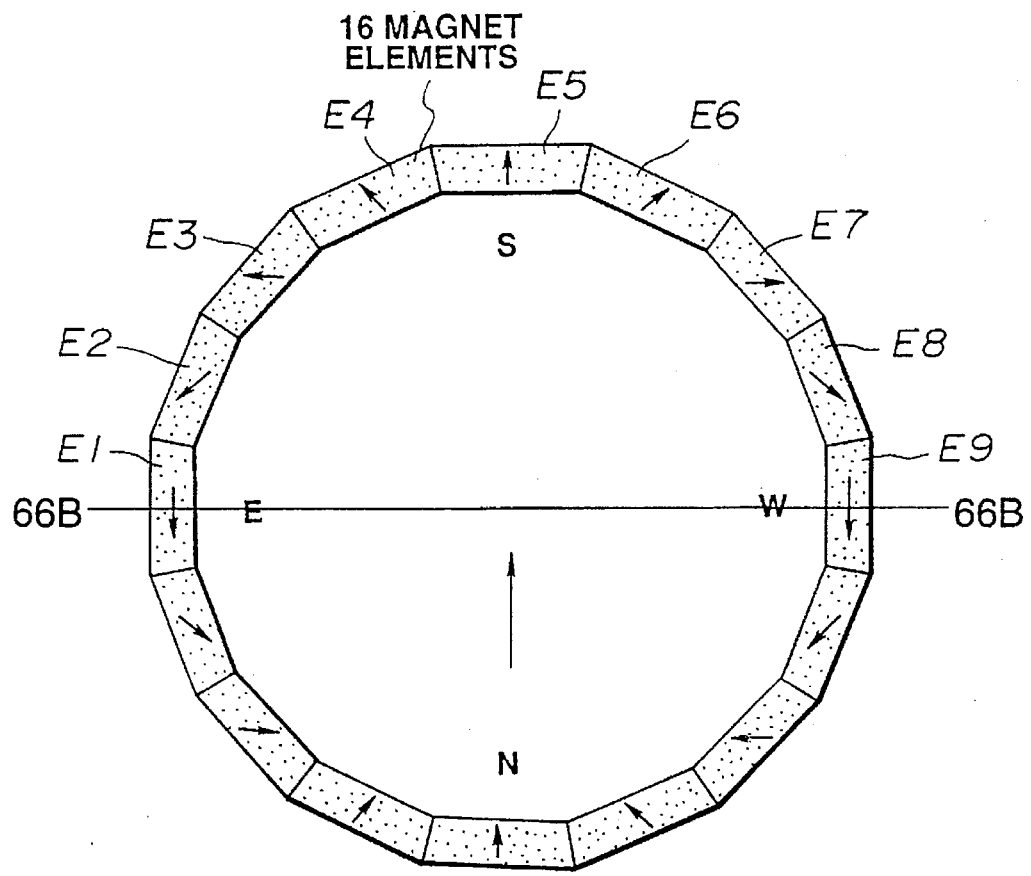
FIGS. 66(a) and 66(b) show still another embodiment of a dipole ring structure for forming a gradient of magnetic field strength.
Figure 66B:
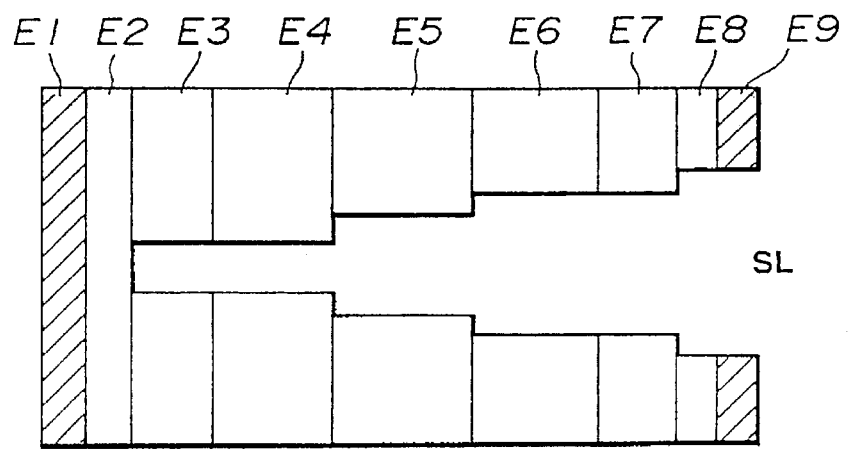

FIGS. 66(a) and 66(b) illustrate a dipole ring magnet so constructed that a plurality of magnet elements E1 . . . each formed with a slit SL are arranged in a ring. As described above, when the width of the slit is increased, the magnetic field strength around the dipole ring magnet, that is, around the peripheral portion of the wafer and around the chamber inner wall, is decreased while the magnetic field strength around the center of the dipole ring magnet is not changed greatly. Further, as described above, in order to transport a wafer through the slit, the width of the slit must be about 3 cm, which causes a large drop of the magnetic field strength around the dipole ring magnet. On the other hand, in the apparatus of FIG. 62 in which a wafer in transported in a lower portion of the plasma generating chamber, the width of the slit can be utilized to control the magnetic field.

Figure 67:
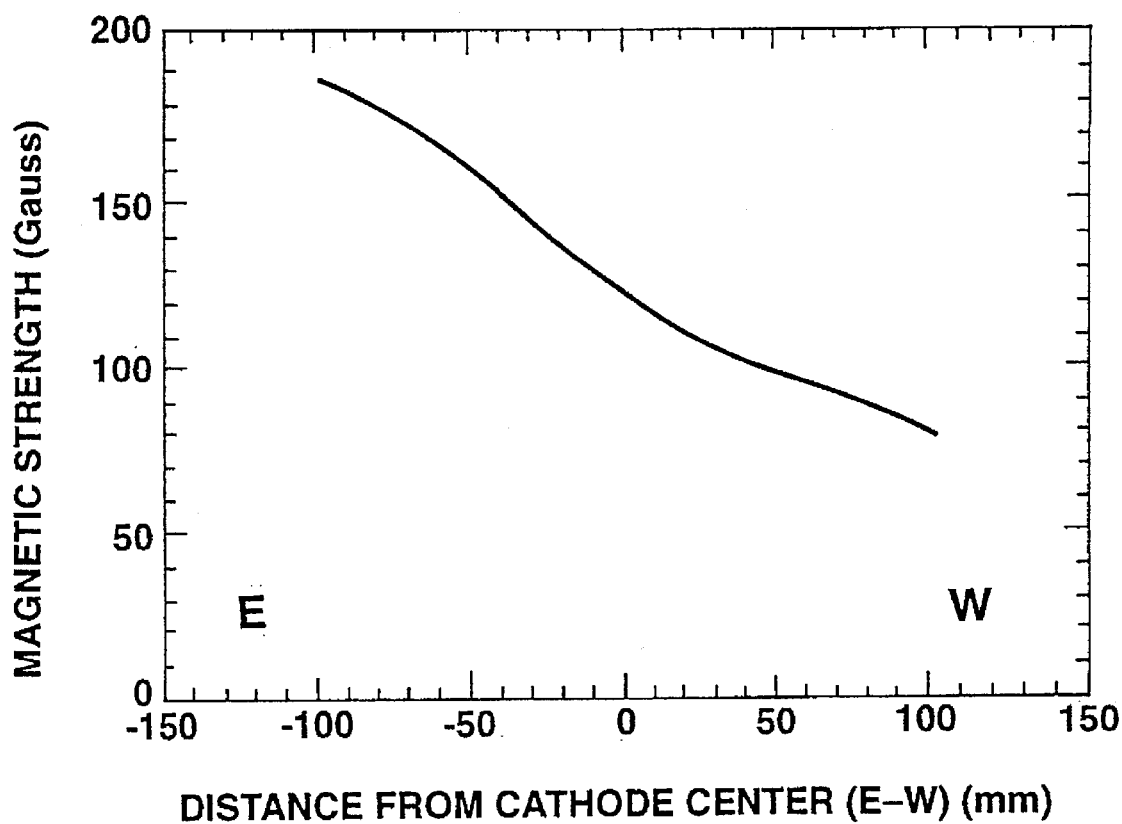
FIG. 67 shows the distribution of the magnetic field strength formed by the dipole ring of FIGS. 66(a) and 66(b)

FIGS. 66(a) and 66(b) illustrated a dipole ring magnet consisting of sixteen magnet elements. Referring to FIG. 66(b), the magnet elements have the same height of 15 cm. The magnet elements around the E pole (elements E3 and E4) are not provided with slots. For other magnet elements, the width of the slot successively increases toward the W pole such that elements E3 and E4 have a slit width of 2 cm, elements E4 and E5 have a slit width of 4 cm, elements E6 and E7 have a slit width of 6 cm and elements E8 and E9 have a slit width of 8 cm. With these slits, the gradient of the magnetic field strength is formed as shown in FIG. 67.

Another method to change a distribution of the magnetic field is that the position of an magnet element disposed at a portion where the magnetic field strength is to be weakened (around the W pole in the above example) is moved outward in the radial direction from the center of the ring. This method is advantageous in that since the magnet element moves in the direction separating from the chamber, the distribution of the magnetic field within the chamber gradually changes. However, in this method, a part of the diameter of the dipole ring becomes larger, which causes the apparatus to become larger. Therefore, this method is not suited for an apparatus having a plurality of chambers.

Figure 68A:
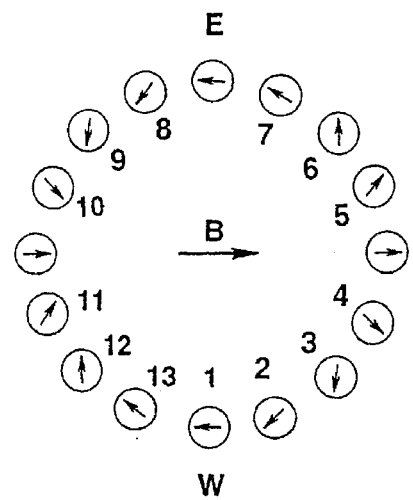
FIGS. 68(a) through 68(c) shows another embodiment of a dipole ring structure.
Figure 68B:
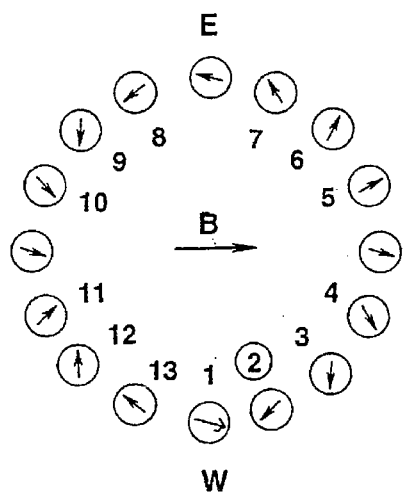
Figure 68C:
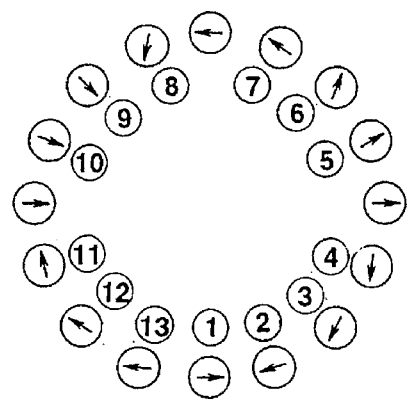

A still another method is suitable for an apparatus in which magnetic elements are arranged as in FIGS. 12(a) through 12(e) and the posture or the magnetization direction of each of the magnet elements can easily be changed. Referring to FIGS. 68(a) through 68(c), the magnetization direction of a magnet element 1 in FIG. 68(a) is changed from an original direction in the dipole ring magnet to the magnetization direction of the element 1 shown in FIG. 68(b). The direction of the magnetic field generated by three magnet elements consisting of the element 1 and its adjacent two magnet elements in FIG. 68(b) is the same as that generated by corresponding three magnet elements in FIG. 68(a). However, the strength of the magnetic field is lowered in the arrangement of FIG. 68(b). With respect to elements 3 through element 13, the distribution of the magnetic field can be changed by slightly changing the magnetization directions of each element as shown in FIG. 68(c).

Further, by constructing each of the sixteen magnet elements such as to consist of two magnet sub-elements and by slightly changing the magnetization directions of these sub-elements from their original directions, effective magnetic field strength of each of the magnet elements can be changed. Each of the magnet elements so constructed as above is fixedly arranged in an apparatus with a predetermined direction and does not require such a rotation drive mechanism as shown in FIG. 11.

With these methods, a magnetic field having strength of a desired gradient can be formed, and therefore, a magnetic field having a distribution suitable for a specific process or apparatus can be formed.

In the first embodiment, the magnetic field generating means comprises a plurality of magnet elements arranged in a circle around the container so as to form a ring, each of the magnet elements having an axis directed to a center of the circle and a magnetization direction, wherein one of the magnet elements is so disposed that the magnetization direction thereof coincides with the axis thereof, and each of the magnet elements other than the one magnet element is so disposed that an angle of the magnetization direction thereof relative to the magnetization direction of the one magnet element is substantially twice an angle of the axis thereof relative to the axis of the one magnet element. However, it is not necessary that all of the magnet elements are arranged in the above-described manner. Alternatively, the construction of the magnetic field generating means in the first embodiment may be achieved by synthetic magnetic fields generated by magnet element groups each comprising one or a plurality of magnet elements.

Specifically, the plasma generating apparatus or the surface processing apparatus may be so constructed in which the magnetic field generating means comprises a plurality of magnet element groups arranged in a circle around the container so as to form a ring, each of the magnet element groups having an axis directed to a center of the circle and a synthetic magnetization direction and comprising one or a plurality of magnet elements having respective magnetization directions which are synthesized to be equal to the synthetic magnetization direction of said each of the magnetic element groups, wherein one of the magnet element groups is so disposed that the synthetic magnetization direction thereof coincides with the axis thereof, and each of the magnet element groups other than the one magnet element group is so disposed that an angle of the synthetic magnetization direction thereof relative to the synthetic magnetization direction of the one magnet element group is substantially twice an angle of the axis thereof relative to the axis of the one magnet element group.

Each of the magnet element groups may be constituted by a pair of magnet elements each having a magnetization direction different from each other.

Alternatively, each of the magnet element groups may be constituted by a pair of magnet elements each having the same magnetization direction and generating the same magnetic field.

Further, each of the magnet element groups may be constituted by two magnet elements or more and the synthetic magnetization direction thereof is deviated from positions where the magnet elements are located.

The present invention should not be limited by the above described examples, but may be modified. For example, the magnetization direction of each magnet element is not strictly determined, but may be changed within the scope of the subject matter of the present invention.

What is claimed is:

1. A plasma generating apparatus comprising:

a vacuum container provided with a first electrode and a second electrode disposed opposite to the first electrode;

gas feeding means for feeding a predetermined gas into the vacuum container;

evacuating means for maintaining the inside of the container at a reduced pressure;

electric field generating means for supplying an electric power across the first and second electrodes to generate an electric field in a region between the first and second electrodes; and magnetic field generating means for generating a magnetic field in the vacuum container, wherein the magnetic field generating means comprises a plurality of magnet element groups arranged in a circle around the container so as to form a ring, each of the magnet element groups having an axis directed to a center of the circle and a synthetic magnetization direction, and comprising one or a plurality of magnet elements having respective magnetization directions which are synthesized to be equal to the synthetic magnetization direction of said each of the magnet element groups, wherein one of the magnet element groups is so disposed that the synthetic magnetization direction thereof coincides with the axis thereof, and each of the magnet element groups other than the one magnet element group is so disposed that an angle of the synthetic magnetization direction thereof relative to the synthetic magnetization direction of the one magnet element group is substantially twice an angle of the axis thereof relative to the axis of the one magnet element group.

2. A surface processing apparatus comprising:

a vacuum container provided with a first electrode and a second electrode disposed opposite to the first electrode for supporting thereon a substrate to be processed;

gas feeding means for feeding a predetermined gas into the vacuum container;

evacuating means for maintaining the inside of the container at a reduced pressure;

electric field generating means for supplying an electric power across the first and second electrodes to generate an electric field in a region between the first and second electrodes; and magnetic field generating means for generating a magnetic field in the vacuum container, wherein the magnetic field generating means comprises a plurality of magnet element groups arranged in a circle around the container so as to form a ring, each of the magnet element groups having an axis directed to a center of the circle and a synthetic magnetization direction, and comprising one or a plurality of magnet elements having respective magnetization directions which are synthesized to be equal to the synthetic magnetization direction of said each of the magnetic element groups, the magnet elements generating a synthesized magnetic field, wherein one of the magnet element groups is so disposed that the synthetic magnetization direction thereof coincides with the axis thereof, and each of the magnet element groups other than the one magnet element group is so disposed that an angle of the synthetic magnetization direction thereof relative to the synthetic magnetization direction of the one magnet element group is substantially twice an angle of the axis thereof relative to the axis of the one magnet element group.

3. A surface processing apparatus according to claim 2, wherein each of the magnet element groups comprises a pair of magnet elements each having a magnetization direction different from each other.

4. A surface processing apparatus according to claim 2, wherein each of the magnet element groups comprises a pair of magnet elements each having the same magnetization direction and generating the same magnetic field.

5. A surface processing apparatus according to claim 2, wherein each of the magnet element groups comprises two magnet elements or more and the synthetic magnetization direction thereof is deviated from positions where the magnet elements are located.

6. A surface processing apparatus according to claim 2, wherein the magnet element groups are so constructed that strength of a magnetic field generated by the magnetic field generating means around peripheral portions of the vacuum container in a north-south direction is equal to or larger than at a central portion thereof.

7. A surface processing apparatus according to claim 2, wherein materials of the magnet elements for each of the magnet element groups are determined according to a position of each of the magnet element groups such that strength of a magnetic field generated by the magnetic field generating means around peripheral portions of the vacuum container in a north-south direction is equal to or larger than at a central portion thereof.

8. A surface processing apparatus according to claim 2, wherein each of the magnet element groups is constituted by magnet elements which are formed with respective slits in a direction perpendicular to an axis of the ring, widths of the slits being determined according to a position of each of the magnet element groups such that strength of a magnetic field generated by the magnetic field generating means around peripheral portions of the vacuum container in a north-south direction is equal to or larger than at a central portion thereof.

9. A surface processing apparatus according to claim 2, wherein each of the magnet element groups includes magnet elements whose lengths in a direction along an axis of the ring are adjusted such that strength of a magnetic field generated by the magnetic field generating means around peripheral portions of the vacuum container in a north-south direction is equal to or larger than at a central portion thereof.

10. A surface processing apparatus according to claim 2, wherein thicknesses of the magnet elements for each of the magnet element groups are determined according to a position of each of the magnet element groups such that strength of a magnetic field generated by the magnetic field generating means around peripheral portions of the vacuum container in a north-south direction is equal to or larger than at a central portion thereof.

11. A surface processing apparatus according to claim 2, wherein the magnetization directions of the magnet elements for each of the magnet element groups are determined according to a position of each of the magnet element groups such that strength of a magnetic field generated by the magnetic field generating means around peripheral portions of the vacuum container in a north-south direction is equal to or larger than at a central portion thereof.

12. A surface processing apparatus according to claim 2, wherein distances of the magnet elements from an axis of the ring for each of the magnet element groups are determined according to a position of each of the magnet element groups such that strength of a magnetic field generated by the magnetic field generating means around peripheral portions of the vacuum container in a north-south direction is equal to or larger than at a central portion thereof.

13. A surface processing apparatus according to claim 2, wherein materials of peripheral members for supporting the magnet elements for each of the magnet element groups are selected according to a position of each of the magnet element groups such that strength of a magnetic field generated by the magnetic field generating means around peripheral portions of the vacuum container in a north-south direction is equal to or larger than at a central portion thereof.

14. A surface processing apparatus according to claim 2, wherein the magnetic field generating means is divided into two parts in a direction perpendicular to an axis of the ring with a slit of a predetermined width therebetween.

15. A surface processing apparatus according to claim 14, wherein the slit is constructed according to a position of the magnetic field generating means and a position of the substrate to be processed such that strength of a magnetic field generated by the magnetic field generating means around peripheral portions of the vacuum container in a north-south direction is equal to or larger than at a central portion thereof.

16. A surface processing apparatus according to claim 14, further comprising:

a transportation port provided in a wall of the vacuum container at the position above or below the magnetic field generating means, for transporting the substrate to be processed into or out of the vacuum container; and transporting means for transporting the substrate in upward and downward directions within the vacuum container.

17. A surface processing apparatus according to claim 2, wherein the magnetic field generating means is so constructed as to generate a magnetic field having a gradient in an east-west direction in the strength thereof.

18. A surface processing apparatus comprising:

a vacuum container provided with a first electrode and a second electrode disposed opposite to the first electrode for supporting thereon a substrate to be processed;

gas feeding means for feeding a predetermined gas into the vacuum container;

evacuating means for maintaining the inside of the container at a reduced pressure;

electric field generating means for supplying an electric power across the first and second electrodes so as to generate an electric field in a region between the first and second electrodes; and magnetic field generating means for generating a magnetic field in the vacuum container, wherein the magnetic field generating means comprises a plurality of magnet elements arranged in a circle around the container so as to form a ring, each of the magnet elements having an axis directed to a center of the circle and a magnetization direction, wherein one of the magnet elements is so disposed that the magnetization direction thereof coincides with the axis thereof, and each of the magnet elements other than the one magnet element is so disposed that an angle of the magnetization direction thereof relative to the magnetization direction of the one magnet element is substantially twice an angle of the axis thereof relative to the axis of the one magnet element, and wherein the magnetic field generating means is divided into two parts in a direction perpendicular to an axis of the ring with a slit of a predetermined width therebetween.

19. A surface processing apparatus according to claim 18, wherein the slit is constructed according to a position of the magnetic field generating means and a position of the substrate to be precessed such that a uniform magnetic field is formed at the substrate.

20. A surface processing apparatus according to claim 18, further comprising:

a transportation port provided in a wall of the vacuum container at the position above or below the magnetic field generating means, for transporting the substrate to be processed into or out of the vacuum container; and transporting means for transporting the substrate in upward and downward directions within the vacuum container.

21. A surface processing apparatus according to claim 19, further comprising:

a transportation port provided in a wall of the vacuum container at the position above or below the magnetic field generating means, for transporting the substrate to be processed into or out of the vacuum container; and transporting means for transporting the substrate in upward and downward directions within the vacuum container.

22. A surface processing apparatus according to claim 18, wherein the slit is constructed according to a position of the magnetic field generating means and a position of the substrate to be precessed such that strength of a magnetic field generated by the magnetic field generating means around peripheral portions of the vacuum container in a north-south direction is equal to or larger than at a central portion thereof.

23. A surface processing apparatus according to claim 18, wherein the slit is constructed according to a position of the magnetic field generating means and a position of the substrate to be processed such as to generate a magnetic field having a gradient in an east-west direction in the strength thereof.

* * * * *